(12) United States Patent
Naito

(10) Patent No.: US 10,840,363 B2
(45) Date of Patent: Nov. 17, 2020

(54) SEMICONDUCTOR DEVICE

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/202,094

(22) Filed: Nov. 28, 2018

(65) Prior Publication Data

US 2019/0148532 A1 May 16, 2019

Related U.S. Application Data

(63) Continuation of application No. PCT/JP2017/044194, filed on Dec. 8, 2017.

(30) Foreign Application Priority Data

Dec. 8, 2016 (JP) .................................. 2016-238467
Jul. 13, 2017 (JP) .................................. 2017-137451

(51) Int. Cl.
| | | |
|---|---|---|
| *H01L 29/73* | (2006.01) | |
| *H01L 29/86* | (2006.01) | |
| *H01L 29/739* | (2006.01) | |
| *H01L 29/861* | (2006.01) | |
| *H01L 29/10* | (2006.01) | |

(Continued)

(52) U.S. Cl.
CPC ........ *H01L 29/7397* (2013.01); *H01L 21/322* (2013.01); *H01L 27/0716* (2013.01);
(Continued)

(58) Field of Classification Search
CPC ............... H01L 29/7397; H01L 21/322; H01L 27/0716; H01L 27/0727
(Continued)

(56) References Cited

U.S. PATENT DOCUMENTS

2007/0114598 A1* 5/2007 Hotta .................. H01L 29/0634
257/330
2007/0267663 A1* 11/2007 Harada ............... H01L 29/0834
257/288

(Continued)

FOREIGN PATENT DOCUMENTS

| JP | 2008205015 A | 9/2000 |
|---|---|---|
| JP | 2005210047 A | 8/2005 |

(Continued)

OTHER PUBLICATIONS

International Search Report for International Patent Application No. PCT/JP2017/044194, issued by the Japan Patent Office dated Feb. 6, 2018.

*Primary Examiner* — Sheikh Maruf

(57) ABSTRACT

A semiconductor device having a semiconductor substrate is provided, the semiconductor substrate including: two trench sections extending in a predetermined direction; a mesa section provided between the two trench sections; and a drift layer, the mesa section including: an emitter region; a contact region; and multiple accumulation layers provided side by side in a depth direction below the emitter region and the contact region, and at least one accumulation layer among the multiple accumulation layers provided below at least a part of the emitter region, but not provided below a partial region of the contact region.

11 Claims, 31 Drawing Sheets

(51) Int. Cl.
*H01L 27/07* (2006.01)
*H01L 29/417* (2006.01)
*H01L 29/423* (2006.01)
*H01L 29/08* (2006.01)
*H01L 29/12* (2006.01)
*H01L 29/06* (2006.01)
*H01L 29/36* (2006.01)
*H01L 21/322* (2006.01)
*H01L 29/78* (2006.01)

(52) U.S. Cl.
CPC .......... *H01L 27/0727* (2013.01); *H01L 29/06* (2013.01); *H01L 29/0804* (2013.01); *H01L 29/1095* (2013.01); *H01L 29/12* (2013.01); *H01L 29/36* (2013.01); *H01L 29/41708* (2013.01); *H01L 29/4236* (2013.01); *H01L 29/739* (2013.01); *H01L 29/78* (2013.01); *H01L 29/8613* (2013.01)

(58) Field of Classification Search
USPC .......................................... 257/330
See application file for complete search history.

(56) References Cited

U.S. PATENT DOCUMENTS

| | | |
|---|---|---|
| 2008/0197379 A1 | 8/2008 | Aono |
| 2013/0248882 A1* | 9/2013 | Ogura ................ H01L 29/7395 257/77 |
| 2015/0021658 A1* | 1/2015 | Lee .................... H01L 29/7397 257/140 |
| 2015/0069460 A1* | 3/2015 | Hara ................... H01L 29/7395 257/139 |
| 2015/0069461 A1* | 3/2015 | Misu .................. H01L 29/7397 257/139 |
| 2016/0315140 A1* | 10/2016 | Iwasaki .............. H01L 21/3223 |
| 2016/0336394 A1* | 11/2016 | Hu ..................... H01L 29/0623 |
| 2017/0025410 A1 | 1/2017 | Cheng |
| 2017/0271447 A1* | 9/2017 | Tamura ............... H01L 29/7397 |
| 2018/0019331 A1* | 1/2018 | Sumitomo .......... H01L 23/485 |
| 2019/0252503 A1* | 8/2019 | Uehigashi ............ H01L 29/36 |
| 2019/0288094 A1* | 9/2019 | Baburske ........... H01L 29/7397 |

FOREIGN PATENT DOCUMENTS

| | | |
|---|---|---|
| JP | 2007266134 A | 10/2007 |
| JP | 2007311627 A | 11/2007 |
| JP | 2008078397 A | 4/2008 |
| JP | 2008205500 A | 9/2008 |
| JP | 2013201360 A | 10/2013 |
| JP | 2014007254 A | 1/2014 |
| JP | 2015053400 A | 3/2015 |
| JP | 2015056482 A | 3/2015 |
| JP | 2015135954 A | 7/2015 |

* cited by examiner

SEMICONDUCTOR DEVICE

The contents of the following Japanese patent application(s) are incorporated herein by reference:
NO. 2016-238467 filed in JP on Dec. 8, 2016,
NO. 2017-137451 filed in JP on Jul. 13, 2017, and
NO. PCT/JP2017/044194 filed on Dec. 8, 2017.

BACKGROUND

1. Technical Field

The present invention relates to a semiconductor device.

2. Related Art

Conventionally, an insulated gate type bipolar transistor (IGBT) with a carrier storage layer has been known (see Patent document 1, for example).

PRIOR ART DOCUMENT

[Patent Document]
Patent document 1: Japanese Patent Application Publication No. 2007-311627

The carrier storage layer is also referred to as a storage layer. In the case where only one storage layer exists, as compared to the case where multiple storage layers exist, there is a problem that an on-voltage (Von) that is a voltage between a collector and an emitter in an on-state of an IGBT becomes higher. On the other hand, in the case where multiple storage layers exist, carriers are stored excessively in the storage layers as compared to the case where only one storage layer exists, so that there is a problem that a turn-off loss (Eoff) is increased.

SUMMARY

A first aspect of the present invention provides a semiconductor device. The semiconductor device may have a semiconductor substrate. The semiconductor substrate may include two trench sections, a mesa section and a drift layer. The two trench sections may be extended in a predetermined direction. The mesa section may be provided between the two trench sections. The drift layer may be provided below the mesa section. The drift layer may be of a first conductivity type. The mesa section may have an emitter region, a contact region and multiple accumulation layers. The emitter region may have a higher doping concentration than that of the drift layer. Also, at least a part of the emitter region may be located on the upper surface of the semiconductor substrate. Further, the emitter region may be of the first conductivity type. At least a part of the contact region may be located on the upper surface of the semiconductor substrate. Also, the contact region may be of a second conductivity type. The multiple accumulation layers may be provided side by side below the emitter region and the contact region in a depth direction of the semiconductor substrate. The depth direction may be a direction from the upper surface of the semiconductor substrate toward the lower surface thereof. Each of the multiple accumulation layers may have a doping concentration of the first conductivity type higher than the doping concentration of the first conductivity type of the drift layer. At least one accumulation layer of the multiple accumulation layers is provided below at least a part of the emitter region, but may not be provided below at least a partial region of the contact region.

The emitter region and the contact region may be alternately provided in a predetermined direction.

At least one accumulation layers may not be provided below a partial region of each in a plurality of contact regions.

At least one of the accumulation layers may be an island-shaped accumulation layer. The island-shaped accumulation layer may include a plurality of accumulation regions. The plurality of accumulation regions may have a doping concentration of the first conductivity type higher than a doping concentration of the first conductivity type of the drift layer. The plurality of accumulation regions may be respectively provided discretely in a plane orthogonal to the depth direction. Each of the plurality of accumulation regions is provided below at least a part of the emitter region, but may not be provided below a partial region of the contact region to be separated. All of the accumulation layers except the accumulation layer closest to the upper surface in the depth direction may be the island-shaped accumulation layers.

The mesa section may further have a base region. The base region may have a doping concentration of a second conductivity type lower than that of the contact region. The emitter region may have a bottom region. Inside the semiconductor substrate, the bottom region may not be in direct contact with the contact region, and may be in direct contact with the base region. A length of each of the plurality of accumulation regions in a predetermined direction may be longer than a length of the bottom region in the predetermined direction. Instead of this, the length of each of the plurality of accumulation regions in the predetermined direction may be shorter than the length of the bottom region in the predetermined direction.

When the length of each of the plurality of accumulation regions in the predetermined direction layers is defined as $L_{CHS}$, and the length of the bottom region of the emitter region in the predetermined direction is defined as $L_0$, $L_{CHS}$ and $L_0$ may satisfy the following expression: $0.5 \le L_{CHS}/L_0 \le 2$.

A second aspect of the present invention provides a semiconductor device. The semiconductor device may have a semiconductor substrate. The semiconductor substrate may include a transistor region. In the transistor region, the semiconductor substrate may include a plurality of trench sections, a mesa section and a drift layer. The plurality of trench sections may extend in the predetermined direction. Each mesa section may be provided between two adjacent trench sections in the plurality of trench sections. The drift layer may be provided below the mesa section. The drift layer may be of the first conductivity type. The plurality of trench sections may respectively include a gate trench section and a dummy trench section. The gate trench section may have a gate conductive section. A gate potential may be supplied to the gate conductive section. The dummy trench section may have a dummy trench conductive section. An emitter potential may be supplied to the dummy trench conductive section. The mesa section may have an emitter region, a contact region and an accumulation layer. The emitter region may have a higher doping concentration than that of the drift layer. At least a part of the emitter region may be located on the upper surface of the semiconductor substrate. The emitter region may be of the first conductivity type. At least a part of the contact region may be region may be located on the upper surface of the semiconductor substrate. The contact region may be of the second conductivity type. The accumulation layer may be provided below the emitter region and the contact region. The accumulation layer may have a doping concentration of the first conductivity type higher than the doping concentration of the first conductivity type of the drift layer. The number of the accumulation layers provided in the depth direction of the mesa section in direct contact with the gate trench section may be greater than the number of the accumulation layers provided in the depth direction of the mesa section between the two dummy trench sections. The depth direction may be a direction from the upper surface of the semiconductor substrate toward the lower surface thereof.

The accumulation layer may not be provided in the mesa section between the two dummy trench sections. Instead of this, the one accumulation layer may be provided in the mesa section between the two dummy trench sections.

The mesa section may further have a high concentration contact region. The high concentration contact region may include an upper portion and a lower portion. The upper portion of the high concentration contact region may be located on the upper surface of the semiconductor substrate. The lower portion of the high concentration contact region may be in contact with the contact region. The high concentration contact region may have a doping concentration of the second conductivity type higher than that of the contact region.

The semiconductor device may include a transistor section, a diode section and a boundary section. The boundary section may be provided in a partial region in direct contact with the diode section in the transistor section. The diode section may include one or more accumulation layers in the depth direction. The depth direction may be a direction from the upper surface of the semiconductor substrate toward the lower surface thereof.

The diode section may include the contact region. At least one accumulation layer of the multiple accumulation layers in the diode section may be provided below at least a part of the contact region.

A length of each of the multiple accumulation layers of the diode section in the predetermined direction may be longer than a length of the contact region of the diode section in the predetermined direction.

Note that the above summary of the invention clause does not necessarily describe all necessary features of the embodiments of the present invention. The present invention may also be a sub-combination of the features described above.

DESCRIPTION OF EXEMPLARY EMBODIMENTS

Hereinafter, embodiments of the present invention will be described. The embodiments do not limit the invention according to the claims. Also, all the combinations of the features described in the embodiments are not necessarily essential to means provided by aspects of the invention.

Figure 1:
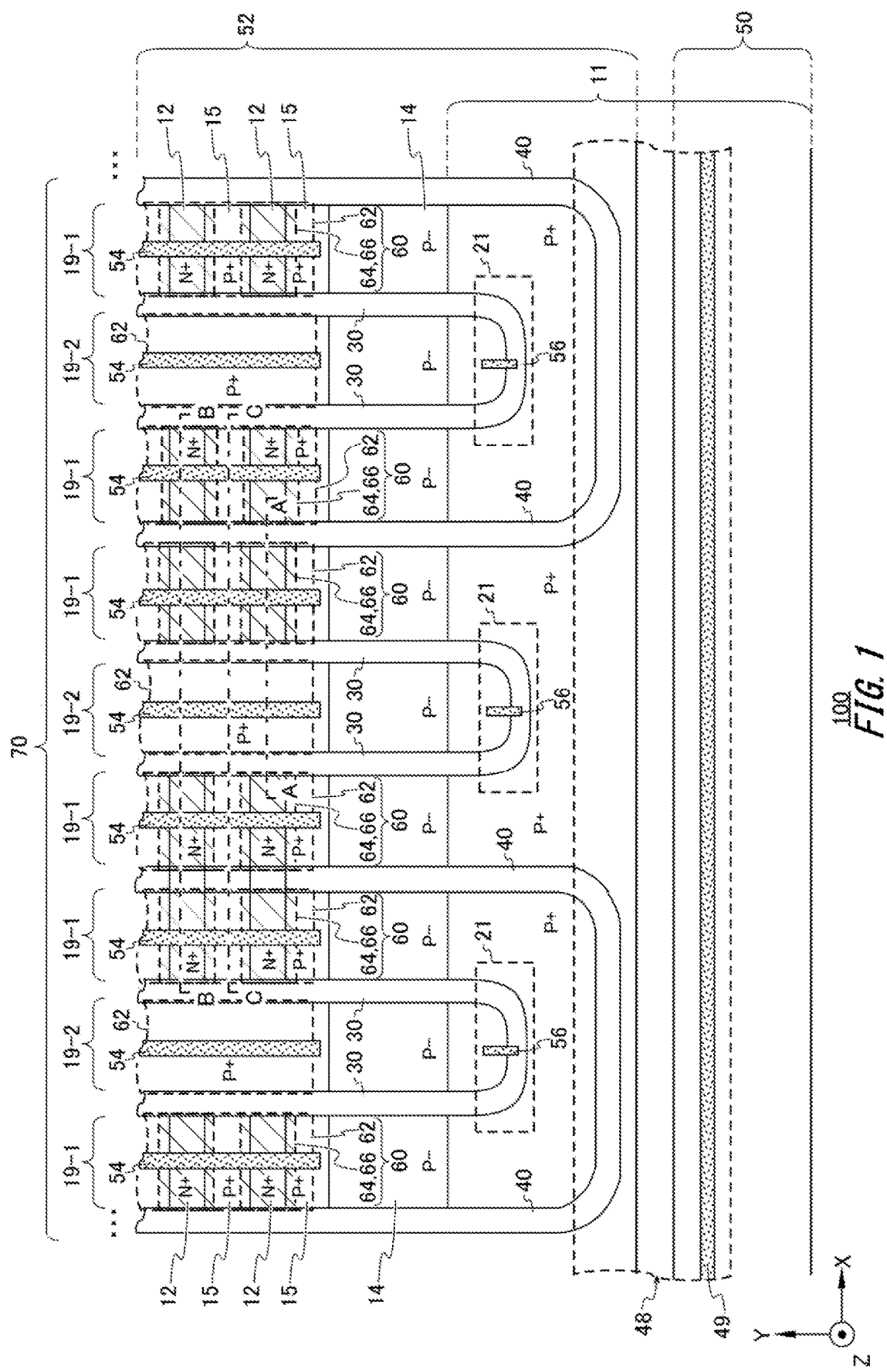
FIG. 1 is a view showing partially an upper surface of a semiconductor device 100 in a first embodiment.

FIG. 1 is a diagram illustrating a part of an upper surface of a semiconductor device 100 according to a first embodiment. The semiconductor device 100 may be a reverse conducting IGBT (Reverse Conducting IGBT). The semiconductor device 100 of the present example includes a semiconductor substrate that has a transistor section 70 including a transistor such as an IGBT, and a diode section in which current flows in a direction reverse to that of the transistor section 70, the diode section including a diode such as an FWD (Free Wheeling Diode). Note that FIG. 1 illustrates an upper surface around the end portion of the semiconductor substrate, and omits other regions. Additionally, in FIG. 1, only a part of an active region including the transistor section 70 is shown. Also, the semiconductor device 100 may be a transistor such as the IGBT not including a reverse conducting diode.

In FIG. 1, the active region is shown, and the semiconductor device 100 may have an edge termination region that surrounds the active region. The active region in the present example refers to a region having the transistor section 70 and the diode section. The edge termination region has a capability that mitigates an electric field concentration in the vicinity of the upper surface of the semiconductor substrate. The edge termination region has one or more of structures of a guard ring, a field plate, a resurf and a combination thereof, for example.

The semiconductor substrate of the present example includes a plurality of trench sections and mesa sections 19 in the transistor section 70. In the active region, the transistor section 70 may be a virtual region where in the active region, a collector layer is projected perpendicularly to the upper surface of the semiconductor substrate, and where a predetermined unit structure including an emitter region 12 and a contact region 15 is regularly arranged. The mesa section 19 is a partial region of the semiconductor substrate provided between two adjacent trench sections. The mesa section 19 is a part of the semiconductor substrate located in a region closer to the upper surface than to a bottom portion of the trench section. Note that in the present specification, the mesa section 19 in direct contact with the gate trench section 40 is defined as a mesa section 19-1, and the mesa section 19 between two dummy trench sections 30 is defined as a mesa section 19-2. In the present example, the lengths of the mesa section 19-1 and the mesa section 19-2 in the X-axis direction are the same.

Note that in the present specification, the dummy trench section 30 and the gate trench section 40 may be collectively referred to as a trench section. The trench section may be extended in a predetermined direction. In the present example, the predetermined direction in which the trench section is extended is a direction parallel to the Y-axis. That direction may be referred to as an extending direction of the trench section for convenience sake.

In addition, the trench sections may be arranged at predetermined intervals in a direction orthogonal to the extending direction. In the present example, the direction in which the trench sections are arranged is a direction parallel to the X-axis. In the present specification, that direction may be referred to as an arrangement direction of the trench section.

In the present example, the X-axis and the Y-axis are axes orthogonal to each other in a plane parallel to the upper surface of the semiconductor substrate. Also, the axis orthogonal to the X-axis and the Y-axis is defined as the Z-axis. Note that in the present specification, a direction from the upper surface to a lower surface of the semiconductor substrate is referred to as a depth direction. The depth direction is a direction parallel to the Z-axis.

Note that in the present specification, the terms "upper," "lower," "above," and "below" are not limited to a vertical direction in the gravitational direction. These terms merely refer to a relative direction with respect to a predetermined axis.

In the present example, the gate trench section 40 and the dummy trench section 30 are alternately provided along the arrangement direction. Each of the gate trench section 40 and the dummy trench section 30 has a longitudinal portion that extends along the extending direction. The gate trench section 40 of the present example has two longitudinal portions and a short portion that connects these two longitudinal portions. It is preferable that at least a part of the short portion is provided in a curved shape. By connecting end portions of the two longitudinal portions of the gate trench section 40, the electric field concentration at the end portions of the longitudinal portions can be mitigated. A gate runner 48 may be connected to a gate conductive section at the short portion of the gate trench section 40.

In the transistor section 70, the dummy trench section 30 may be provided between the longitudinal portions of the gate trench section 40. In the present example, in a plane parallel to the upper surface of the semiconductor substrate, one dummy trench section 30 is provided between two longitudinal portions in the gate trench section 40 that is provided continuously by the longitudinal portion and the short portion.

The mesa section 19 of the semiconductor substrate may have the emitter region 12, the base region 14, the contact region 15, multiple accumulation layers 60 and the well region 11, which are respectively provided from the upper surface to predetermined depths. The multiple accumulation layers 60 may have one or more accumulation layers. Two or more accumulation layers may be provided side by side in the depth direction. In the present example, the multiple accumulation layers 60 each have a first accumulation layer 62, a second accumulation layer 64 and a third accumulation layer 66. The multiple accumulation layers 60 are provided below the emitter region 12 and contact region 15. Therefore, in FIG. 1, the first accumulation layer 62 is shown by a dashed line, and the second accumulation layer 64 and third accumulation layer 66 are shown by a dashed line with hatched lines.

In the present example, the multiple accumulation layers 60 are provided in the mesa section 19-1 located between the longitudinal portion of the gate trench section 40 and the longitudinal portion of the dummy trench section 30. However, only the first accumulation layer 62 is provided in the mesa section 19-2. Some of the multiple accumulation layers 60 may be provided continuously in the extending direction of the trench section. In the present example, the first accumulation layer 62 is provided continuously from the contact region 15 closest to the well region 11 in the extending direction of the trench section.

On the other hand, at least one accumulation layer of the multiple accumulation layers 60 is provided below at least a part of the emitter region 12, but may not be provided below a partial region of the contact region 15. At least one of that accumulation layers may not be provided below a partial region of each contact region 15 provided in the extending direction of the trench section. In the present example, the second accumulation layer 64 and the third accumulation layer 66 are intermittently provided such that they are disconnected immediately below the contact region 15 in the extending direction of the trench section. Note that the second accumulation layer 64 and the third accumulation layer 66 of the present example are provided within the same range in the XY plane parallel to the upper surface of the semiconductor substrate.

In the present example, of the multiple accumulation layers 60, the first accumulation layer 62 is provided at a position closest to the upper surface of the semiconductor substrate in the depth direction. That is, the first accumulation layer 62 is provided at the shallowest position in the depth direction. On the other hand, the third accumulation layer 66 is provided at the deepest position in the depth direction. The second accumulation layer 64 is provided between the first accumulation layer 62 and third accumulation layer 66 in the depth direction.

In this manner, in the present example, the first accumulation layer 62 is provided in an area greater than the second accumulation layer 64 and the third accumulation layer 66. That is, in the present example, when the semiconductor substrate is viewed from above, the first accumulation layer 62 of the present example covers the second accumulation layer 64 and the third accumulation layer 66.

The semiconductor device 100 of the present example further includes the gate metal layer 50 and the emitter electrode 52 provided above the upper surface of the semiconductor substrate. The gate metal layer 50 and the emitter electrode 52 are provided separately from each other. An interlayer dielectric film is provided between each of the emitter electrode 52 and the gate metal layer 50 and the upper surface of the semiconductor substrate, which is omitted in FIG. 1. The interlayer dielectric film of the present example has contact holes 49, 54 and 56. The contact holes 49, 54 and 56 of the present example are provided to penetrate that interlayer dielectric film. In FIG. 1, the contact holes 49, 54 and 56 are denoted with dots.

The emitter electrode 52 may be in contact with the emitter region 12 and the contact region 15 on the upper surface of the semiconductor substrate via the contact hole 54. Also, the emitter electrode 52 may be electrically connected to the base region 14 via the contact region 15. Also, the emitter electrode 52 may be connected to the dummy trench conductive section inside the dummy trench section 30 through the contact hole 56. A connecting portion 21 formed of a conductive material such as polysilicon doped with impurities may be provided between the emitter electrode 52 and the dummy trench conductive section. Each of the connecting portions 21 may be provided on the upper surface of the semiconductor substrate via an insulating film.

The gate metal layer 50 may be in contact with the gate runner 48 via the contact hole 49. The gate runner 48 may be formed of polysilicon doped with impurities, or the like. The gate runner 48 may be connected to a gate conductive section within the gate trench section 40 on the upper surface of the semiconductor substrate. The gate runner 48 of the present example is not connected to the dummy trench conductive section of the dummy trench section 30. The gate runner 48 of the present example is provided from a portion below the contact hole 49 to a short portion of the gate trench section 40. At the short portion of the gate trench section 40, the gate conductive section of the present example is exposed to the upper surface of the semiconductor substrate and is in contact with the gate runner 48.

The emitter electrode 52 and the gate metal layer 50 are formed of a material containing a metal. For example, at least a partial region of each electrode is formed of aluminum, an aluminum-silicon alloy, or the like. Each electrode may have a barrier metal that is formed of titanium, titanium compound or the like in the lower layer of the region formed of aluminum or the like. By providing the barrier metal, diffusion of aluminum atoms into the semiconductor substrate can be reduced.

In addition, plugs may be provided inside the contact holes 49, 54 and 56 between the respective electrodes and the semiconductor substrate. The plug may have a barrier metal in contact with the semiconductor substrate, and a tungsten buried and formed to be in contact with a portion on that barrier metal. In the plug, the tungsten and the barrier metal may be in contact with each other.

The emitter electrode 52 is provided above the well region 11, the emitter region 12, base region 14, the contact region 15 and the trench section. The well region 11 of the present example is provided in a predetermined range from the vicinity of the short portion of the trench section to an outer end portion of the gate metal layer 50 located in the outer side of the gate runner 48. In the semiconductor substrate, the well region 11 may be provided at a depth greater than a depth of the trench section. In a partial region of the trench section, that partial region close to the gate metal layer 50 may be provided in the well region 11. The bottoms of the end portions of the dummy trench section 30 and the gate trench section 40 in the extending direction may be covered by the well region 11.

The mesa section 19 of the present example has the base region 14. The base region 14 may be a region having a doping concentration of a second conductivity type that is lower than that of the contact region 15. The base region 14 of the present example is of P− type. Additionally, in the present example, a first conductivity type is defined as N type, while the second conductivity type is defined as P type. However, in another example, the first conductivity type may be defined as P type, while the second conductivity type may be defined as N type.

On the upper surface of the base region 14, the mesa section 19 has the contact region 15 having a doping concentration of the second conductivity higher than that of the base region 14. The contact region 15 is selectively provided inside the semiconductor substrate such that the contact region 15 is at least partially located on the upper surface of the semiconductor substrate. The contact region 15 of the present example is of P+ type. Note that in FIG. 1, the base region 14 located below the contact region 15 is not illustrated.

In addition, the mesa section 19 has the emitter region 12 of the first conductivity type that is provided in direct contact with the contact region 15 on the upper surface of the base region 14. The emitter region 12 is also selectively provided inside the semiconductor substrate such that the emitter region 12 is at least partially located on the upper surface of the semiconductor substrate. The emitter region 12 of the present example has a doping concentration of the first conductivity type higher than a doping concentration of the first conductivity type of the drift layer of the semiconductor substrate. The emitter region 12 of the present example is of N+ type.

The multiple accumulation layers 60 have a doping concentration of the first conductivity type higher than a doping concentration of the first conductivity type of the drift layer of the semiconductor substrate. In the present example, each of the multiple accumulation layers 60 is of N+ type. Each of the multiple accumulation layers 60 may have a peak position of the doping concentration at a predetermined depth position, such that the doping concentration may gradually be reduced in the vertical direction around that peak position. Therefore, each of the accumulation layers can be identified as a different layer in the depth direction of the mesa section 19.

Each of the contact region 15 and the emitter region 12 is provided in the X-axis direction from the gate trench section 40 to the dummy trench section 30 that are adjacent to each other. The emitter regions 12 and the contact regions 15 of the present example are alternately provided along the extending direction of the trench section.

The contact holes 54 are provided above each region of the contact regions 15 and the emitter regions 12. The contact hole 54 is not provided in a region corresponding to the base region 14 and the well region 11 shown in FIG. 1. Note that the well region 11 is a region of the second conductivity type having a doping concentration higher than that of the base region 14. The well region 11 of the present example is the region of P+ type.

Figure 2:
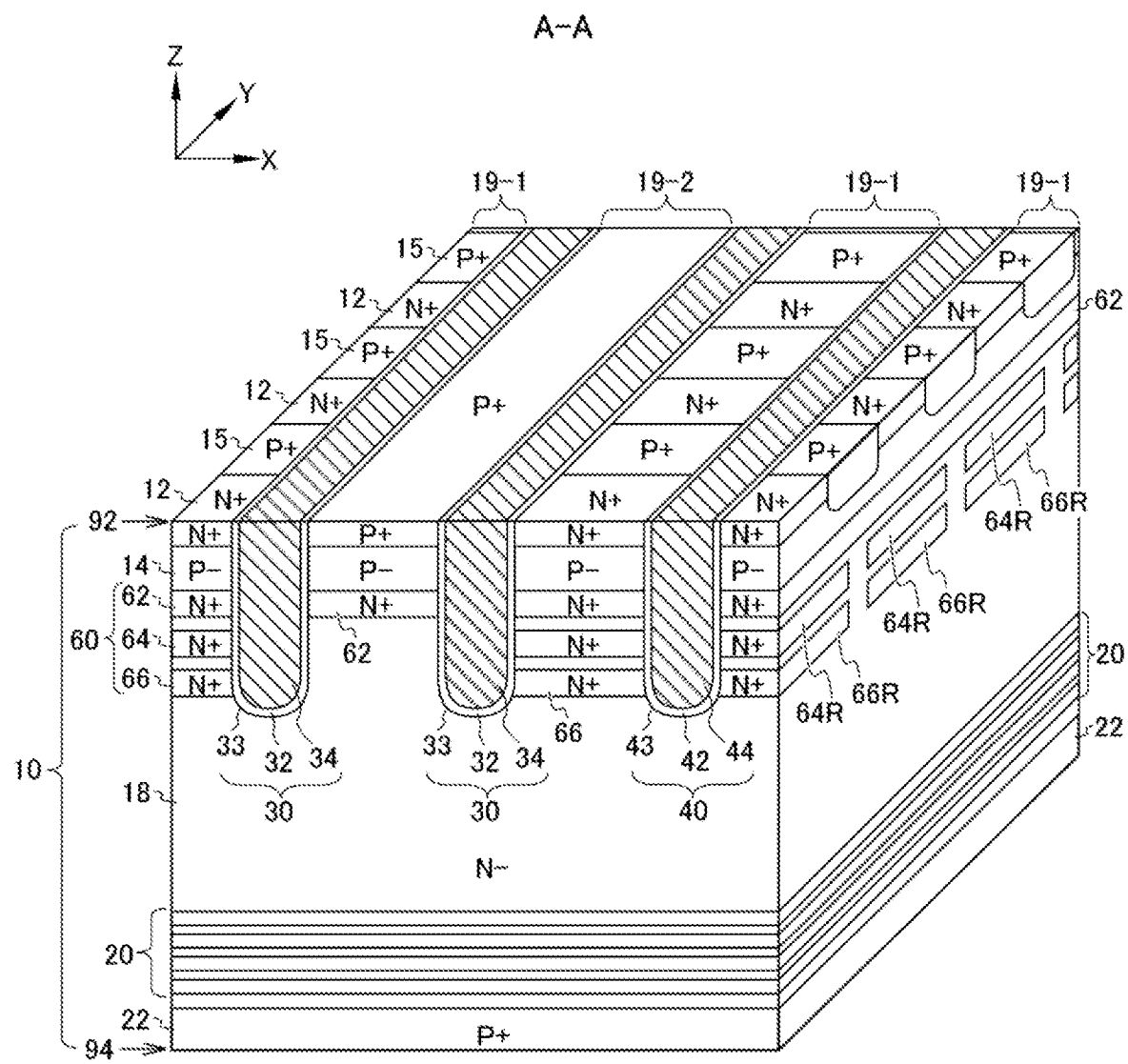
FIG. 2 is a perspective view showing one example in a section A-A of FIG. 1.

FIG. 2 is a perspective view showing one example in a section A-A of FIG. 1. Note that for the purpose of easy understanding, in FIG. 2, structures above the upper surface 92 of the semiconductor substrate 10 and below the lower surface 94 thereof will be omitted. In FIG. 2, the semiconductor substrate 10, the drift layer 18, the buffer layer 20 and the collector layer 22 are additionally shown.

The semiconductor substrate 10 may be a silicon substrate, may be a silicon carbide substrate, may be a gallium oxide substrate or may be a nitride semiconductor substrate such as gallium nitride. The semiconductor substrate 10 of the present example is the silicon substrate. The drift layer 18 of the first conductivity type may be provided below the mesa section 19. Note that the drift layer 18 of the present example is of N− type. The buffer layer 20 and the collector layer 22 will be described later.

The mesa section 19-1 of the present example has the emitter region 12 of N+ type and the contact region 15 of P+ type, the base region 14 of P− type and the multiple accumulation layers 60 (in the present example, the first accumulation layer 62, the second accumulation layer 64 and the third accumulation layer 66) in order from the upper surface 92 toward the lower surface 94. In particular, by providing the multiple accumulation layers 60 between the base region 14 and the drift layer 18 of the mesa section 19-1, a carrier injection enhancement effect (Injection Enhancement Effect: IE effect) can be increased, which can reduce Von. Note that the mesa section 19-2 of the present example has the contact region 15 of P+ type, the base region 14 of P− type and the first accumulation layer 62 in order from the upper surface 92 toward the lower surface 94.

As mentioned above, the first accumulation layer 62 of the present example is provided across between the individual trench sections, and provided to extend in the extending direction of the trench section. On the other hand, the second accumulation layer 64 and the third accumulation layer 66 are provided across between the dummy trench section 30 and the gate trench section 40, and provided discretely in the extending direction of the trench section. The upper portion of the first accumulation layer 62 closest to the upper surface 92 may be in contact with the base region 14. In addition, the lower portion of the third accumulation layer 66 formed closest to the lower surface 94 side may come closer to the upper surface 92 side than the end portion of the bottom portion of the trench section. That is, the multiple accumulation layers 60 may be provided in the mesa section 19 closer to the upper surface 92 side than the bottom portion of the trench section.

In the present example, since the multiple accumulation layers 60 are provided, Von can be reduced as compared to the case where only the first accumulation layer 62 is provided. Further, in the present example, the second accumulation layer 64 and the third accumulation layer 66 are intermittently provided to be disconnected below the partial region of the contact region 15. In this manner, as compared to the case where all of the multiple accumulation layers 60 are continuous in the extending direction of the trench section like the first accumulation layer 62 (the case where all layers are continuous in the extending direction), carriers (holes in the present example) can be discharged into the contact region 15 more efficiently. Accordingly, as compared to the case where all of the multiple accumulation layers 60 are continuous in the extending direction, Eoff that is a loss during the turn-off period of the IGBT can be reduced. In this manner, in the present example, a trade-off between Von and Eoff can be improved.

At least one accumulation layer that is discontinuous immediately below the contact region 15 may be an island-shaped accumulation layer. In the present specification, the island-shaped accumulation layer means a layer that includes a plurality of accumulation regions each of which is provided discretely in a plane orthogonal to the depth direction. Also, in the present specification, the plurality of accumulation regions mean a region having an N type doping concentration higher than an N type doping concentration of the drift layer 18. The plurality of accumulation regions provided in an island shape are respectively provided below at least a part of the emitter region 12, but are not provided below a partial region of the contact region 15, and are separated from each other.

In the present example, all of the accumulation layers except the first accumulation layer 62 are the island-shaped accumulation layers. That is, the second accumulation layer 64 has a plurality of second accumulation regions 64R, and the third accumulation layer 66 has a plurality of third accumulation regions 66R. In this manner, as compared to the case where the second accumulation layer 64 and the third accumulation layer 66 are continuous in the extending direction, Eoff can be reduced.

Note that as described later in another example, the second accumulation layer 64 may be provided continuously in the extending direction, and the first accumulation layer 62 and the third accumulation layer 66 may be island-shaped accumulation layers. Instead of this, the first accumulation layer 62 and the second accumulation layer 64 may be provided continuously in the extending direction, and the third accumulation layer 66 may be the island-shaped accumulation layer. Further, instead of this, all of the first accumulation layer 62, the second accumulation layer 64 and the third accumulation layer 66 may be the island-shaped accumulation layers.

The N type doping concentration of the accumulation region in the accumulation layers and the island-shaped accumulation layers provided continuously may be an N type doping concentration equal to or greater than ten times, equal to or greater than thirty times, equal to or greater than one hundred times, or equal to or greater than three hundred times as much as the doping concentration of the drift layer 18. For example, the first accumulation layer 62, the second accumulation region 64R and the third accumulation region 66R in the present example may respectively have an N type doping concentration equal to or greater than one hundred times as much as the doping concentration of the drift layer 18.

In addition, the peak value of the N type doping concentration in the third accumulation region 66R in the depth direction may be higher than the peak value of the N type doping concentration in the first accumulation layer 62 and the second accumulation region 64R in the depth direction. The peak values of the N type doping concentration of the first accumulation layer 62 and the second accumulation region 64R in the depth direction may be the same level. The position of the peak concentration in the depth direction can be determined according to acceleration energy when N type impurities are ion implanted.

Note that the doping concentration of the drift layer 18 may be a doping concentration between the lower end of the trench section and the buffer layer 20 in the depth direction. The doping concentration of the drift layer 18 is, for example, a net doping concentration at an intermediate position between the lower end of the trench section and the buffer layer 20 in the depth direction. The doping concentration of the drift layer 18 may be an average value of the doping concentrations in a predetermined depth range. In one example, the doping concentration of the drift layer 18 may be an average value of the doping concentrations from a position that is below a lower end of the gate trench section 40 by 1 µm to a position above a boundary between the drift layer 18 and the buffer layer 20 by 1 µm.

In one island-shaped accumulation layer, the region between the accumulation regions may have a doping concentration of the first conductivity type lower than a doping concentration of the first conductivity type in the accumulation region. For example, in the second accumulation layer, the N type doping concentration in the region between the two accumulation regions 64R is lower than the N type doping concentration of the second accumulation region 64R. Also, in one island-shaped accumulation layer, the region between the accumulation regions may have a doping concentration equal to or greater than the doping concentration of the first conductivity type in the drift layer 18. For example, in the second accumulation layer, the N type doping concentration in the region between the two second accumulation regions 64R is the same as the N type doping concentration in the drift layer 18. Accordingly, as compared to the case where the carriers travel from bottom to top by penetrating the accumulation region, the carriers can travel more readily from bottom to top by penetrating the region between two accumulation regions.

Also, the number of the accumulation layers in the mesa section 19-1 in direct contact with the gate trench section 40 may be greater than the number of the accumulation layers in the mesa section 19-2 between two dummy trench sections 30. In the present example, the number of the accumulation layers in the mesa section 19-1 is three (the first accumulation layer 62, the second accumulation layer 64 and the third accumulation layer 66). On the other hand, the number of the accumulation layer in the mesa section 19-2 is one (the first accumulation layer 62 only).

Accordingly, as compared to the case where the number of the accumulation layers in the mesa section 19-2 is equal to or greater than the number of the accumulation layers in the mesa section 19-1, the carriers can be extracted efficiently from the contact region 15 between the individual dummy trench sections 30 during the turn-off period. Accordingly, Eoff can be reduced.

Note that in another example, the mesa section 19-2 may not have the accumulation layer. In this manner, as compared to the case where one accumulation layer is provided in the mesa section 19-2, the carriers can be extracted more efficiently during the turn-off period.

The buffer layer 20 of N+ type is provided on the lower surface of the drift layer 18. The doping concentration of the buffer layer 20 may be higher than the doping concentration of the drift layer 18. The buffer layer 20 of the present example includes an N+ type dopant implantation region having a plurality of peaks of the doping concentration in the depth direction. The buffer layer 20 may serve as a field stop layer that prevents a depletion layer expanding from the lower surface of the base region 14 from reaching the P+ type collector layer 22.

The dummy trench section 30 and the gate trench section 40 penetrate the base region 14 from the upper surface 92 of the semiconductor substrate 10 and reach the drift layer 18. In the region where at least any of the emitter region 12, the contact region 15, the accumulation layer and the accumulation region is provided in a planar view of the upper surface 92 of the semiconductor substrate 10, the dummy trench section 30 and the gate trench section 40 penatrate these regions and reach the drift layer 18. Note that the configuration in which the trench section penetrates the dopant implantation region is not limited to the one manufactured by forming the trench section after forming the dopant implantation region. The configuration in which the dopant implantation region is formed between the trench sections after forming the trench sections also falls within the one in which the trench section penetrates the dopant implantation region.

The gate trench section 40 includes a gate trench 43, a gate insulating film 42 and a gate conductive section 44 provided in the semiconductor substrate 10. The gate insulating film 42 is provided to cover the inner wall of the gate trench 43. The gate insulating film 42 may be formed by oxidizing or nitriding the semiconductor of the inner wall of the gate trench 43. The gate insulating film 42 insulates the gate conductive section 44 from the semiconductor substrate 10. The gate conductive section 44 is provided inside the gate trench 43 on an inner side with respect to the gate insulating film 42. The gate conductive section 44 is formed of a conductive material such as polysilicon. A gate potential is supplied from the gate metal layer 50 to the gate conductive section 44.

A part of the gate conductive section 44 faces the base region 14 in the arrangement direction. A portion of the base region 14 that faces the gate conductive section 44 may serve as a channel forming region. When a predetermined voltage is applied to the gate conductive section 44, a channel is formed in the surface layer of the interface of the base regions 14 that is in contact with the gate trench 43.

The dummy trench section 30 may have a structure similar to that of the gate trench section 40. A dummy trench conductive section 34 may have the same length as that of the gate conductive section 44 in the depth direction. The dummy trench section 30 has a dummy trench 33, a dummy trench insulating film 32 and the dummy trench conductive section 34 that are provided in the semiconductor substrate 10. The dummy trench insulating film 32 is provided to cover the inner wall of the dummy trench 33. The dummy trench insulating film 32 insulates the dummy trench conductive section 34 from the semiconductor substrate 10. The dummy trench conductive section 34 is provided inside the dummy trench 33 and provided on an inner side with respect to the dummy trench insulating film 32. The dummy trench conductive section 34 may be formed of the same material as that of the gate conductive section 44. An emitter potential may be supplied from the emitter electrode 52 to the dummy trench conductive section 34.

Figure 3:
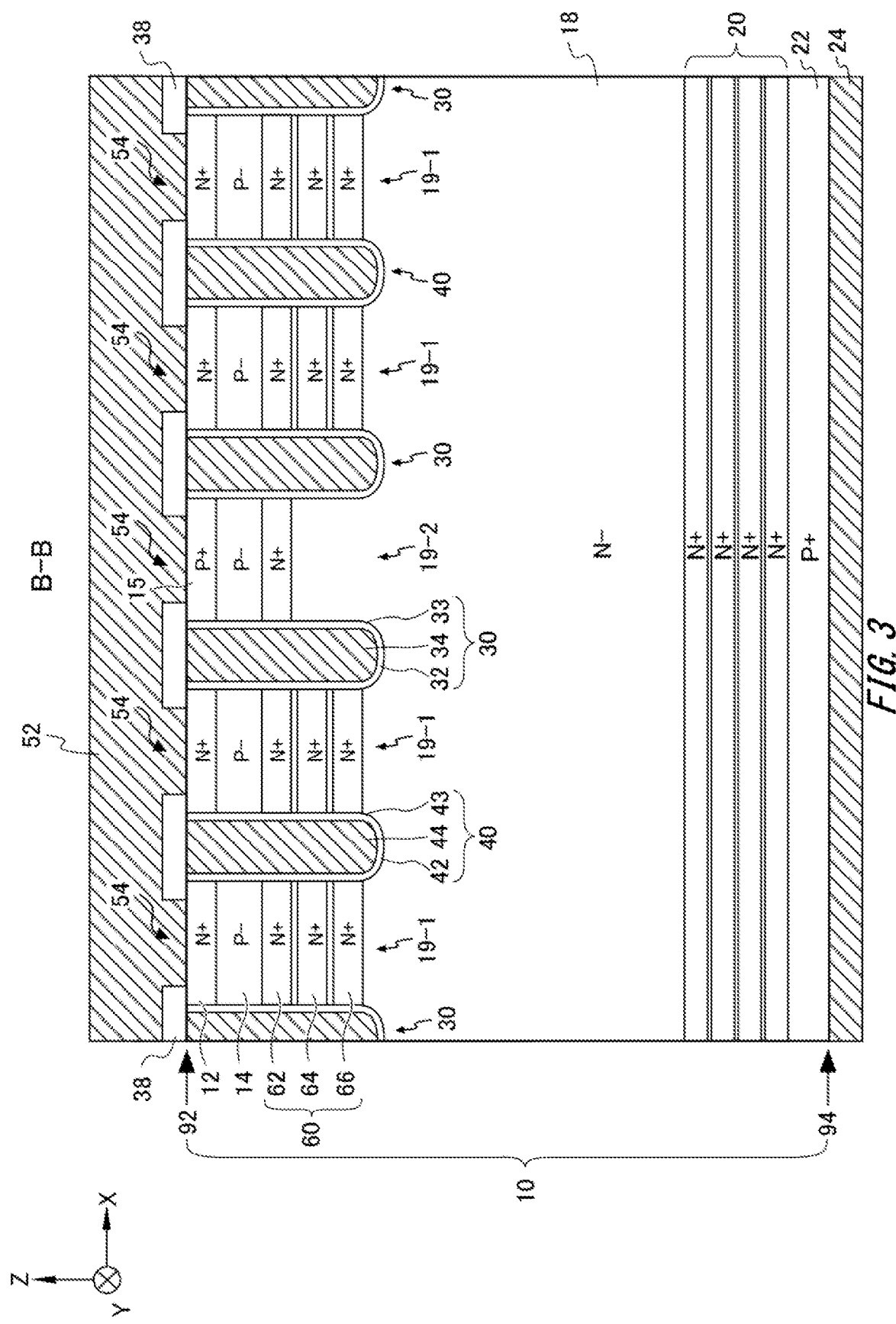
FIG. 3 is a cross-sectional view showing one example in a section B-B of FIG. 1.

FIG. 3 is a cross-sectional view showing one example in a section B-B of FIG. 1. The section B-B is an XZ section that penetrates the emitter region 12. In FIG. 3, an interlayer dielectric film 38, an emitter electrode 52 and a collector electrode 24 are additionally shown. In FIG. 3, the gate trench section 40 and the dummy trench section 30 are covered with the interlayer dielectric film 38 on the upper surface 92 of the semiconductor substrate 10. The interlayer dielectric film 38 electrically insulates the gate conductive section 44 and the dummy trench conductive section 34 from the emitter electrode 52. Note that as mentioned above, the dummy trench conductive section 34 is electrically connected to the emitter electrode 52 via the contact hole 56 provided in the interlayer dielectric film 38.

The emitter electrode 52 is in contact with a portion on the upper surface 92 and on the interlayer dielectric film 38 of the semiconductor substrate 10. The collector electrode 24 is in contact with a portion below the lower surface 94 of the semiconductor substrate 10. The emitter electrode 52 and the collector electrode 24 are formed of a conductive material such as metal.

Figure 4:
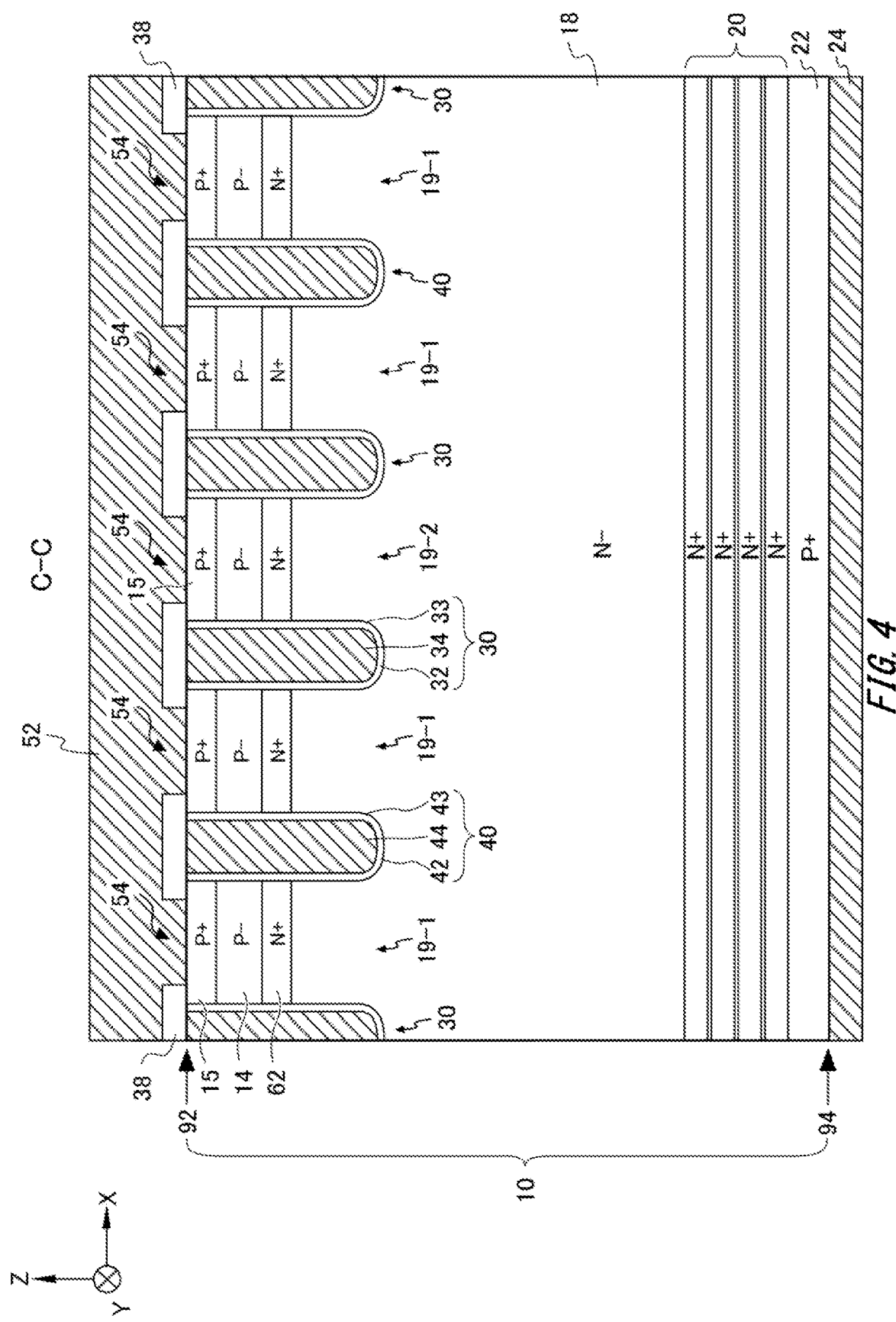
FIG. 4 is a cross-sectional view showing one example in a section C-C of FIG. 1.

FIG. 4 is a cross-sectional view showing one example in a section C-C of FIG. 1. The section C-C is an XZ section that penetrates the contact region 15 of the mesa section 19-1, and that penetrates a region between two second accumulation regions 64R and a region between two third accumulation regions 66R. Therefore, in the section C-C, only the first accumulation layer 62 is shown, while the second accumulation layer 64 and the third accumulation layer 66 are not shown.

Figure 5:
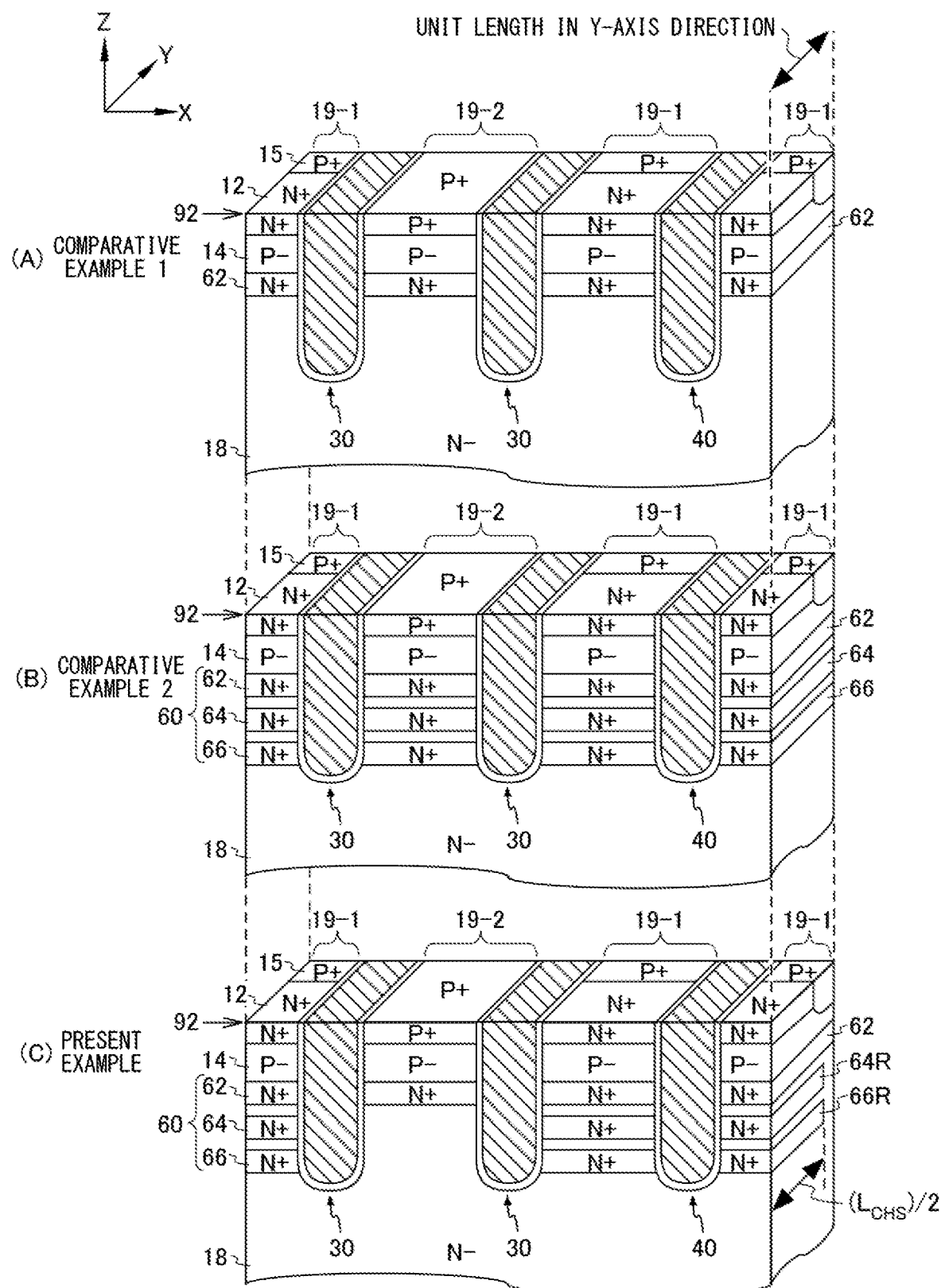
FIG. 5 includes perspective views, respectively shown as (A), (B) and (C), of Comparative Example 1, Comparative Example 2 and the first embodiment in a unit structure length in a Y-axis direction.

FIG. 5 includes perspective views, respectively shown as (A), (B) and (C), of Comparative Example 1, Comparative Example 2 and the first embodiment in a unit structure length in a Y-axis direction. FIG. 5 corresponds to the section A-A (FIG. 2) of the first embodiment. That is, in FIG. 5, two adjacent dummy trench sections 30 and one gate trench section 40 are shown.

(A) of FIG. 5 shows Comparative Example 1 having only the first accumulation layer 62. On the other hand, (B) of FIG. 5 shows Comparative Example 2 in which the multiple accumulation layers 60 have three accumulation layers and all of which are continuous in the extending direction. Then, (C) of FIG. 5 shows the present example that is the first embodiment.

The unit structure length in the Y-axis direction may be a length that is half of a sum of the lengths of the emitter region 12 and the contact region 15 in the Y-axis direction. In the present example, the unit structure length in the Y-axis direction is 1.4 [μm]. The unit structure length in the Y-axis direction of the present example is merely one example, and may be of course modified variously according to a design and a specification. Note that ($L_{CHS}$)/2 in (C) of FIG. 5 means half of the length in the Y-axis direction of the accumulation region of the present example.

Figure 6A:
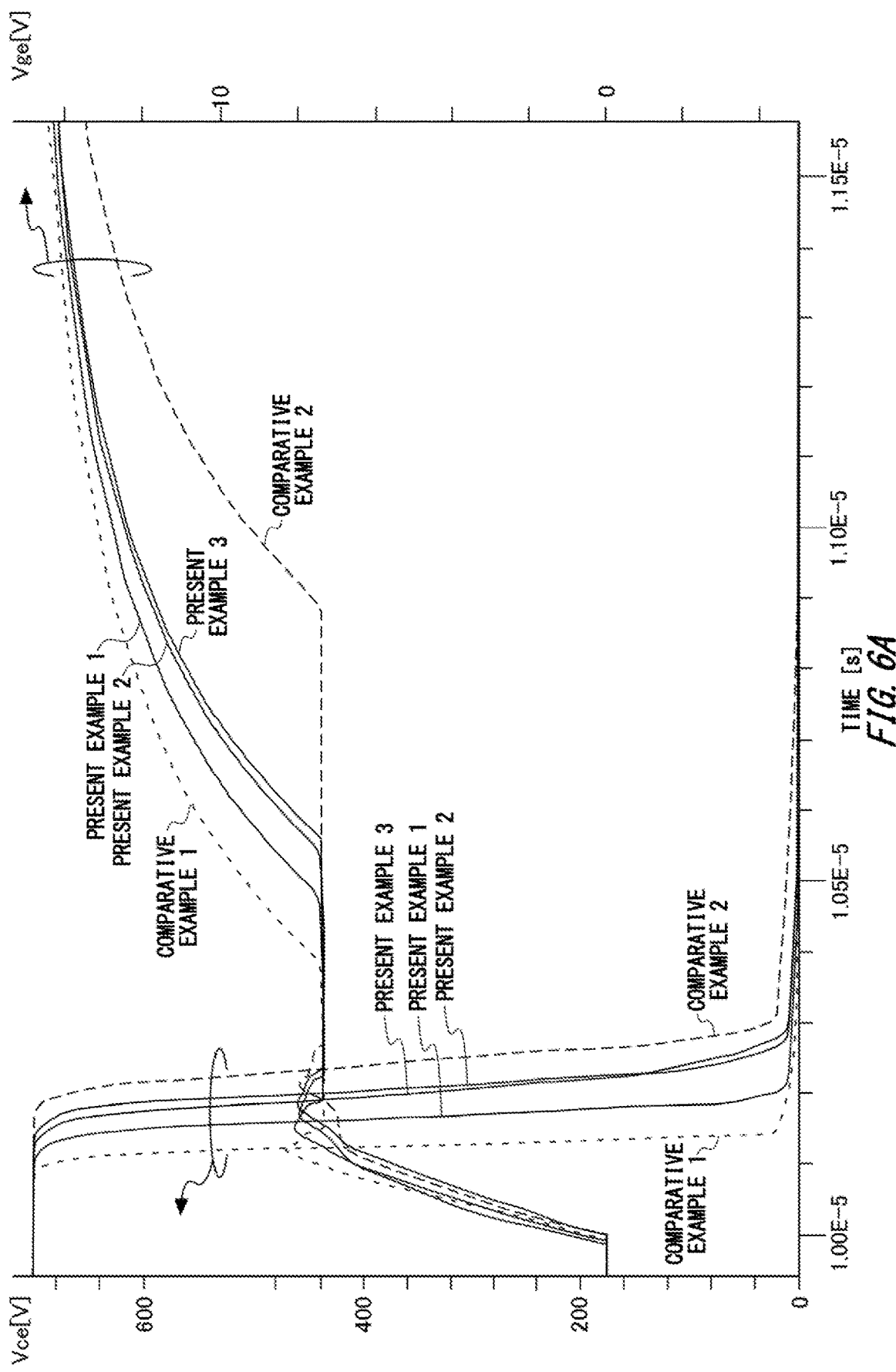
FIG. 6A is a view showing simulations of Vge and Vce during a low-current turn-on period.

FIG. 6A is a view showing simulations of Vge and Vce during a low-current turn-on period. The left side of the vertical axis indicates Vce [V], and the right side of the vertical axis indicates Vge [V]. The horizontal axis indicates time [s]. Vge is a potential difference between the gate metal layer 50 and the emitter electrode 52, and Vce is a potential difference between the collector electrode 24 and the emitter electrode 52. In the present example, the emitter electrode 52 is grounded.

Vge and Vce in (A) of FIG. 5 (i.e., Comparative Example 1) are shown by dotted lines, and Vge and Vce in (B) of FIG. 5 (i.e., Comparative Example 2) are shown by dashed lines. Also, Vge and Vce in (C) of FIG. 5 (i.e., the present example) are shown by solid lines. Note that in the present example, there is shown the case where $L_{CHS}/2=0.2$ [μm] (present example 1), 0.6 [μm] (present example 2) and 1.0 [μm] (present example 3) are set.

As shown in FIG. 6A, a positive potential was applied to the gate metal layer 50 at a time point 1.00E-5 [s]. Vge in Comparative Example 1 was raised to about 8.0[V] once, and then settled to about 7 [V] by a time point 1.03E-5 [s].

Hereinafter, a rapid increase of Vge in this manner is referred to as a "rapid spike". Vge in Comparative Example 1 was maintained at about 7 [V] until a time point 1.04E-5 [s], and the potential was gradually raised after the time point 1.04E-5 [s]. Note that Vge of Comparative Example 1 was temporarily settled at a constant value of about 7 [V], and a period for which this Vge is a constant value is referred to as a mirror period.

The magnitude (absolute value) of the voltage reduction rate dV/dt of Vce in Comparative Example 1 is about 23000 [V/μs] during a period from a time point 1.01E-5 [s] to a time point 1.02E-5 [s]. The Vce is generally maintained at this dV/dt until it falls below 40 [V].

Vge in Comparative Example 2 was rapidly increased to about 8.0[V] once, and then settled to about 7 [V] by a time point 1.03E-5 [s]. However, the rapid increase value of Vge in Comparative Example 2 was lower than that of Comparative Example 1. Also, in Comparative Example 2, dV/dt in the Vce of 200 [V] or less was about 8800 [V/μs], which was equal to or less than one third of that of Comparative Example 1.

Also, Vge in the present example was rapidly increased to about 8.0[V] once, and then settled to about 7 [V] by the time point 1.03E-5 [s]. However, in each of the present examples, the dV/dt of Vce was a value close to that of Comparative Example 2 around the period from about 1.015E-5 [s], at which the voltage started falling down at the maximum reduction rate, to about 1.02E-5 [s]. Thereafter, the magnitude of dV/dt was gradually reduced.

In this manner, in the present examples and Comparative Example 2, dV/dt could be suppressed as compared to Comparative Example 1. The larger the absolute value of dV/dt, the larger the electromagnetic noise to be generated in the semiconductor device 100. The present example and Comparative Example 2 are also more advantageous as compared to Comparative Example 1 in that the electromagnetic noise due to dV/dt can be reduced.

The majority of the current at an early stage during a low-current turn-on period is not a hole current, but an electron current. The early stage during the low-current turn-on period refers to a period from a time point immediately before the gate voltage Vge reaches a threshold voltage to a time point at the beginning of a mirror period for which Vge becomes constant at a value generally being the value of the threshold voltage. As Vge comes closer to the threshold voltage, formation of a channel into the base region 14 is started, and injection of electrons into the drift layer 18 is started. Therefore, as Vge comes closer to the threshold voltage, Vce starts dropping rapidly.

When the electrons injected in the drift layer 18 reach the collector layer 22, injection of holes is started from the collector layer 22 to the buffer layer 20 and the drift layer 18. The holes are concentrated at the respective lower ends of the gate trench section 40 and the dummy trench section 30. However, since the dummy trench conductive section 34 has the same potential as that of the emitter electrode 52, the holes are especially concentrated in the vicinity of the dummy trench section 30. That is, an inversion layer of the holes is formed in the vicinity of the dummy trench section 30.

The holes are accumulated from the dummy trench section 30 to the lower end of the gate trench section 40. Due to this hole distribution, a displacement current flows into the vicinity of the lower end of the gate trench section 40 during the low-current turn-on period.

The displacement current due to the accumulation of the holes will charge the gate conductive section 44. It is assumed that this charge of the gate conductive section 44 causes the rapid increase of Vge. The larger that displacement current is, the more quickly the gate conductive section 44 is charged, so that the potential of the gate conductive section 44 is raised more rapidly. As a result, the potential of the gate conductive section 44 will exceed rapidly a gate threshold. Accordingly, a large amount of injection of the electrons and the holes is started, so that current between collector and emitter is increased.

The voltage reduction rate (dV/dt) of Vce is increased according to the current change rate by the increase of the current between collector and emitter. The larger the displacement current, the larger the current change rate. Accordingly, dV/dt becomes larger.

The number of the accumulation layers in Comparative Example 1 is smaller than that of Comparative Example 2 and the present example. However, as mentioned above, the carriers were sufficiently accumulated in the dummy trench section 30, and as a result, the displacement current of Comparative Example 1 was the largest among the three of Comparative Example 1, Comparative Example 2 and the present example. Therefore, dV/dt of Comparative Example 1 was the largest among the three. Additionally, although a gate resistance Rg may also be increased to suppress dV/dt, it is not desirable to increase Rg which results in an increase in turn-on loss Eon.

On the other hand, in Comparative Example 2 and the present example, a plurality of the accumulation layer are provided from a portion immediately below the base region 14 to the vicinity of a bottom portion of the dummy trench section 30. In this manner, as compared to Comparative Example 1, it can be suppressed that the holes are densely concentrated at the side portion of the dummy trench section 30. Note that the holes are densely concentrated in the vicinity of the bottom portion of the dummy trench section 30 in the same way as Comparative Example 1. However, in Comparative Example 2 and the present example, the number of the carriers that concentrate at the bottom portion and the side portion of the dummy trench section 30 is smaller than that of Comparative Example 1. As a result, in Comparative Example 2 and the present example, the displacement current that flows in the gate conductive section 44 is sufficiently smaller than that of Comparative Example 1. Accordingly, in Comparative Example 2 and the present example, dV/dt can be smaller than that of Comparative Example 1.

The mesa sections 19-1 and 19-2 of Comparative Example 2 each have the accumulation layers continuously in the extending direction of the trench section. On the other hand, in the mesa section 19-1 of the present example, the side portion of the dummy trench section 30 is exposed to the gate trench section 40. That is, in Comparative Example 2, the carriers accumulated by the continuous multiple accumulation layers 60 can form the displacement current, and in the present example, the side portion of the exposed dummy trench section 30 can form the displacement current. As details are described later, dV/dt can be smaller than that of Comparative Example 2 by adjustment of the length of the $L_{CHS}$ in the present example.

In addition, in the present example, in a portion immediately below a part of the contact region 15 in the mesa section 19-1, the second accumulation layer 64 and the third accumulation layer 66 are discretely provided. Therefore, during a turn-off period, the carriers more than those of Comparative Example 2 are discharged from the mesa section 19-1 to the contact region 15 by passing through a portion between two adjacent second regions 64R and a portion between two adjacent third regions 66R. Also, the carriers more than those of Comparative Example 2 are discharged from the mesa section 19-2 to the contact region 15. Therefore, in the present example, Eoff can be reduced more as compared to that of Comparative Example 2.

Note that the mesa section 19-2 of the present example has only the first accumulation layer 62 as the accumulation layer or the accumulation region. However, in another example, the mesa section 19-2 may have smaller numbers of the accumulation layers and the accumulation regions than those of the mesa sections 19-1, or may have a small number of the accumulation layers or of the accumulation regions than that of the mesa sections 19-1. For example, as in the present example, when the mesa section 19-1 has one accumulation layer and two accumulation regions, the mesa section 19-2 may have one accumulation layer and one accumulation region.

Figure 6B:
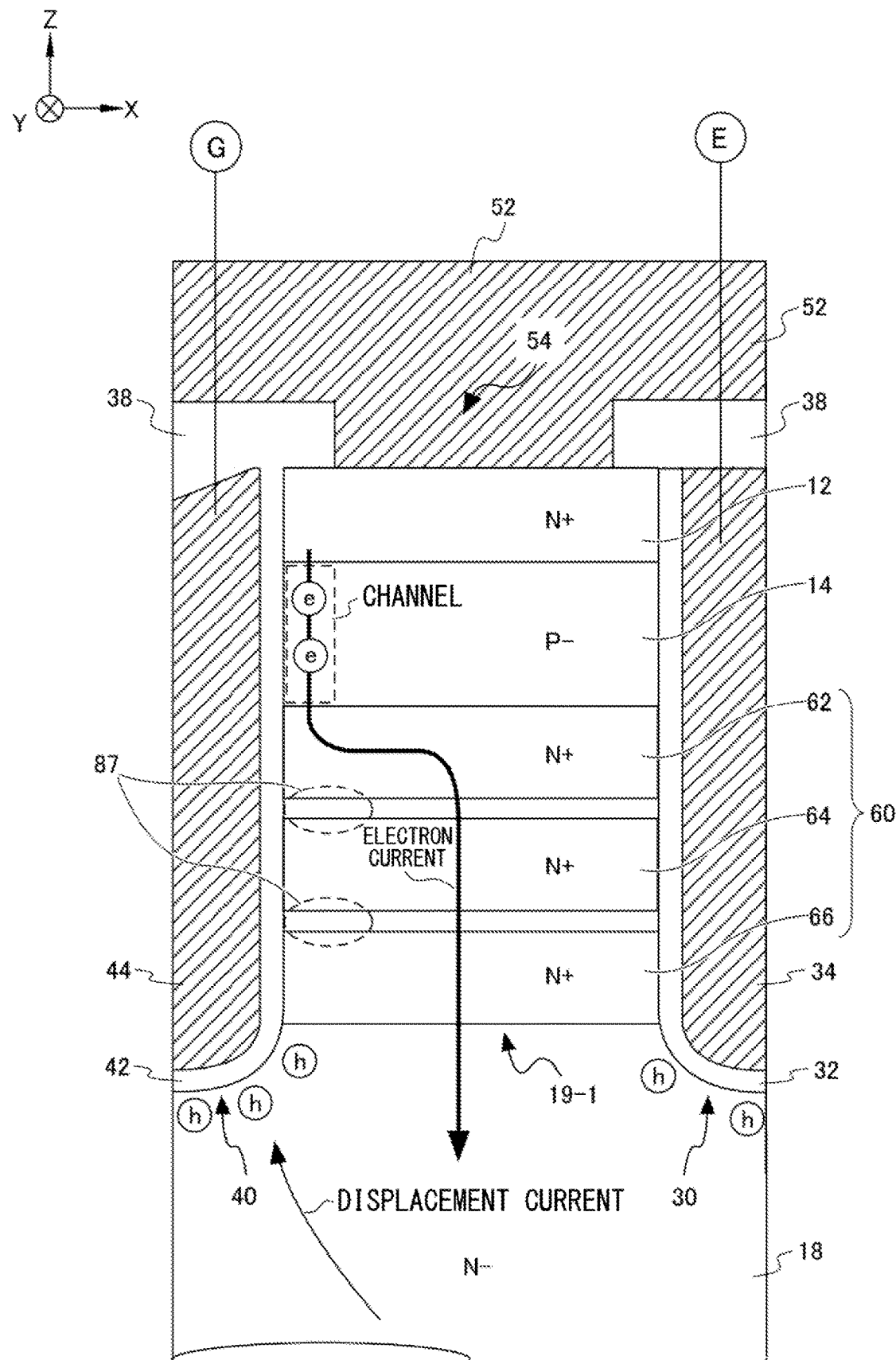
FIG. 6B is a view showing an electron current and a displacement current during a turn-on period in the semiconductor device 100 including a first accumulation layer 62, a second accumulation layer 64 and a third accumulation layer 66.

FIG. 6B is a view showing the electron current and the displacement current during the turn-on period in the semiconductor device 100 including the first accumulation layer 62, the second accumulation layer 64 and the third accumulation layer 66. The electrons having passed through a channel are about to travel in the arrangement direction (X-axis direction) in the first accumulation layer 62. However, in the present example, the second accumulation layer 64 and the third accumulation layer 66 are provided below the first accumulation layer 62.

In the present example, the impedance for the electron current is lower in a direct flow path in which the electron current directly flows from the first accumulation layer 62 to the second accumulation layer 64 than in a flow path in which the electron current flows from the vicinity of the central portion of the first accumulation layer 62, back to the vicinity of the gate trench section 40, and then to the second accumulation layer 64. Similarly, that impedance is lower in the direct flow path in which the electron current directly flows from the second accumulation layer 64 to the third accumulation layer 66, than in the flow path in which the electron current flows from the vicinity of the central portion of the second accumulation layer 64, back to the vicinity of the gate trench section 40, and then to the third accumulation layer 66.

Of the portion between the first accumulation layer 62 and the second accumulation layer 64, as well as the portion between the second accumulation layer 64 and the third accumulation layer 66, the holes are easy to be accumulated in a hole high concentration region 87 in direct contact with the gate trench section 40. Also, that the electron current flows in the vicinity of the central portion of the mesa section 19, not in the vicinity of the gate trench section 40, facilitates the accumulation of the holes into the hole high concentration region 87. For this reason, this facilitates the electron current to flow in the vicinity of the central portion of the mesa section 19. In FIG. 6B, though the hole high concentration region 87 with the holes accumulated is schematically shown, the hole high concentration region 87 may exist only in the vicinity of the boundary between the gate trench section 40 and the semiconductor substrate 10.

As mentioned above, the electron current of the present example does not go back to the vicinity of the gate trench section 40, but travels downward in the vicinity of the central portion of the mesa section 19 that is sandwiched between the gate trench section 40 and the dummy trench section 30. That is, the electron current of the present example flows in the vicinity of the central portion of the mesa section 19, not in the vicinity of the gate trench section 40. An effect of the electron current flowing in the vicinity of the central portion of the mesa section 19 is caused by arranging the first accumulation layer 62, the second accumulation layer 64 and the third accumulation layer 66 in the depth direction.

When the electron current flows the vicinity of the central portion of the mesa section 19, the hole distribution in the vicinity of the bottom portion of the mesa section 19 is divided in the vicinity of the central portion of the mesa section 19. For this reason, the holes closer to the dummy trench section 30 side as compared to the path of the electron current do not flow toward the gate trench section 40 side. This division of the hole distribution at the central portion of the mesa section 19 suppresses the accumulation of the holes at the lower end of the gate trench section 40. As a result, the displacement current can be smaller. Since the displacement current can be smaller, the charge of the gate conductive section 44 becomes smaller, so that a rapid increase of the gate voltage Vge can also be suppressed. Accordingly, the voltage reduction rate (dV/dt) between the collector electrode 24 and the emitter electrode 52 can also be suppressed.

It is assumed that the hole distribution in the example of FIG. 6B is due to a fact in which the hole distribution between the gate trench section 40 and the dummy trench section 30 is divided by the electron current. Also, that hole distribution can reduce, during the turn-on period, the displacement current flowing from the vicinity of the lower end of the dummy trench section 30 to the vicinity of the lower end of the gate trench section 40.

Note that the second accumulation layer 64 and the third accumulation layer 66 may not be in contact with the dummy trench section 30. In this case, the holes can exist from the lower end of the dummy trench section 30 to a portion immediately below the first accumulation layer 62 at the side portion of the dummy trench section 30. In the case where the second accumulation layer 64 and the third accumulation layer 66 are not in contact with the dummy trench section 30, the extraction of the holes into the emitter electrode 52 can be facilitated during a turn-off period.

Figure 6C:
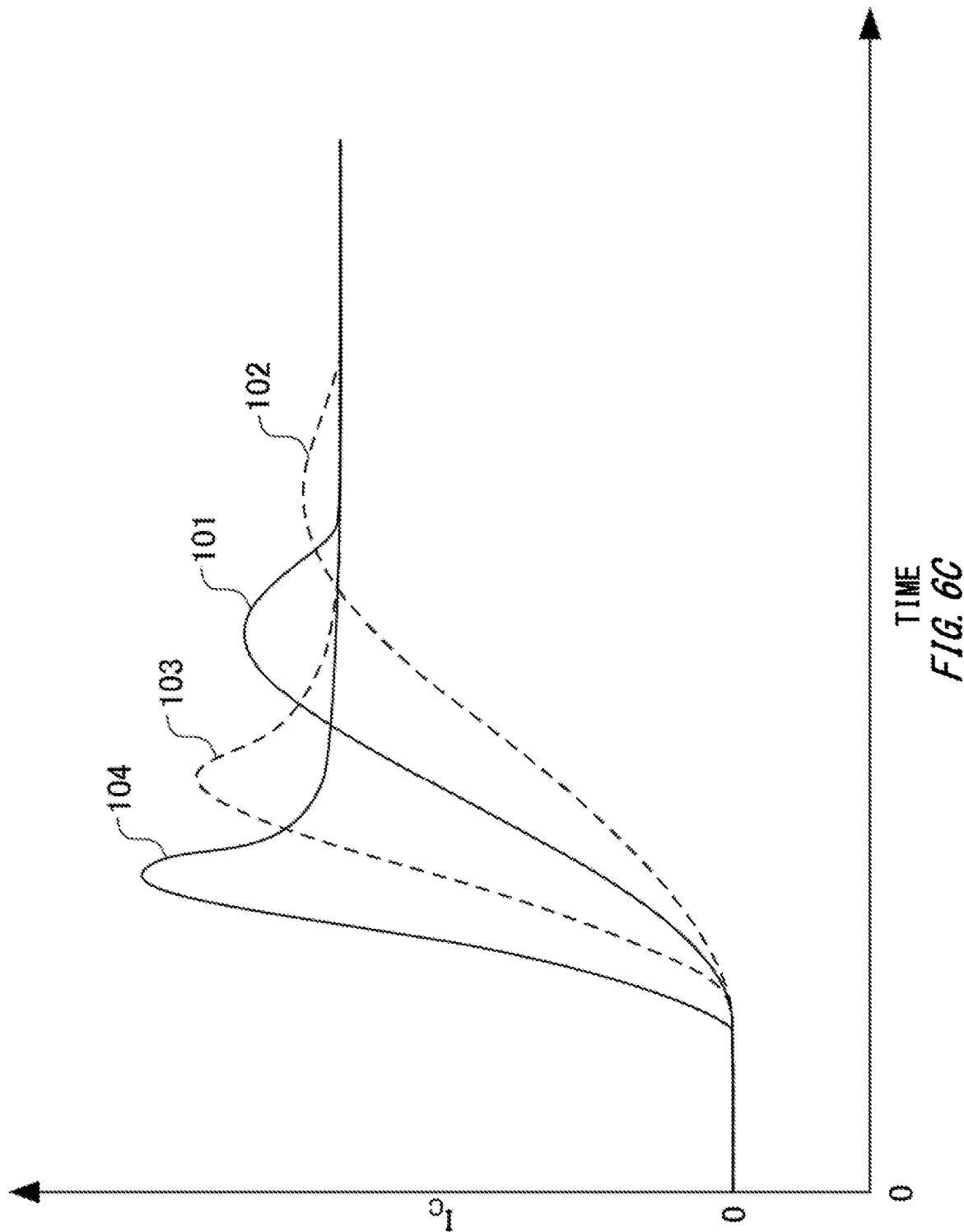
FIG. 6C is a view showing a waveform example of a collector current Ic during a turn-on period.

FIG. 6C is a view showing a waveform example of the collector current Ic during the turn-on period. The waveform 103 shows the collector current Ic in the case where none of the first accumulation layer 62, the second accumulation layer 64 and the third accumulation layer 66 are provided. The waveform 104 shows the collector current Ic in the case where the first accumulation layer 62 is provided, while neither of the second accumulation layer 64 and the third accumulation layer 66 are provided. Since the first accumulation layer 62 is provided in the vicinity of the base region 14, a negative capacitance between gate and collector is increased. For this reason, the di/dt of the collector current Ic is increased during the turn-on period. By providing the first accumulation layer 62, not providing the second accumulation layer 64 and the third accumulation layer 66, the trade-off between the on-voltage and the turn-off loss can be improved. However, when only the first accumulation layer 62 is provided, di/dt during the turn-on period is increased as compared to the case where the first accumulation layer 62, the second accumulation layer 64 and the third accumulation layer 66 are provided. However, when the gate resistance is increased to suppress the increase of di/dt to deal with this, the turn-on loss is increased.

The waveform 101 shows the collector current Ic in the case where the first accumulation layer 62 and the third accumulation layer 66 are provided, while the second accumulation layer 64 is not provided. Since the third accumulation layer is provided in a position away from the base region 14, a capacitance between gate and collector is increased. For this reason, the di/dt of the collector current Ic is reduced during the turn-on period. Accordingly, while the trade-off between the on-voltage and the turn-off loss is improved, the turn-on loss can be reduced.

The waveform 102 shows the collector current Ic in the case where the first accumulation layer 62, the second accumulation layer 64 and the third accumulation layer 66 are provided. By providing the second accumulation layer 64, the capacitance between gate and collector is further increased. For this reason, while the trade-off between the on-voltage and the turn-off loss is improved, the turn-on loss can be further reduced.

Figure 7:
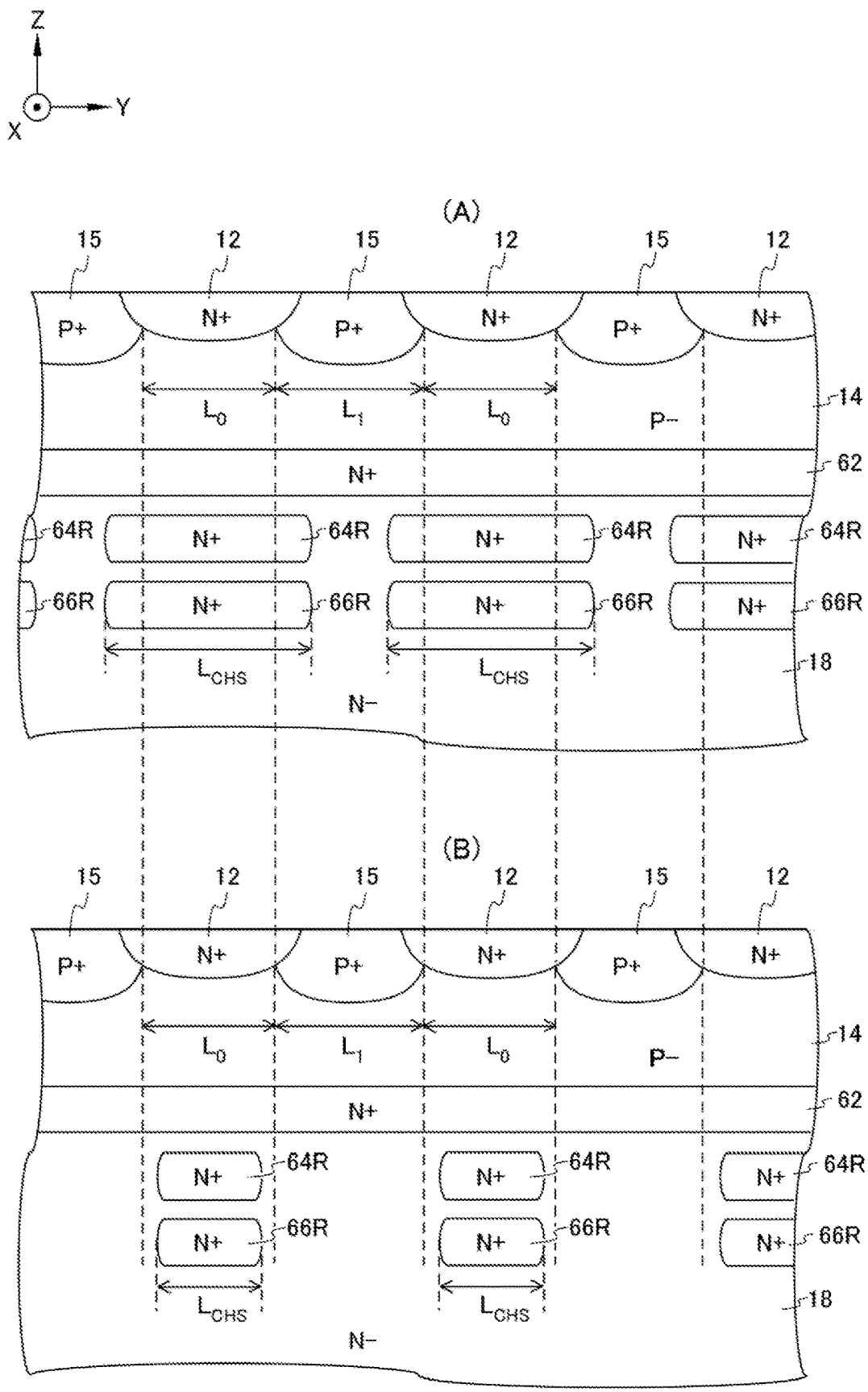
FIG. 7 includes views, shown as (A) and (B), showing a YZ plane of FIG. 2.

FIG. 7 includes views, shown as (A) and (B), showing a YZ plane of FIG. 2. (A) and (B) of FIG. 7 are different in a relationship between the length $L_0$ of the bottom region of the emitter region 12 in the extending direction of the trench section and a length of $L_{CHS}$ of each of the plurality of accumulation regions in that extending direction. Note that inside the semiconductor substrate 10, the bottom region of the emitter region 12 of the present example is the region that is not in direct contact with the contact region 15, and is in direct contact with the base region 14.

Also, in the present example, inside the semiconductor substrate 10, the region that is not in direct contact with the emitter region 12, and is in direct contact with the base region 14 is defined as the bottom region of the contact region 15. In the present example, the length in the Y-axis direction of the bottom region of the contact region 15 is denoted as $L_1$. Note that in one example, $L_0=1.1$ [µm], and $L_1=1.7$ [µm]; however, the values of $L_0$ and $L_1$ may be of course modified variously according to a design and a specification.

In (A) of FIG. 7, the length $L_{CHS}$ of the accumulation region is longer than the length $L_0$ of the bottom region. That is, in the direction from the lower surface 94 to the upper surface 92, the second accumulation region 64R and the third accumulation region 66R cover the emitter region 12. In the example of (A) of FIG. 7, $L_{CHS}/L_0$ is larger than 1. As $L_{CHS}/L_0$ is larger, the carriers are easy to be accumulated, so that Von can be smaller.

On the other hand, in (B) of FIG. 7, the length $L_{CHS}$ of the accumulation region is shorter than the length $L_0$ of the bottom region. That is, in the depth direction from the lower surface 94 to the upper surface 92, the emitter region 12 covers the second accumulation region 64R and the third accumulation region 66R. In the example of (B) of FIG. 7, $L_{CHS}/L_0$ is smaller than 1. As $L_{CHS}/L_0$ is smaller, the carriers are easy to be discharged to the contact region 15, so that Eoff can be smaller. Note that as shown in FIG. 7, the end portion in the extending direction (Y direction) of the second accumulation region 64R and the third accumulation region 66R may be formed in a curve such as sphere. As mentioned above, the second accumulation layer 64 and the third accumulation layer 66 are formed by selective ion implantation of an n type dopant. In this ion implantation, a doping concentration distribution of the end portion to be masked by a resist mask follows a Gaussian distribution. For this reason, the end portion to be masked by the resist mask can have a curved surface, and is not rectangular.

Figure 8:
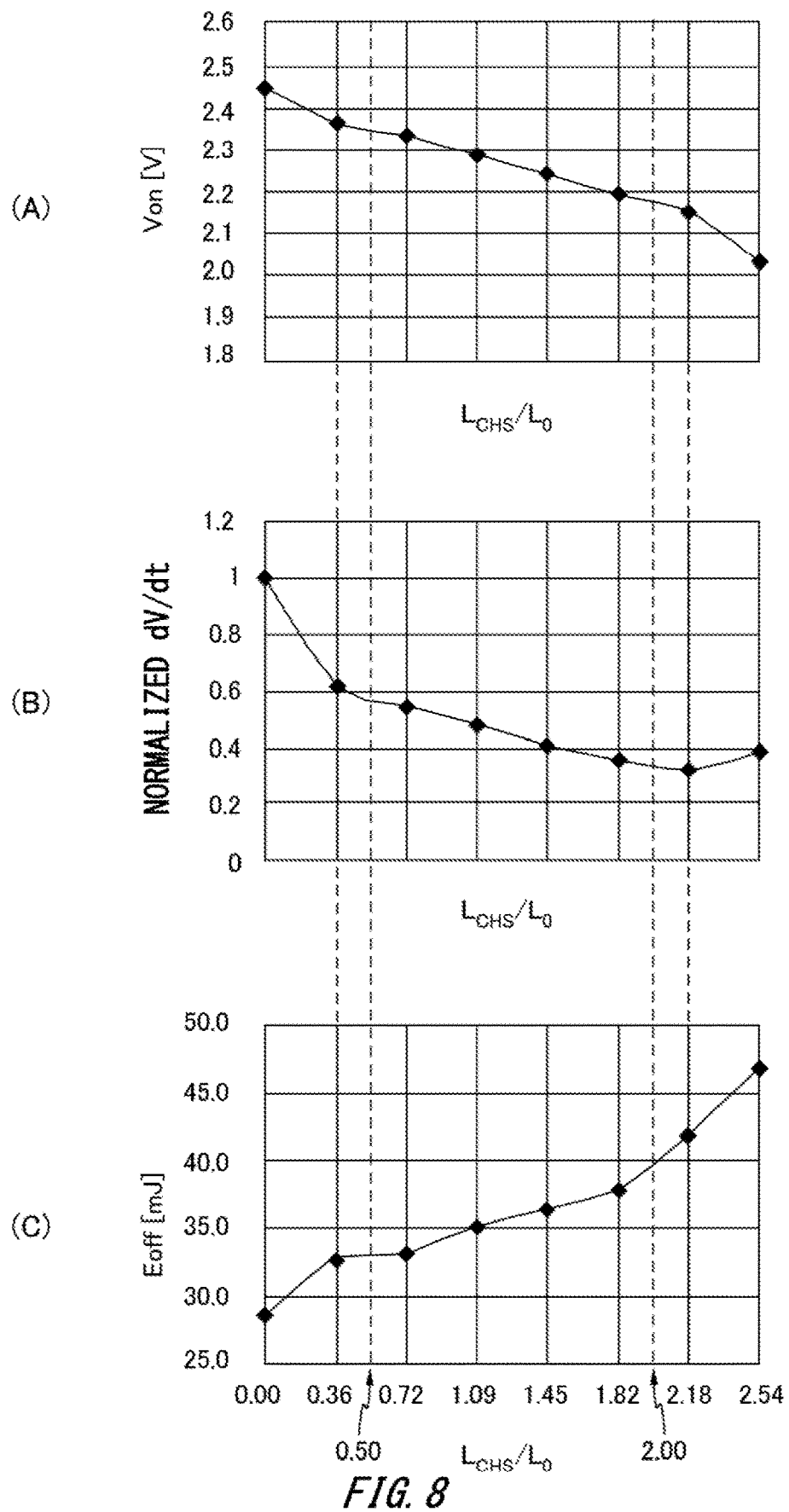
FIG. 8 includes a simulation result, shown as (A), showing Von with respect to $L_{CHS}/L_0$, a simulation result, shown as (B), showing dV/dt with respect to $L_{CHS}/L_0$, and a simulation result, shown as (C), showing Eoff with respect to $L_{CHS}/L_0$.

(A) of FIG. 8 is a simulation result showing Von with respect to $L_{CHS}/L_0$. (B) of FIG. 8 is a simulation result showing dV/dt with respect to $L_{CHS}/L_0$. (C) of FIG. 8 is a simulation result showing Eoff with respect to $L_{CHS}/L_0$. The horizontal axes shown in (A), (B) and (C) of FIG. 8 are in common with each other and are $L_{CHS}/L_0$. The vertical axis in (A) of FIG. 8 represents Von [V]. The vertical axis in (B) of FIG. 8 represents the values of dV/dt normalized by the respective values of dV/dt in the case of $L_{CHS}$=0 (i.e., the aforementioned Comparative Example 1). The vertical axis in (C) of FIG. 8 represents Eoff [mJ].

Note that the value of $L_{CHS}/L_0$=0 corresponds to that of the aforementioned Comparative Example 1, and the value of $L_{CHS}/L_0$=2.55 corresponds to that of the aforementioned Comparative Example 2. A value between the above two values corresponds to the aforementioned present example. As shown in (A) of FIG. 8, as $L_{CHS}/L_0$ is larger, Von is smaller. This is apparent from the fact that as $L_{CHS}/L_0$ is increased, the area of the accumulation region in one accumulation layer is larger.

As shown in (B) of FIG. 8, dV/dt is the highest in $L_{CHS}/L_0$=0. This is considered to be due to the aforementioned displacement current. On the other hand, as $L_{CHS}/L_0$ is larger, dV/dt is smaller. However, it is slightly raised at $L_{CHS}/L_0$=2.55. dV/dt at $L_{CHS}/L_0$=2.55 is approximately the same as dV/dt at $L_{CHS}/L_0$=1.82. That is, as in the present example, it is quantitatively apparent that dV/dt can be smaller when at least one layer of the accumulation layer separated immediately below the contact region 15 is provided, as compared to that of Comparative Example 2.

In addition, as shown in (C) of FIG. 8, as $L_{CHS}/L_0$ is smaller, Eoff is smaller. This is because as $L_{CHS}/L_0$ is smaller, the accumulation effect of the carriers is weaker, and thus the tail current during a turn-off period is reduced, Accordingly, reducing the loss during the turn-off period.

$L_{CHS}/L_0$ of the present example may be 0.36 or more, and may also be 0.4 or more. Also, $L_{CHS}/L_0$ may be 2.5 or less, and may also be 2.2 or less. Note that $L_{CHS}/L_0$ may also be set to a value smaller than $\{1+(L_1/L_0)\}$. In one example, $L_{CHS}/L_0$ may satisfy an expression: $0.5 \leq L_{CHS}/L_0 \leq 2$. Accordingly, as compared to Comparative Example 1, Von and dV/dt can be reduced, and as compared to Comparative Example 2, Eoff can be reduced.

Further, $L_{CHS}/L_0$ may satisfy an expression: $1.45 < L_{CHS}/L_0 < 2.54$, and may satisfy an expression: $1.82 \leq L_{CHS}/L_0 < 2.54$. Accordingly, in addition to a superiority of Von and dV/dt as compared to Comparative Example 1, and a superiority of Eoff as compared to Comparative Example 2, dV/dt can also be reduced as compared to Comparative Example 2.

Figure 9:
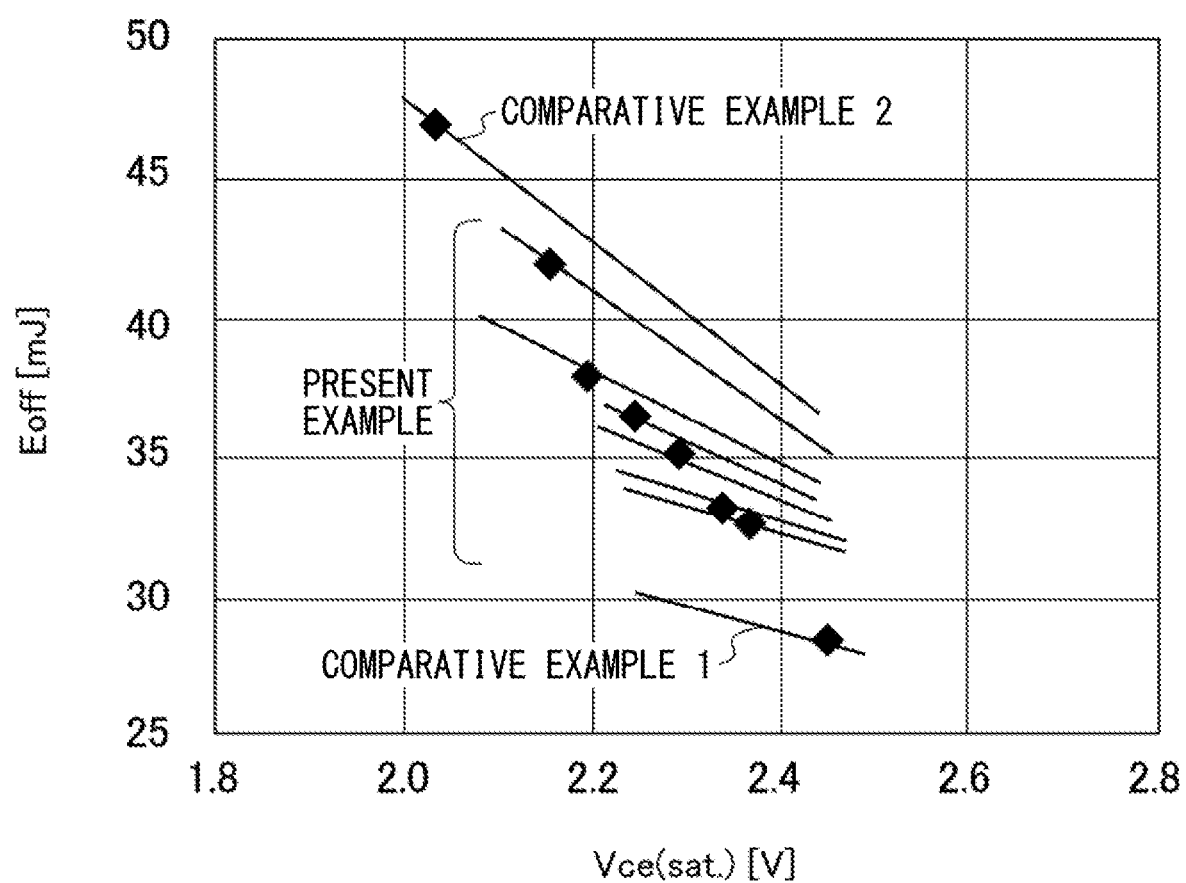
FIG. 9 is a simulation result showing Eoff with respect to Vce.

FIG. 9 is a simulation result showing Eoff with respect to Vce. The horizontal axis represents a saturation voltage between collector and emitter Vce (sat.) [V] during a period in which the IGBT is turned on. The vertical axis represents Eoff [mJ]. Each point in FIG. 9 corresponds to each point of (A) to (C) of FIG. 5. In FIG. 9, the dot located at the lowest point corresponds to the section of Comparative Example 1 ((A) of FIG. 5; $L_{CHS}/L_0$=0). In FIG. 9, the dot located at the highest point corresponds to the section of Comparative Example 2 ((B) of FIG. 5; $L_{CHS}/L_0$=2.54).

Six dots located between the dot corresponding to Comparative Example 1 and the dot corresponding to Comparative Example 2 corresponds to the section of the present example ((C) of FIG. 5). $L_{CHS}/L_0$ shown in FIG. 8 becomes larger in the order from bottom to top of the six dots of the present example. Note that in each example, a line segment that passes through each dot represents a calculated value of Eoff where Vce (sat.) is changed by changing the concentration of the collector layer 22.

There is generally a relationship of trade-off between Vce (sat.) and Eoff. For example, in Comparative Example 1, Eoff is relatively lower, while Vce (sat.) is relatively higher. On the other hand, in Comparative Example 2, Vce (sat.) is relatively lower, while Eoff is relatively higher. In the present example, by properly reducing the Vce(sat.) and the Eoff, trade-off between the Vce(sat.) and the Eoff can be improved.

Figure 10:
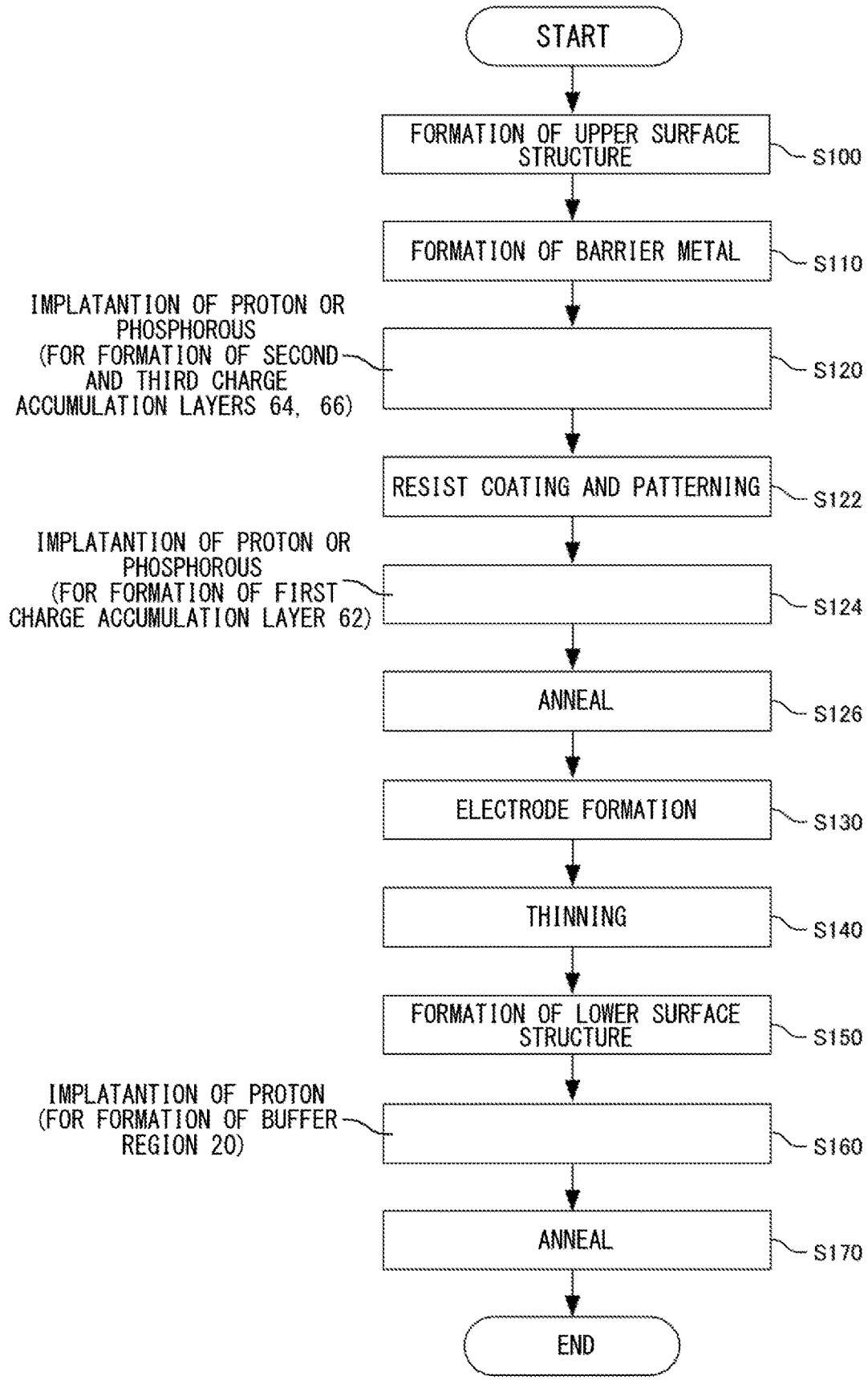
FIG. 10 is a flowchart showing one example of a manufacturing method of the semiconductor device 100.

FIG. 10 is a flowchart showing one example of a manufacturing method of the semiconductor device 100. First, in Step S100, an upper surface structure in the vicinity of the upper surface 92 of the semiconductor substrate 10 is formed. In Step S100, a dopant-implantation-region formation stage that forms the emitter region 12 and the base region 14 is included. The base region 14 may be formed by implantation of a dopant such as phosphorous. Also, in Step S100, a trench-section formation stage that forms each trench section is included after the dopant-implantation-region formation stage. Also, in Step S100, an interlayer dielectric film formation stage that forms the interlayer dielectric film 38 to cover each trench section is included.

Then, in Step S110, a barrier metal is formed on the entire upper area of the semiconductor substrate 10 and the interlayer dielectric film 38. Then, in Step S120, the second accumulation layer 64 and the third accumulation layer 66 are formed by implantation of proton or phosphorous from the upper surface 92 of the semiconductor substrate 10. In Step S120, protons are implanted by a plurality of times at different ranges for implanting protons. A part of the implanted protons is turned into donors, so that the second accumulation layer 64 and the third accumulation layer 66 are formed. In this case, hydrogen as a dopant is included in the second accumulation layer 64 and the third accumulation layer 66. Also, in step S120, protons may be implanted from the lower surface 94 of the semiconductor substrate 10.

Protons can be implanted to a deep position more easily as compared to phosphorus ions or the like, and also has a small variation in the implanted position. By using protons, the accumulation layer can be formed more easily as compared to the case by use of phosphorous. Also, since a peak of the doping concentration distribution of the accumulation layer can be steeply formed, an accumulation layer having a narrow depth width can be easily formed. Also, by implanting protons from the upper surface 92 of the semiconductor substrate 10 after formation of the barrier metal, that protons or hydrogen comes to get out of the upper surface 92 of the semiconductor substrate 10 can be suppressed.

Then, in Step S122, a resist is coated on the upper surface 92 of the semiconductor substrate 10, and that resist is patterned in a predetermined shape. Then, in Step S124, in order to form the first accumulation layer 62, protons or phosphorous is implanted in the semiconductor substrate 10. In the present example, protons are implanted. Then, in Step S126, in the case of phosphorous, an annealing process is performed at a temperature from about 800 degrees C. to about 1000 degrees C., and in the case of protons, the annealing process is performed at a temperature from about 350 degrees C. to about 450 degrees C. to Accordingly, activate phosphorous or protons. In the present example, the annealing process is performed at the temperature in the range corresponding to protons.

Then, in Step S130, the emitter electrode 52 is formed. The emitter electrode 52 may be formed by sputtering. In the sputtering, the temperature of the semiconductor substrate 10 may be set from about 350 degrees C. to about 450 degrees C. Then, the annealing process after the proton implantation is omitted, and in the formation of the emitter electrode 52, protons may be activated instead. Note that Step S120 and Step S130 may be exchanged in the order. By implanting protons after the formation of the emitter electrode 52, that protons get out of the upper surface of the semiconductor substrate 10 can be further suppressed. Also, after the emitter electrode 52 is formed, a helium ion or an electron beam may be irradiated on the semiconductor substrate 10 to adjust a carrier life time.

Then, in Step S140, the surface on the opposite side of the semiconductor substrate 10 to the upper surface 92 is grinded to adjust the thickness of the semiconductor substrate 10. The thickness of the semiconductor substrate 10 is set according to a breakdown voltage to be involved in the semiconductor device 100.

Then, in Step S150, a lower surface structure in the vicinity of the lower surface 94 of the semiconductor substrate 10 is formed. The lower surface structure is, for example, the collector layer 22. Then, in Step S160, protons are implanted from the lower surface 94 of the semiconductor substrate 10 to form the buffer layer 20. Then, in Step S170, the semiconductor substrate 10 is annealed to activate the protons implanted in the buffer layer 20.

In the buffer layer 20, protons may be implanted by a plurality of times as the depth position is varied. Accordingly, a plurality of peaks are formed in the doping concentration distribution in the depth direction of the buffer layer 20. In the doping concentration distribution of the buffer layer 20, the peak value at the deepest position in a view from the lower surface 94 of the semiconductor substrate 10 is larger than the peak value at the second deepest position. By such a method, the semiconductor device 100 can be manufactured.

In an example of another manufacturing method, the dopant of the first accumulation layer 62 may also be phosphorous. In this case, in Step S100, the first accumulation layer 62 may be formed by implantation of the dopant. Since the first accumulation layer 62 is formed in a relatively shallow position, it can be formed with phosphorous. On the other hand, the second accumulation layer 64 and the third accumulation layer 66 are formed in a relatively deep position. By setting the dopant of the second accumulation layer 64 and the third accumulation layer 66 to be hydrogen, the second accumulation layer 64 and the third accumulation layer 66 can be readily formed, and also the width in the depth direction can be narrowed.

Also, in another manufacturing method, phosphorous may be employed as the dopant in at least one of the second accumulation layer 64 and the third accumulation layer 66. For example, the dopant of the second accumulation layer 64 closest to the first accumulation layer 62 is phosphorous. In this case, in Step S100, the dopant may be implanted in the position of the second accumulation layer 64. In Step S100, after phosphorous is implanted in the base region 14, an annealing process between 1000 degrees C. and 1200 degrees C., for example, at about 1150 degrees C., may be performed for about 3 hours.

Then, phosphorous is implanted in the positions of the first accumulation layer 62 and the third accumulation layer 66. At this time, the valence of phosphorus ions to be implanted at a deeper position may be higher. Accordingly, even when the accelerated voltage is not increased significantly, phosphorus ions can be implanted at a deep position. After the phosphorous is implanted, an annealing process is performed at a lower temperature for a shorter time as compared to the annealing process of the base region 14. The annealing process is performed between 900 degrees C. and 1100 degrees C., for example, at about 1000 degrees C. for about 30 minutes. Other steps are similar to those shown in FIG. 10.

Figure 11A:
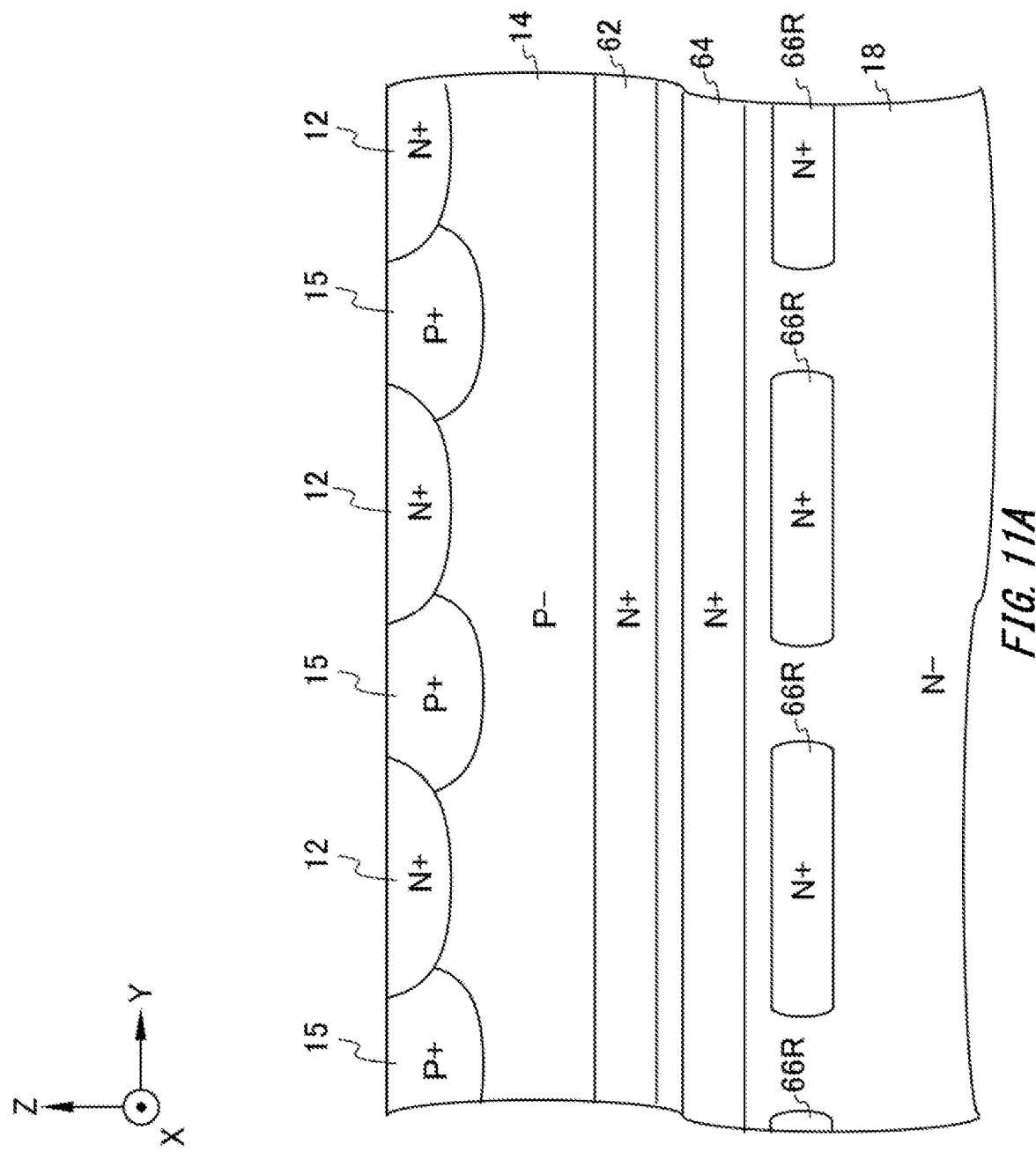
FIG. 11A is a view showing a YZ plane of FIG. 2 according to a first modification example.

FIG. 11A is a view showing a YZ plane of FIG. 2 according to a first modification example. In the present example, the second accumulation layer 64 is provided continuously in the extending direction of the trench section. The present example is different from the first embodiment in that respect.

Figure 11B:
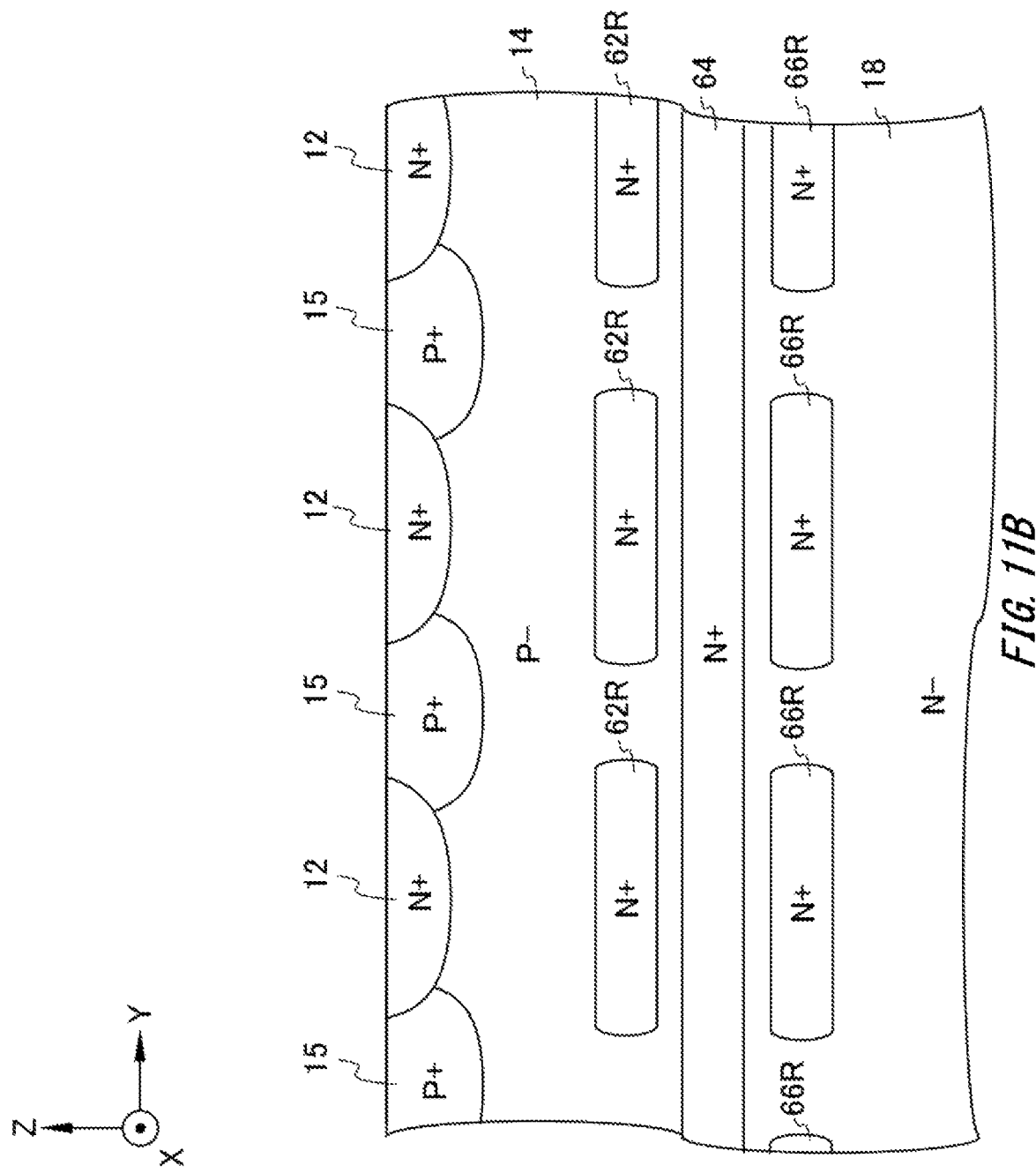
FIG. 11B is a view showing the YZ plane of FIG. 2 according to a second modification example.

FIG. 11B is a view showing the YZ plane of FIG. 2 according to a second modification example. In the present example, the first accumulation layer 62 and the third accumulation layer 66 are provided below at least a part of the emitter region 12, but not provided below at least a partial region of the contact region 15. Thus, in the present example, the first accumulation layer 62 is an island-shaped accumulation layer including a plurality of first accumulation regions 62R. Also, in the present example, the second accumulation layer 64 is provided continuously in the extending direction of the trench section. The present example is different from the first embodiment in that respect.

Figure 11C:
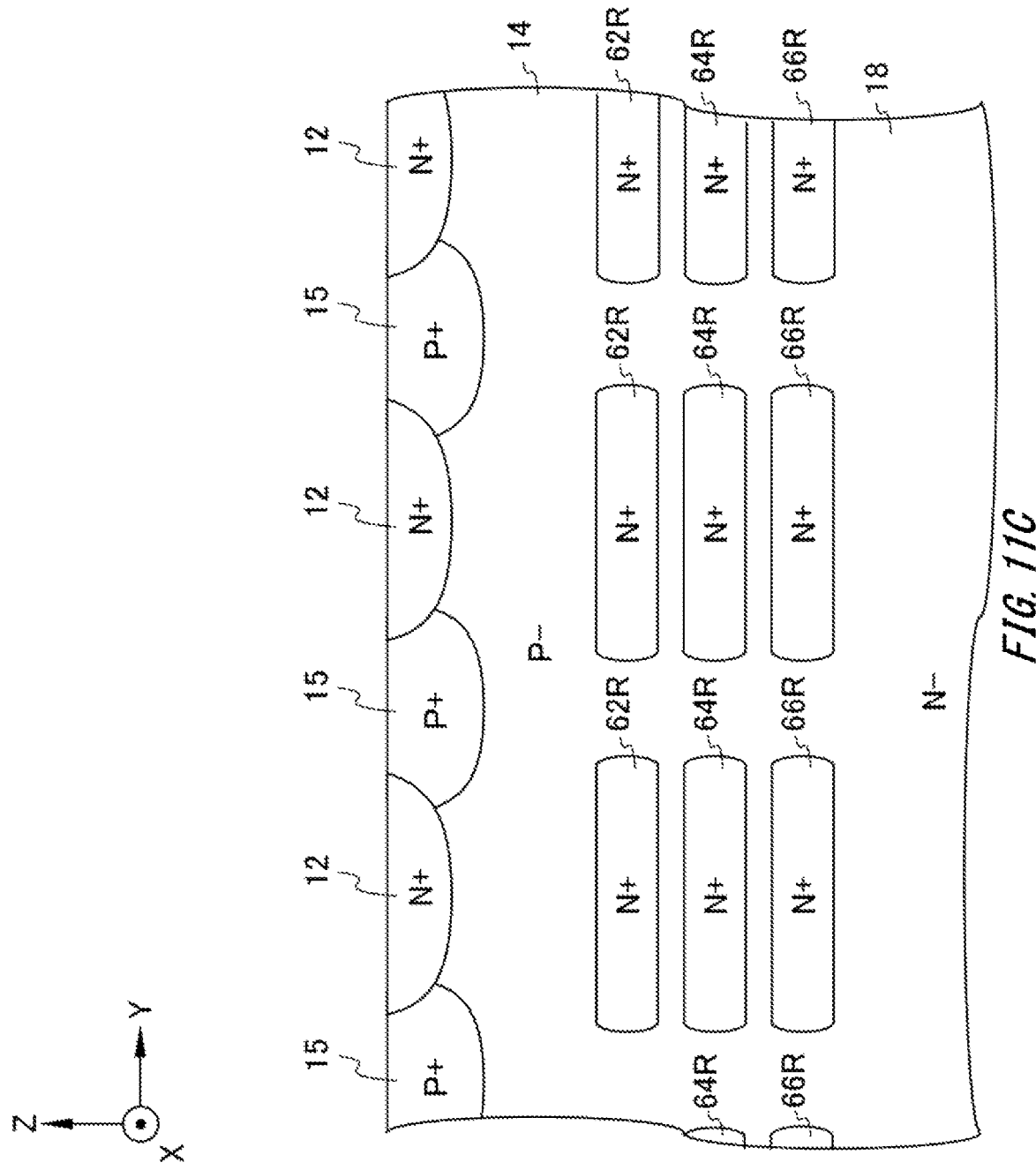
FIG. 11C is a view showing the YZ plane of FIG. 2 according to a third modification example.

FIG. 11C is a view showing the YZ plane of FIG. 2 according to a third modification example. In the present example, the first accumulation layer 62, the second accumulation layer 64 and the third accumulation layer 66 are provided below at least a part of the emitter region 12, but not provided below at least a partial region of the contact region 15. Thus, in the present example, all of the accumulation layers are island-shaped accumulation layers, each of which including a plurality of accumulation regions.

Also in the examples of FIG. 11A to FIG. 11C, the advantageous effects described in FIG. 1 to FIG. 10 can be enjoyed. Note that when each bottom region of the accumulation regions 62R, 64R and 66R has the aforementioned length of $L_{CHS}$, it may be assumed that results similar to the simulation results in the aforementioned numerical value range of $L_{CHS}/L_0$ can be obtained. Also, although in FIG. 11A to FIG. 11C, there is shown the example where the number of the accumulation layers is three, it may be applied to a case where the number of the accumulation layers is equal to or greater than three.

Figure 12:
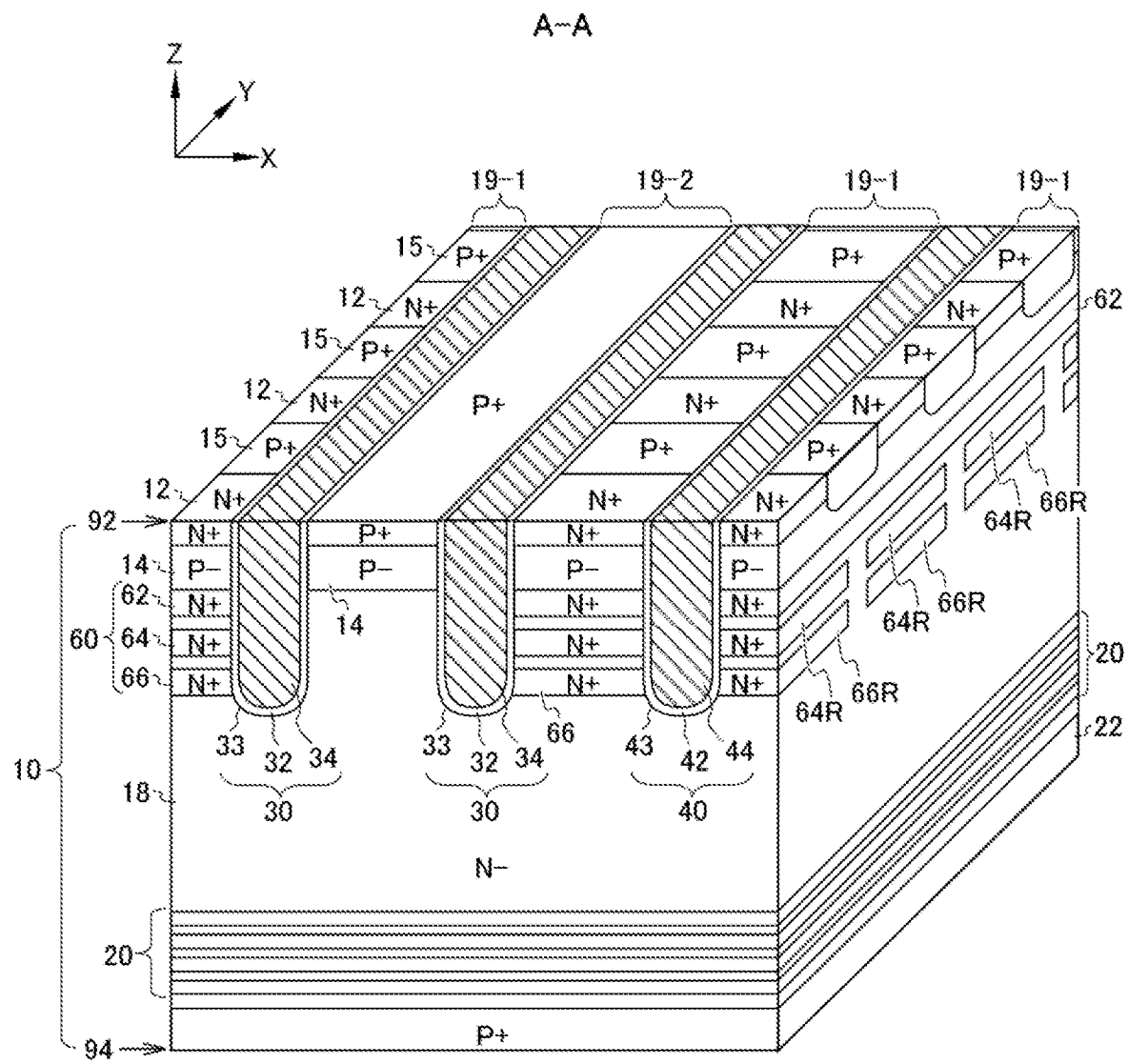
FIG. 12 is a perspective view corresponding to the section A-A of FIG. 1 according to a second embodiment.

FIG. 12 is a perspective view corresponding to the section A-A of FIG. 1 according to the second embodiment. In the present example, the accumulation layer is not provided in the mesa section 19-2 between two dummy trench sections 30 in the transistor section 70. That is, the mesa section 19-2 of the transistor section 70 in the present example is not provided with the second accumulation layer 64 and the third accumulation layer 66, and not provided with the first accumulation layer 62, either. In this manner, as compared to the first embodiment where the first accumulation layer 62 is provided in the mesa section 19-2, the carriers can be extracted even more efficiently during a turn-off period of the IGBT. Accordingly, the Eoff can be further reduced. The present example is the same as the first embodiment in other respects, and can enjoy the advantageous effects that are the same as those of the first embodiment.

Figure 13:
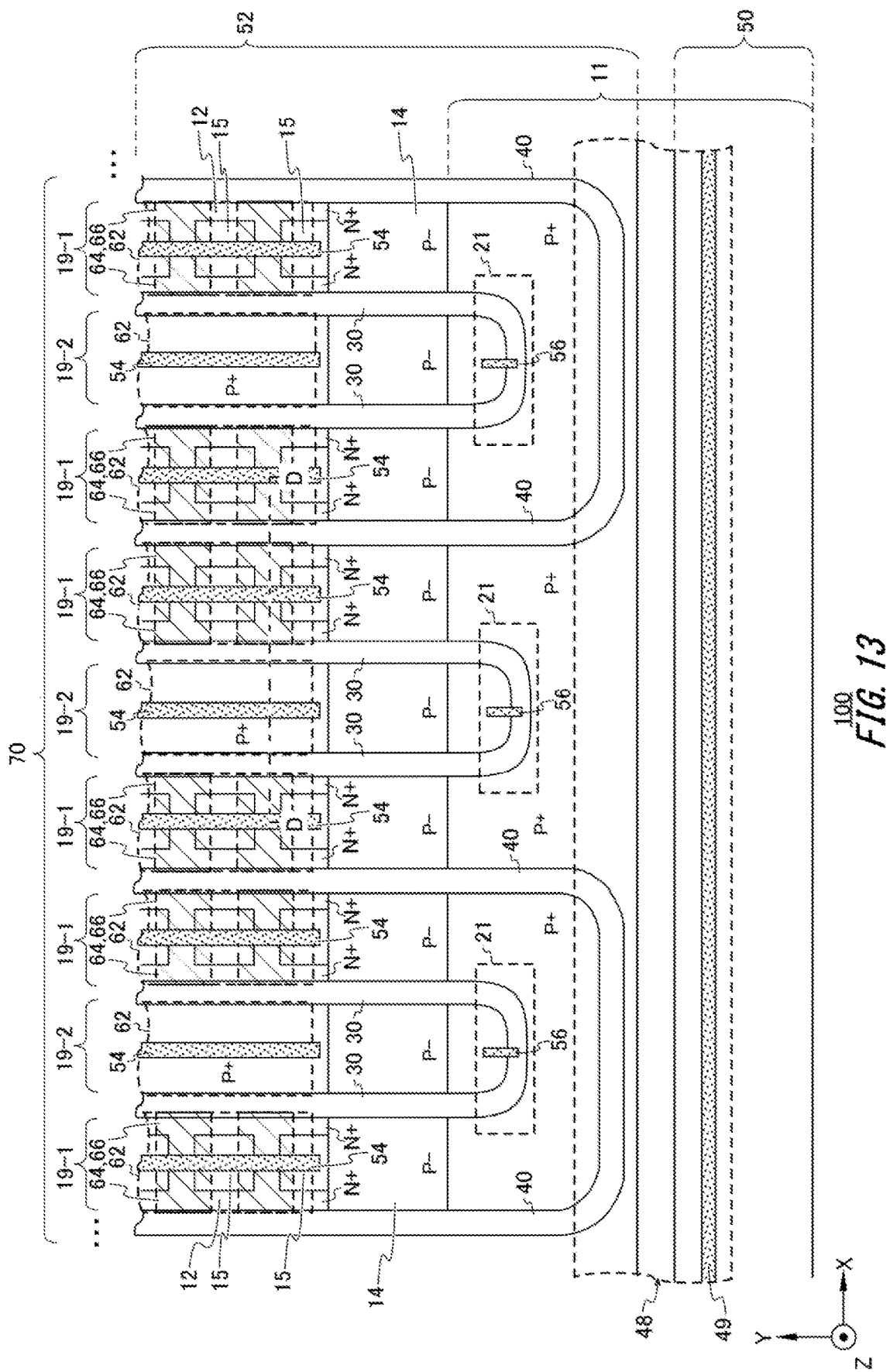
FIG. 13 is a diagram illustrating a part of an upper surface of the semiconductor device 100 according to a third embodiment.

FIG. 13 is a diagram illustrating a part of an upper surface of the semiconductor device 100 according to a third embodiment. The emitter region 12 of the present example includes a stripe-shaped portion that extends parallel to the extending direction and a portion that extends in the arrangement direction. A plurality of the portions extending in the arrangement direction are provided separately from each other at equal intervals in the extending direction. Accordingly, the plurality of contact regions 15 are provided separately from each other at equal intervals in the extending direction. The present example is different from the first embodiment in that respect, but is the same as the first embodiment in the other respects.

Figure 14:
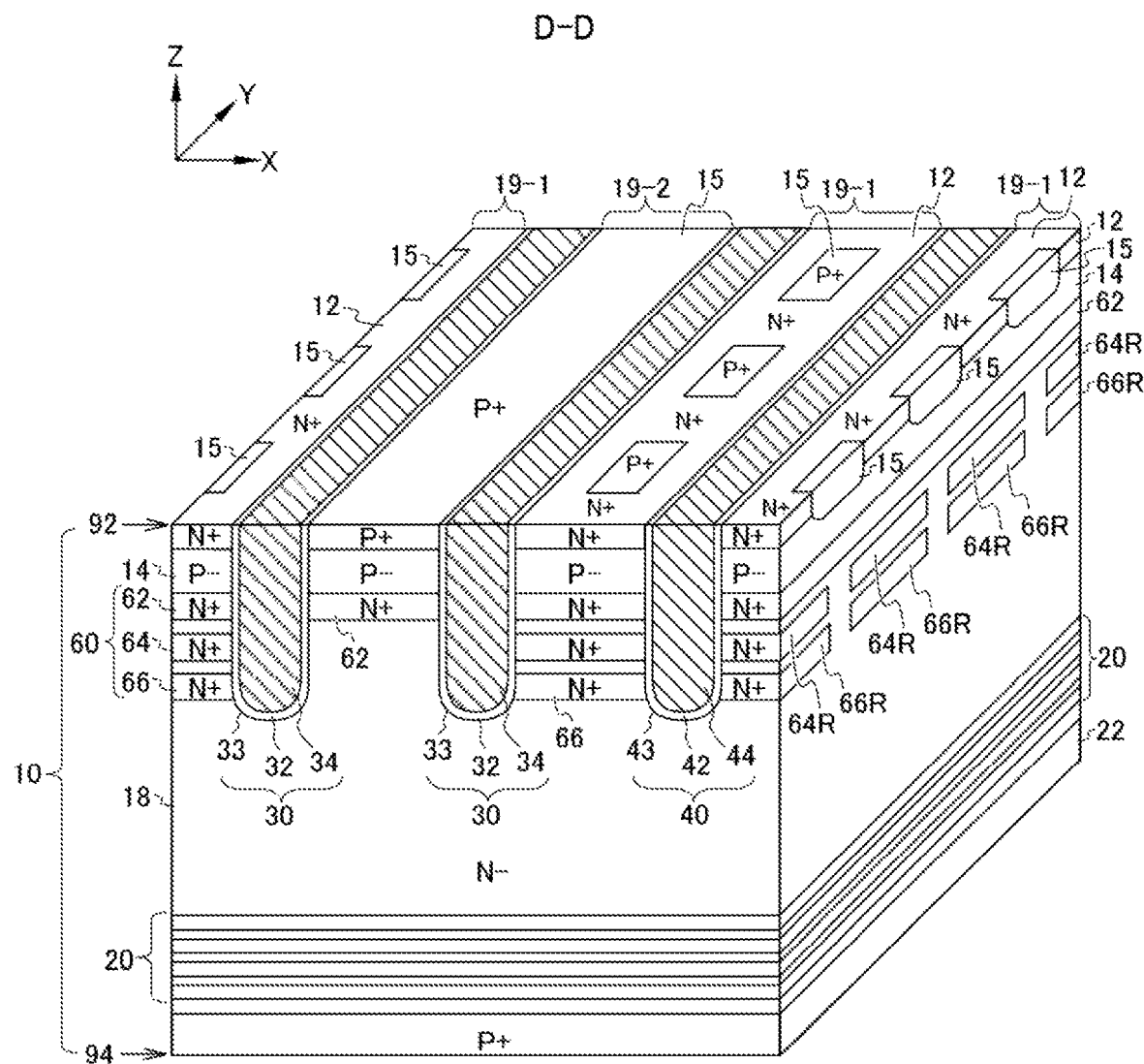
FIG. 14 is a perspective view showing one example in a section D-D according to a third embodiment.

FIG. 14 is a perspective view showing one example in a section D-D according to a third embodiment. FIG. 14 corresponds to the perspective view of FIG. 2. Also in the mesa section 19-1 of the present example, at least one accumulation layer of the multiple accumulation layers 60 is provided below at least a part of the emitter region 12, but not provided below at least a partial region of the contact region 15. Also, only the first accumulation layer 62 is provided in the mesa section 19-2. Also in that structure, the advantageous effect that is the same as that of the first embodiment can be obtained. Also, the present example may be combined with the modification examples of the first embodiment (FIG. 11A to FIG. 11C) or the second embodiment.

Figure 15A:
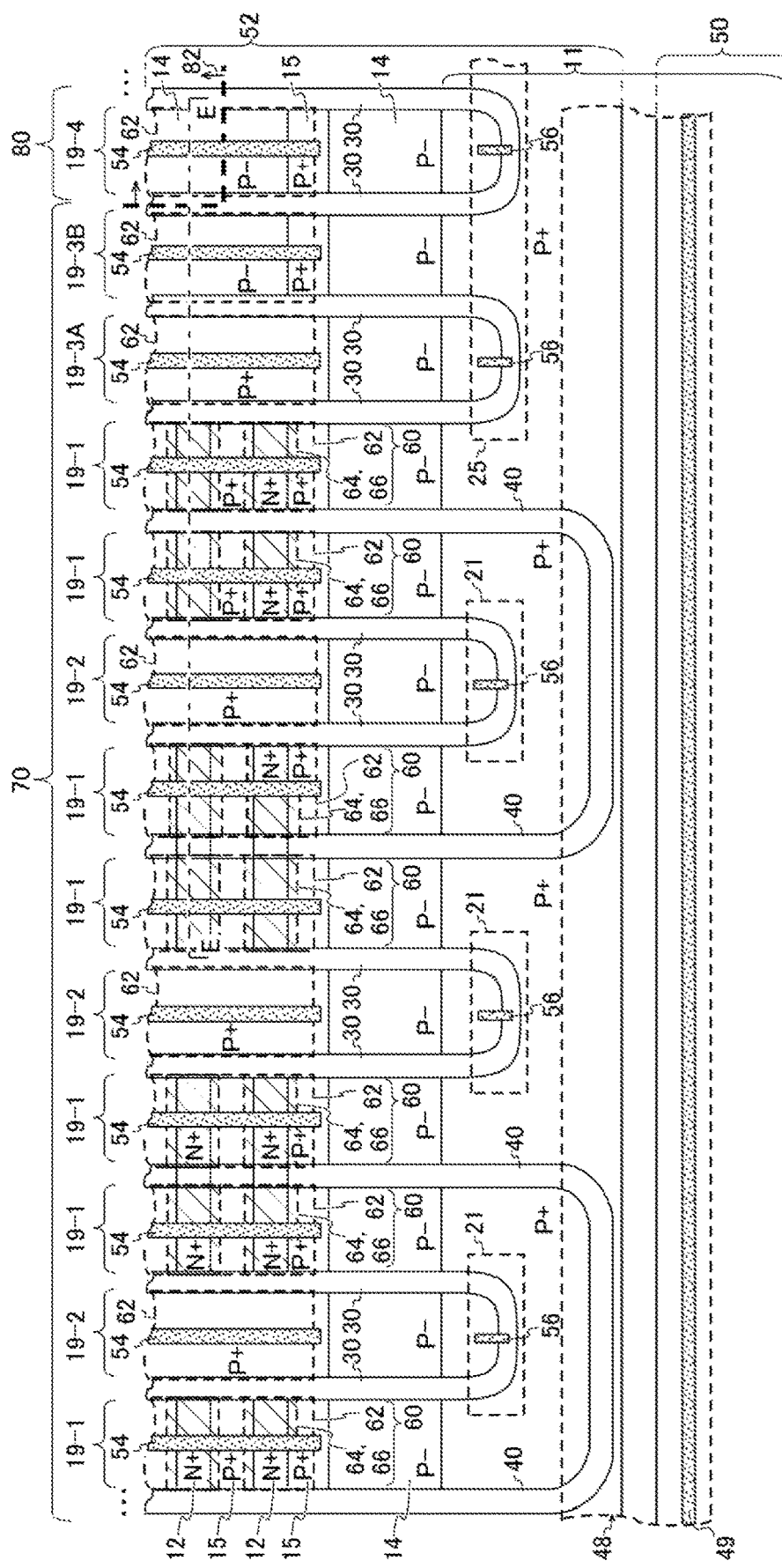
FIG. 15A is a view showing a part of an upper surface of the semiconductor device 100 according to a fourth embodiment.

FIG. 15A is a view showing a part of an upper surface of the semiconductor device 100 according to a fourth embodiment. In the present example, a diode section 80 is clearly specified. The present example is different from the first embodiment in that respect. The diode section 80 may be a region of a lower surface 94 that matches a region in which a cathode layer 82 is provided in the active region, or a virtual region in which the cathode layer 82 is projected perpendicularly on the upper surface 92 in the active region. The dummy trench section 30 of the transistor section 70 is provided in the diode section 80 of the present example.

In addition, in the transistor section 70 of the present example, a plurality of the dummy trench sections 30 is provided at a boundary with the diode section 80. A plurality of mesa section 19 may be provided in the boundary region of the transistor section 70 between the dummy trench section 30 located at the end portion on the transistor section 70 side in the diode section 80, and the gate trench section 40 located at the end portion on the diode section 80 side in the transistor section 70. That plurality of mesa sections 19 in the boundary region may include one or more boundary mesa sections 19-3. In the boundary region of the present example, the three mesa sections 19 are arranged. One of the three mesa sections 19 is a mesa section 19-1 in direct contact with the gate trench section 40, and the other two are boundary mesa sections 19-3. Note that the boundary region of the present example is one example of the boundary section that is provided in a partial region in direct contact with the diode section 80 in the transistor section 70.

The boundary mesa section 19-3 of the present example includes a boundary mesa section 19-3A that is relatively distant from the diode section 80 and a boundary mesa section 19-3B that is relatively close to the diode section 80. The boundary mesa section 19-3A of the present example has the same structure as that of the mesa section 19-2. That is, that boundary mesa section 19-3A has the contact region 15 on the base region 14 (not shown). That contact region 15 is exposed on the upper surface 92. Two trench sections that sandwich the boundary mesa section 19-3A in the X-axis direction are the dummy trench section 30. For this reason, the emitter region 12 of the mesa section 19-1 in direct contact with the boundary mesa section 19-3A is in contact with the dummy trench section 30 in the X-axis direction. On the other hand, in the boundary mesa sections 19-3B that is relatively close to the diode section 80, the base region 14 is exposed on the upper surface 92 of the semiconductor substrate 10 in the same way as the mesa section 19-4 of the diode section 80.

In the diode section 80, the contact hole 54 is provided above the contact region 15 and the base region 14. The contact hole 54 of the present example is not provided above the base region 14 closest to the gate metal layer 50, among the plurality of base regions 14 in the mesa section 19-4 of the diode section 80. In the present example, the contact hole 54 of the transistor section 70 and the contact hole 54 of the diode section 80 have the same length in the extending direction.

The mesa section 19-4 of the diode section 80 has the base region 14 of P− type that is exposed on the upper surface 92. In the upper surface 92 of the mesa section 19-4, the contact region 15 is exposed on the upper surface 92 to be sandwiched by the base regions 14 along the extending direction. Note that the mesa section 19 of the diode section 80 may have or may not have the multiple accumulation layers 60. In the present example, the mesa section 19 of the diode section 80 has the one first accumulation layer 62 in the Z-axis direction. At least one accumulation layer of the multiple accumulation layers 60 in the diode section 80 may be provided below at least a part of the contact region 15. In the present example, the accumulation layer 62 in the diode section 80 is provided below at least a part of the contact region 15. That is, the accumulation layer 62 is overlapped partially with the contact region 15 in the Z-axis direction.

Also, in the diode section 80, the length of the accumulation layer 62 in the Y-axis direction may be longer than the length of the contact region 15 in the Y-axis direction. In the present example, in the same way as the transistor section 70, the first accumulation layer 62 is provided across between the individual dummy trench sections 30, and provided to be extended in the extending direction of the trench section. On the other hand, the contact region 15 is provided only in a partial region in the vicinity of the end portion of the contact hole 54 in the negative Y-axis direction. Further, when the second accumulation layer 64 and the third accumulation layer 66 are provided, the second accumulation layer 64 and the third accumulation layer 66 may be provided across between the individual dummy trench sections 30, and provided discretely in the extending direction of the trench section. Note that although not illustrated in the drawings, a P type high concentration region that is shallower than the contact region 15 may be provided below the contact hole 54 in the vicinity of the upper surface of the base region 14. That P type high concentration region reduces the contact resistance between the base region 14 and the emitter electrode 52. In particular, in the case where the plug is formed, a reduction effect of the contact resistance is larger.

The dummy trench conductive section 34 in the dummy trench section 30 of the diode section 80 may be connected to the emitter electrode 52 via the connecting portion 25, and the contact hole 56 provided on the connecting portion 25. The connecting portion 25 may be made of the same material as that of the connecting portion 21. The contact hole 56 is the contact hole provided in the interlayer dielectric film 38.

Figure 15B:
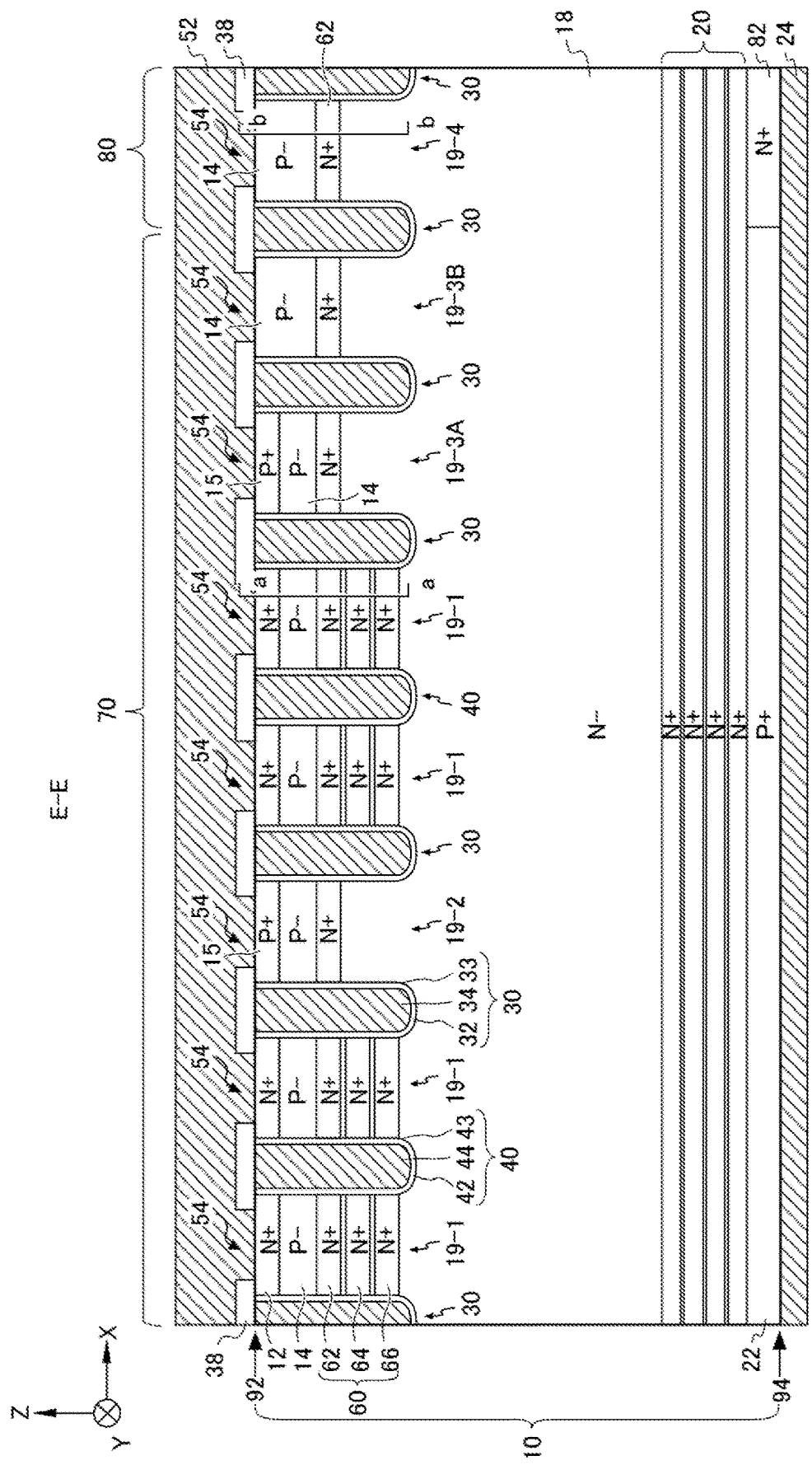
FIG. 15B is a cross-sectional view showing one example in a section E-E of FIG. 15A.

FIG. 15B is a cross-sectional view showing one example in a section E-E of FIG. 15A. The section E-E is an XZ section that penetrates the emitter region 12. In FIG. 15B, the interlayer dielectric film 38, the emitter electrode 52 and the collector electrode 24 are additionally shown.

The diode section 80 has the buffer layer 20 below the drift layer 18. The buffer layer 20 may be the layer that is common to the transistor section 70. Also, the diode section 80 has the cathode layer 82 of N+ type below the buffer layer 20. The cathode layer 82 may be the layer to be provided at the same depth position as that of the collector layer 22 of the transistor section 70. Accordingly, the diode section 80 may serve as a free wheeling diode (Free Wheeling Diode, FWD) that flows a return current conducting in the reverse direction when the transistor section 70 of another semiconductor device is turned off by a power conversion circuit such as an inverter.

The collector layer 22 to be exposed on the lower surface 94 of the semiconductor substrate 10 is provided below the boundary mesa section 19-3A and the boundary mesa section 19-3B. That collector layer 22 may be the collector layer 22 that extends from the transistor section 70. In the diode section 80, the semiconductor substrate 10 includes the cathode layer 82 to be exposed on the lower surface 94. Since the collector layer 22 is extended to the lower surface 94 of the boundary mesa section 19-3B, a distance between the emitter region 12 of the mesa section 19-1 in direct contact with the boundary mesa section 19-3A and the cathode layer 82 of the diode section 80 can be ensured. Also, as mentioned above, the emitter region 12 of that mesa section 19-1 is in contact with the dummy trench section 30 in the X-axis direction. According to the above, the electrons injected from the gate structure section of the transistor section 70 to the drift layer 18 can be prevented from being flown out to the cathode layer 82 of the diode section 80.

Further, in the present example, as compared to the case where the cathode layer 82 is provided to a portion immediately below the boundary mesa section 19-3A, a distance between the contact region 15 of the boundary mesa section 19-3A and the cathode layer 82 of the diode section 80 can also be lengthened. Accordingly, when the diode section 80 is conducted, the injection of the holes from the contact region 15, having a higher doping concentration than that of the base region 14, to the cathode layer 82 can be suppressed.

Note that the emitter region 12 and the contact region 15 of the present example may be provided in a stripe shape as shown in the second embodiment. In this case, the shape and so on of the contact hole 54 may be appropriately changed corresponding to that modification. Also, the present example may be combined with the modification examples of the first embodiment (FIG. 11A to FIG. 11C) or the third embodiment.

Figure 16:
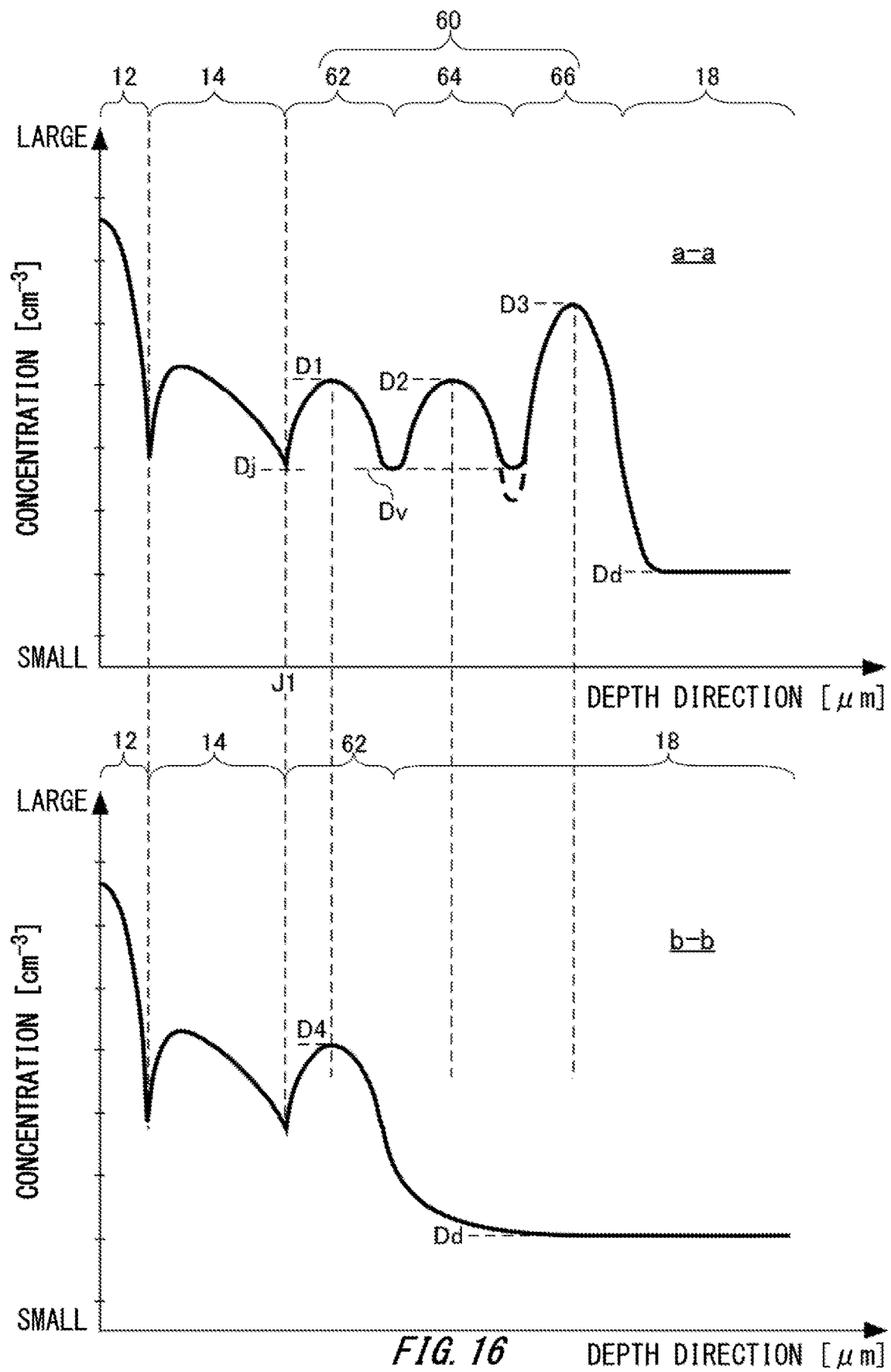
FIG. 16 is a view showing one example of doping concentration distributions in a section a-a and a section b-b of FIG. 15B.

FIG. 16 is a view showing one example of doping concentration distributions in a section a-a and a section b-b of FIG. 15B. The section a-a is the section in the mesa section 19-1 of the transistor section 70, and the section b-b is the section in the mesa section 19-4 of the diode section 80.

In each of the multiple accumulation layers 60 in the transistor section 70 and the first accumulation layer 62 in the diode section 80, the doping concentration distribution in the depth direction of the semiconductor substrate 10 has at least one peak. In the case where a plurality of the accumulation layers are formed in the depth direction of the semiconductor substrate 10, the accumulation layers include a plurality of peaks (local maximum values) in the doping concentration distribution of that depth direction, and a local minimum value in a position sandwiched between the plurality of peaks in the depth direction. In other words, the region between the plurality of local minimum values may be considered as one accumulation layer. Each of one or more accumulation layers may be formed by implantation of impurities from the upper surface 92 or the lower surface 94.

In FIG. 16, the doping concentration distribution from emitter region 12 to the vicinity of the upper end of the drift layer 18 is shown. As shown in FIG. 16, the vertical axis of a diagram showing the doping concentration is a logarithmic axis. One graduation in the vertical axis shows ten times of the concentration. In the present specification, the doping concentration refers to a concentration of dopants transformed to donors or acceptors. The doping concentration shown in FIG. 16 corresponds to a difference between concentrations of donors and acceptors.

In the example of FIG. 16, the transistor section 70 has the first accumulation layer 62, the second accumulation layer 64 and the third accumulation layer 66. The doping concentration of the first accumulation layer 62 is defined as D1, the doping concentration of the second accumulation layer 64 is defined as D2 and the doping concentration of the third accumulation layer 66 is defined as D3. The peak values may be used for the values of the doping concentrations D1 to D3 (and D4 described later).

Also, the doping concentration Dv at the boundary between the individual accumulation layers is the local minimum value of the doping concentration distribution of the accumulation layer. In the present example, the doping concentration Dv is larger than the doping concentration Dd of the drift layer 18. The doping concentration Dv may be equal to or less than one tenth of the doping concentration D1 and may be equal to or less than one hundredth of the doping concentration D1.

In the multiple accumulation layers 60, a plurality of boundaries between the individual accumulation layers may also exist. A plurality of local minimum values (Dv) of the doping concentration at the boundary between the individual accumulation layers may exist. The plurality of local minimum values (Dv) of the doping concentrations may respectively have different values. In the present example, two doping concentrations Dv have substantially the same value. The plurality of local minimum values (Dv) of the doping concentration may be reduced along the depth direction from the upper surface 92 side to the lower surface 94 side. For example, the local minimum value (Dv) (shown by a bold dashed line) of the doping concentration between the second accumulation layer 64 and the third accumulation layer 66 is smaller than the local minimum value (Dv) of the doping concentration between the first accumulation layer 62 and the second accumulation layer 64.

In a pn junction between the base region 14 and the first accumulation layer 62, the dopant concentration of the base region 14 (in the present example, an acceptor concentration) is equal to the dopant concentration of the first accumulation layer 62 (in the present example, a donor concentration). An acceptor concentration or a donor concentration is defined as Dj at a position J1 at which the acceptor concentration is equal to the donor concentration. The acceptor concentration or the donor concentration Dj at the position J1 may be lower than at least one of the local minimum values Dv in the plurality of doping concentrations. Accordingly, when the gate voltage exceeds the gate threshold and the electrons flow, because the impedance for the electrons becomes lower in the mesa section 19, the electron current can easily flow toward the central portion of the mesa section. In addition, the acceptor concentration or the donor concentration Dj at the position J1 may be higher than at least one of the local minimum values Dv in the plurality of doping concentrations. Accordingly, even when the integral concentration along the depth direction of the multiple accumulation layers 60 is excessively higher, the increase of the electric field strength during the turn-off period can be suppressed.

Each mesa section 19 of the diode section 80 of the present example has one accumulation layer (first accumulation layer 62). The doping concentration of the first accumulation layer 62 is defined as D4. However, the number of the accumulation layers formed in the depth direction in each mesa section 19 of the diode section 80 may be smaller than the number of the accumulation layers formed in the depth direction in each mesa section 19 of the transistor section 70. Accordingly, the integral concentration of one or more accumulation layers in each mesa section 19 of the diode section 80 can be readily smaller than the integral concentration of one or more accumulation layers in each mesa section 19 of the transistor section 70.

The accumulation layer of the diode section 80 may be provided in the position at the same depth as that of any accumulation layer of the transistor section 70. The depth position of each layer may be the peak position in the doping concentration distribution of that layer. In the present example, the first accumulation layer 62 of the transistor section 70 is provided at the same depth position as that of the first accumulation layer 62 of the diode section 80. Note that the same depth position may have a predetermined error. For example, even when the peak position has an error within 10% of a half-value width in a mountain-shaped doping concentration distribution including that peak, the position may be considered as the same depth position. By forming each layer at the same depth position, simplification of the manufacturing process is facilitated.

Also, the doping concentration of the accumulation layer of the diode section 80 may be equal to the doping concentration of the accumulation layer provided at the same depth in the transistor section 70. In this case, the doping concentration may be the peak value of the doping concentration in that layer. In the present example, the doping concentration D4 of the first accumulation layer 62 of the diode section 80 is equal to the doping concentration D1 of the first accumulation layer 62 of the transistor section 70. Note that the equality of the doping concentration may have a predetermined error. For example, even when the doping concentration has an error within 10%, it can be assumed as the same doping concentration.

In this manner, the depth position and the doping concentration of the accumulation layer of the diode section 80 are set to be the same as those of any accumulation layer of the transistor section 70, so that the accumulation layer of the diode section 80 can be formed in the same manufacturing process as that of the accumulation layer of the transistor section 70. For this reason, the manufacturing process can be simplified.

Of the multiple accumulation layers 60 in each mesa section 19 of the transistor section 70, the doping concentration of any accumulation layer may be higher than the doping concentration of another accumulation layer formed at a different depth position. In the transistor section 70 of the present example, the doping concentration D3 of the third accumulation layer 66 provided at the deepest position is higher than the doping concentration (D1, D2) of any other accumulation layer of the transistor section 70. The doping concentration D3 may be approximately equal to or greater than three times as much as the doping concentration D1 and equal to or less than seven times as much as the doping concentration D1. The doping concentrations D1 and D2 may be the same.

Note that in the multiple accumulation layers 60 in each mesa section 19 of the transistor section 70, the doping concentrations Dv may be lower as a deeper position with respect to the upper surface 92. With respect to the peak concentrations D1, D2 and D3, the doping concentration Dv corresponds to a valley of the doping concentration distribution. The concentration of the valley in the plurality of doping concentrations is lowered for the depth direction, so that the capacitance between gate and collector can be adjusted into a predetermined magnitude.

As one example, the peak positions of the doping concentrations of the respective accumulation layers are arranged at equal intervals in the depth direction. In another example, the peak positions of the doping concentrations of the respective accumulation layers may be arranged at unequal intervals in the depth direction. Note that the multiple accumulation layers 60 are provided in the transistor section 70, so that a transitional capacitance during the turn-on period can be increased between the gate conductive section 44 and the collector electrode 24. Accordingly, while the trade-off between the on-voltage and the turn-off loss in the transistor section 70 is improved, the turn-on loss can be reduced.

The diode section 80 may not have an accumulation layer that corresponds to the accumulation layer having the highest doping concentration among the multiple accumulation layers 60 of the transistor section 70. Accordingly, the integral concentration of the accumulation layer in the diode section 80 can be lowered sufficiently as compared to the integral concentration of the accumulation layer in the transistor section 70. The diode section 80 of the present example has the accumulation layer that is located at the same depth as that of the first accumulation layer 62 provided at the shallowest position in the transistor section 70. However, the diode section 80 of the present example does not have the accumulation layer located at the same depth as that of the second accumulation layer 64 in the transistor section 70, and the accumulation layer located at the same depth as that of the third accumulation layer 66 provided at the deepest position in the transistor section 70.

When three or more of the accumulation layers in the diode section 80 are formed, the plurality of doping concentrations Dv may become lower as the position from the upper surface 92 becomes deeper. When three or more of the accumulation layers are formed, the plurality of doping concentrations Dv may become lower as the position from the upper surface 92 becomes deeper.

Figure 17:
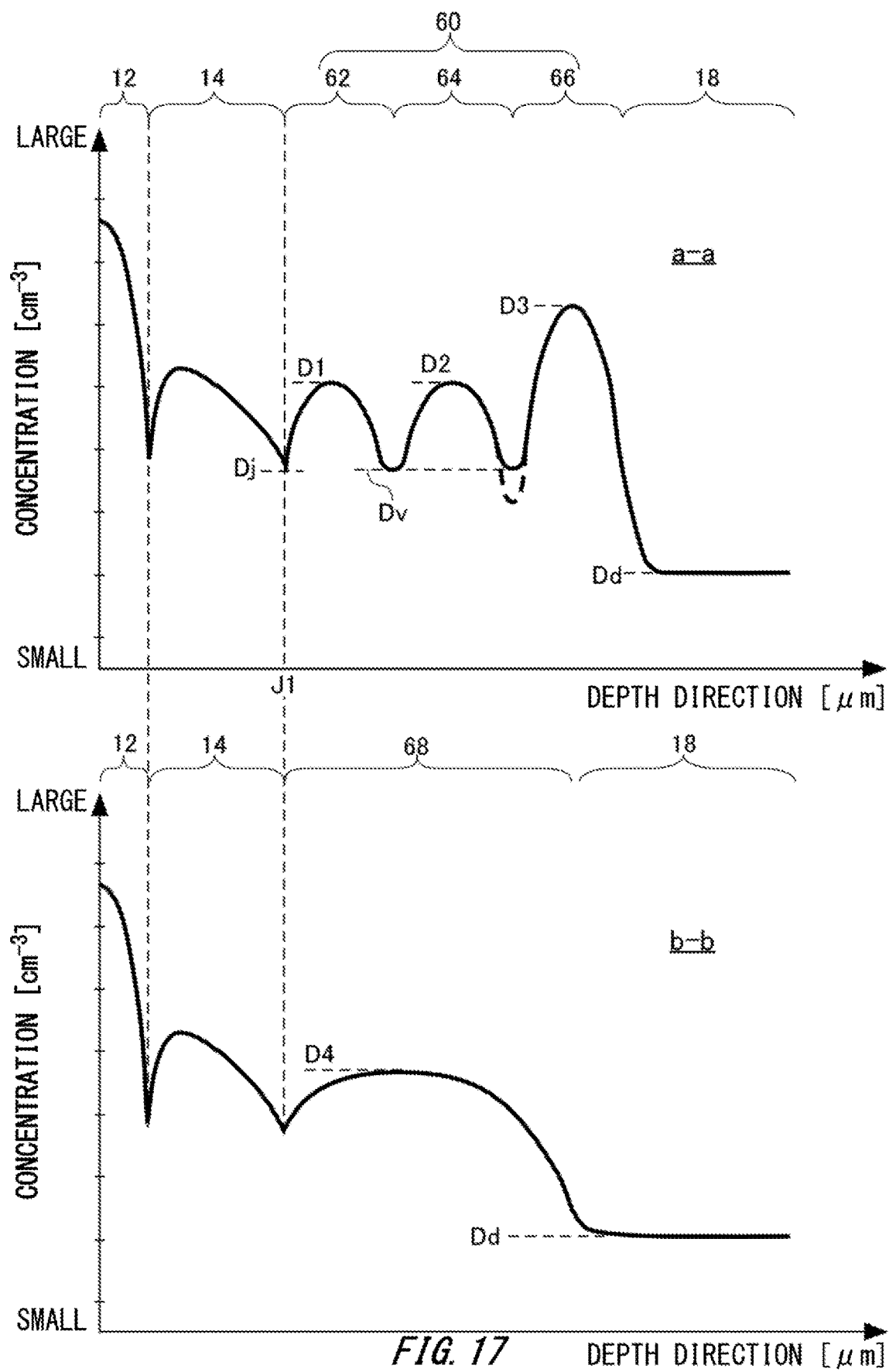
FIG. 17 is a view showing another example of the doping concentration distributions in a section a-a and a section b-b of FIG. 15B.

FIG. 17 is a view showing another example of the doping concentration distributions in a section a-a and a section b-b of FIG. 15B. In the present example, the doping concentration distribution in the transistor section 70 is the same as that of the example in FIG. 16.

The diode section 80 of the present example also has one high concentration layer 68 in each mesa section 19. That is, in a portion between the base region 14 and the drift layer 18, the doping concentration distribution of N type having a higher concentration than that of the drift layer 18 has one peak. However, the high concentration layer 68 of the present example is formed in a longer range in the depth direction than that of any accumulation layer. In the doping concentration D4 of the high concentration layer 68, the integral concentration of the high concentration layer 68 is set to be lower than the integral concentration of the one or more accumulation layers in the transistor section 70. The doping concentration D4 of the high concentration layer 68 may be lower or higher than the doping concentration D1 of the first accumulation layer 62.

Also, according to the structure of the present example, the reverse recovery characteristic can be improved while the degradation of the on-voltage-off-loss characteristics in the transistor section 70 is suppressed. In addition, with respect to a forward voltage in the diode section 80, the degradation of the trade-off between the switching loss during the reverse recovery and the on-loss can be suppressed.

Figure 18:
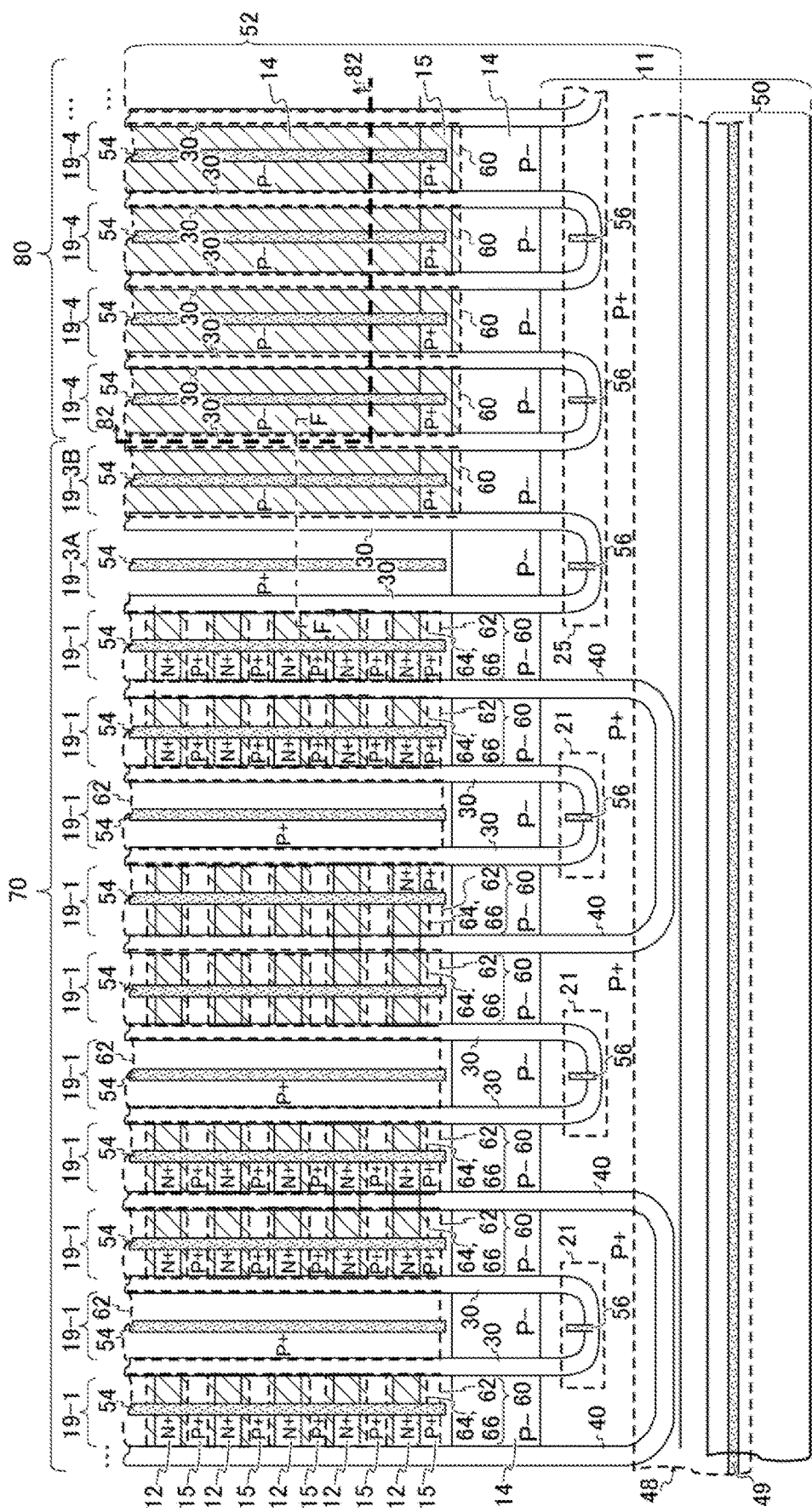
FIG. 18 is a diagram illustrating a part of an upper surface of the semiconductor device 100 according to a first modification example of a fourth embodiment.

FIG. 18 is a diagram illustrating a part of an upper surface of the semiconductor device 100 according to a first modification example of a fourth embodiment. Also in FIG. 18, similar to FIG. 1, the first accumulation layer 62 is shown by a dashed line, and the second accumulation layer 64 and third accumulation layer 66 are shown by a dashed line with hatched lines. In the present example, a difference between FIG. 15A and FIG. 15B is mainly described. In the present example, mesa sections 19-4 and the diode section 80 of the boundary mesa section 19-3B in the transistor section 70 each have the multiple accumulation layers 60. Further, the multiple accumulation layers 60 in the mesa section 19-4 and the boundary mesa section 19-3B of the present example extend to the outer side of the end portion of the contact hole 54 beyond the end portion of the contact hole 54 in the extending direction of the trench section. The end portion of the multiple accumulation layers 60 in the mesa section 19-4 and the boundary mesa section 19-3B may be located on a more outer side than a virtual region in which the cathode layer 82 is projected on the upper surface 92.

On the other hand, the end portions of the multiple accumulation layers 60 in the mesa section 19-4 and the boundary mesa section 19-3B may be located on an inner side (the side in +Y-axis direction) with respect to a position of the end in the extending direction of the trench section. Further, the end portion of the multiple accumulation layers 60 in the mesa section 19-4 and the boundary mesa section 19-3B may be located on an inner side with respect to the well region 11. The end portion of the multiple accumulation layers 60 is located inside the mesa section 19 sandwiched by the trench section, so that a field plate effect by the trench section is generated. Accordingly, an increase in electric field strength at the end portion of the multiple accumulation layers 60 can be suppressed. Note that also in the transistor section 70, the end portion of the multiple accumulation layers 60 may be located on an inner side (side in +Y-axis direction) with respect to the position of the end in the extending direction of the trench section. Further, the end portion of the multiple accumulation layers 60 in the mesa section 19-1 may be located on an inner side with respect to the well region 11. Accordingly, the increase in electric field strength at the end portion of the multiple accumulation layers 60 can be suppressed.

In the present example, each accumulation layer in the multiple accumulation layers 60 is the accumulation layer to be continuously provided, not the island-shaped accumulation layer. In the present example, since the multiple accumulation layers 60 are provided in the mesa section 19-4 of the diode section 80, the injection of the holes from the base region 14 that serves as the anode region to the drift layer 18 can be suppressed.

That is, in the present example, as compared to the case where the multiple accumulation layers 60 are not provided in the diode section 80, an injection efficiency of minority carriers are remarkably reduced. As the number of the accumulation layers in the diode section 80 is larger, the injection efficiency of the minority carriers can be reduced. Further, in the present example, since the multiple accumulation layers 60 are also provided in the boundary mesa section 19-3B of the transistor section 70, the injection of the holes from the anode region to the drift layer 18 can be further suppressed. By reducing the injection efficiency of the minority carriers, the reverse recovery characteristic, especially the recover current, of the diode section 80 can be reduced. Note that the multiple accumulation layers 60 in the diode section 80 may be replaced with multiple high concentration layers in the diode section 80. One or more high concentration layers provided in the diode section 80 are not necessarily provided at the same depth position and the same doping concentration as those of the accumulation layer provided in the transistor section 70.

Figure 19:
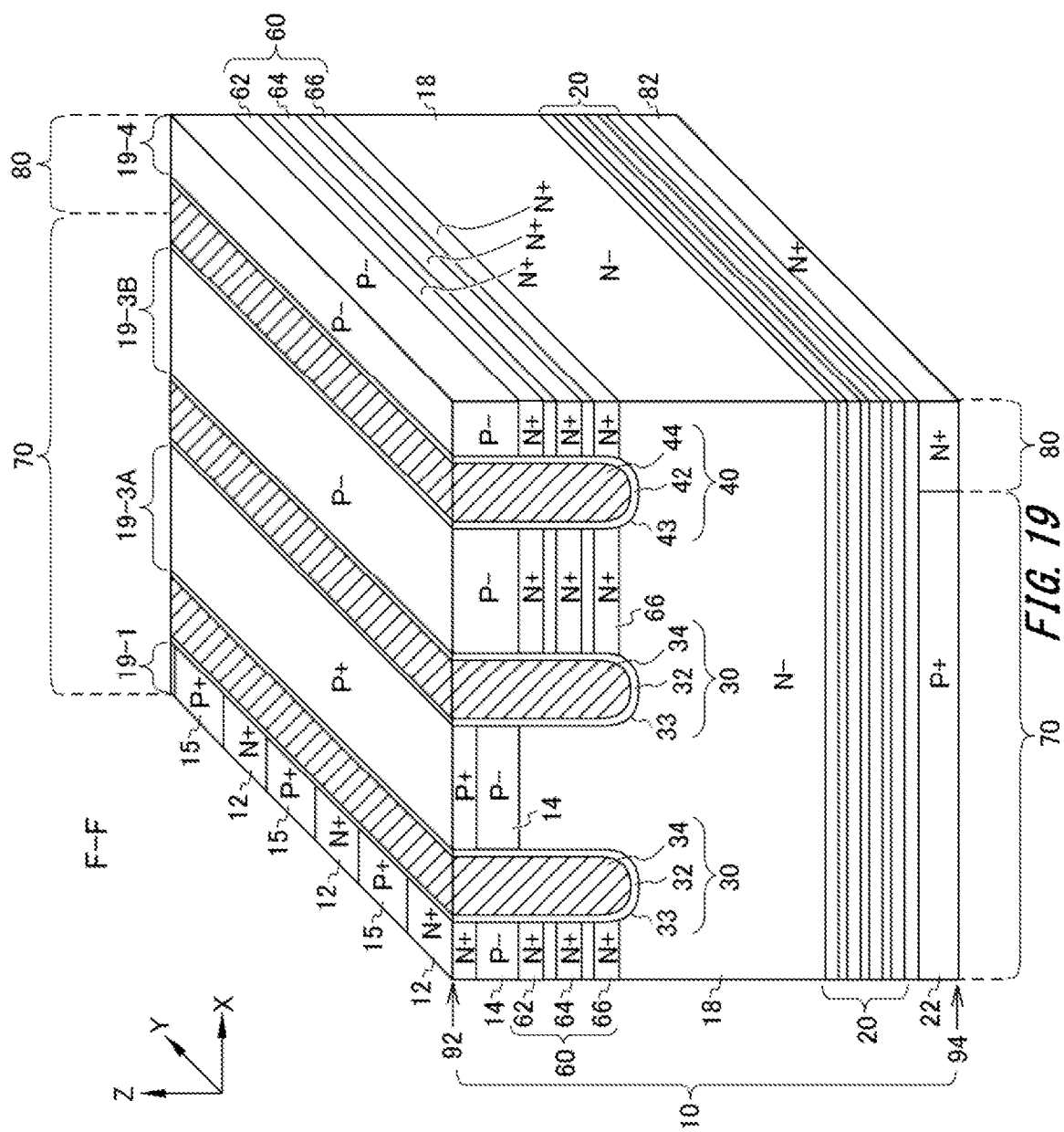
FIG. 19 is a view showing a perspective view in a section F-F of FIG. 18.

FIG. 19 is a view showing a perspective view in a section F-F of FIG. 18. The section F-F penetrates the mesa sections 19-1 that are adjacent in the X-axis direction, as well as the boundary mesa sections 19-3A and 19-3B, in the transistor section 70, and the mesa section 19-4 of the diode section 80 in direct contact with the transistor section 70 in the X-axis direction.

Figure 20:
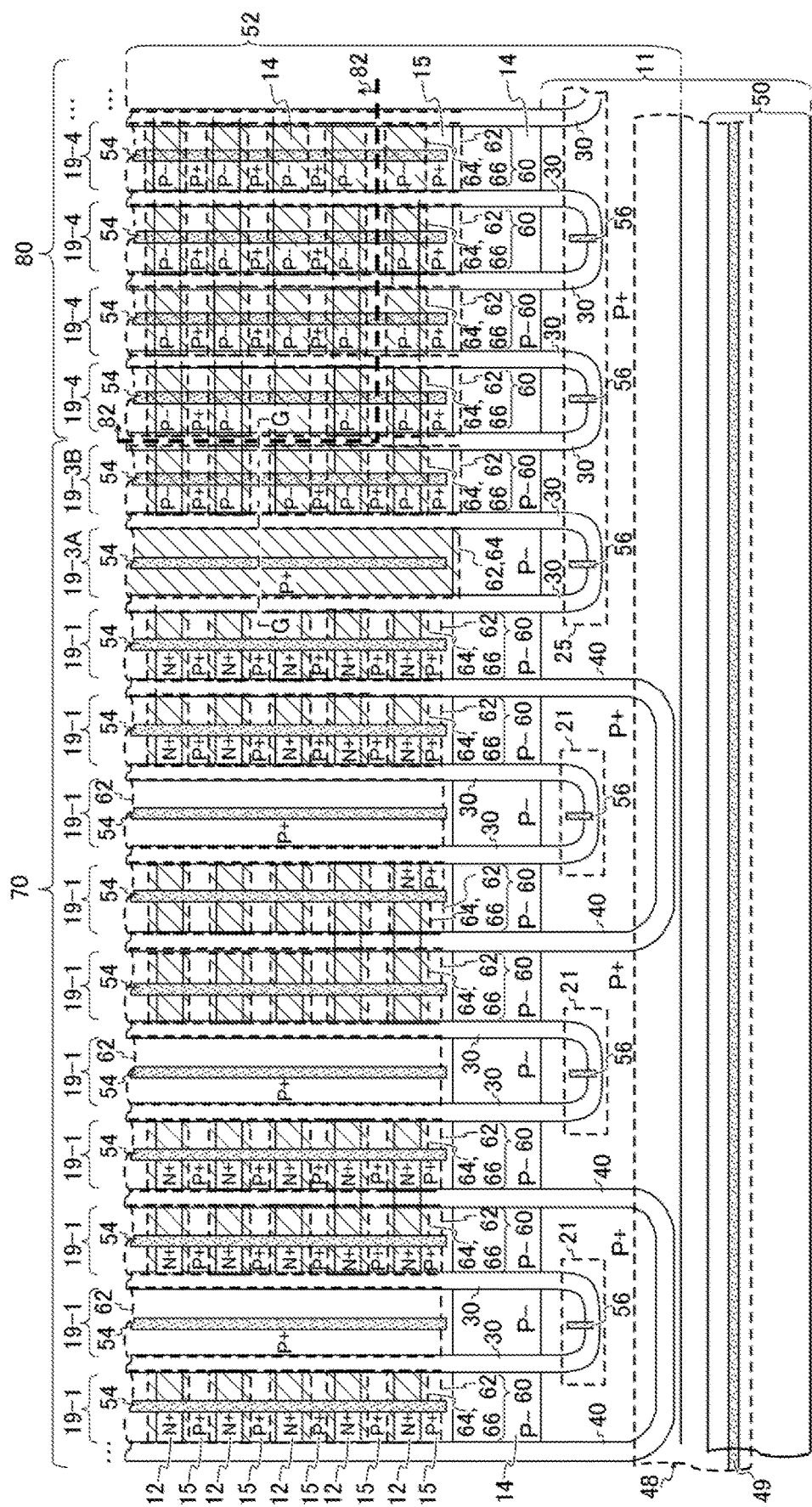
FIG. 20 is a diagram illustrating a part of an upper surface of the semiconductor device 100 according to a second modification example of the fourth embodiment.

FIG. 20 is a diagram illustrating a part of an upper surface of the semiconductor device 100 according to a second modification example of the fourth embodiment. A difference from the example of FIG. 18 is mainly described. The boundary mesa section 19-3B in the transistor section 70 of the present example and the mesa section 19-4 in the diode section 80 are provided separated from each other in the extending direction of the trench section, each having the contact region 15 of P+ type that is exposed on the upper surface 92. In the diode section 80 of the present example, the base region 14 is exposed on the upper surface 92 between the plurality of contact regions 15.

In the present example, the boundary mesa section 19-3B in the transistor section 70 and the mesa sections 19-4 of the diode section 80 each have the multiple accumulation layers 60. Note that the first accumulation layer 62 is the accumulation layer that is continuously provided, and the second accumulation layer 64 and the third accumulation layer 66 each are the island-shaped accumulation layer. In the island-shaped accumulation layer of the second accumulation layer 64 and the third accumulation layer 66, the accumulation region is provided in the lower portion of the contact region 15; however, the accumulation region is not provided in the lower portion of the portion in which the contact region 15 is not provided and the base region 14 is exposed on the upper surface 92. That is, the respective island-shaped accumulation layers in the second accumulation layer 64 and the third accumulation layer 66 are separated from each other in the lower portion of the base region 14 that is exposed on the upper surface 92. In the present example, the lower portion of the base region 14 that is exposed on the upper surface 92 may be referred to as a separation portion of the island-shaped accumulation layer. In the diode section 80 of the present example, the injection of excessive holes from the contact region 15 can be suppressed by the first accumulation layer 62. In addition, at the reverse recovery time in the diode section 80 of the present example, the holes can be flown onto the upper surface 92 through the separation portion of the island-shaped accumulation layer.

In the present example, the end portion in the arrangement direction (X-axis direction) of the virtual region in which the cathode layer 82 is projected on the upper surface 92 is located in the dummy trench section 30. In addition, in the present example, the end portion in the extending direction (Y-axis direction) of the trench section, in the virtual region in which the cathode layer 82 is projected on the upper surface 92, is located in the multiple accumulation layers 60 that are not the separation portion.

The boundary mesa section 19-3A may have one or more accumulation layers. One or more accumulation layers in the boundary mesa section 19-3A may be continuously provided in the extending direction of the trench section. That is, one or more accumulation layers in the boundary mesa section 19-3A are not the island-shaped accumulation layers, and therefore have no separation portion. The boundary mesa section 19-3A of the present example has the first accumulation layer 62 and the second accumulation layer 64 that are continuously provided in the Y-axis direction. However, the multiple accumulation layers 60 in the boundary mesa section 19-3B of the present example have the structure similar to that of the multiple accumulation layers 60 in the diode section 80. That is, the second accumulation layer 64 and the third accumulation layer 66 in the boundary mesa section 19-3B of the present example each have the separation portion.

In the boundary mesa sections 19-3A and 19-3B, the end portion in the Y-axis direction, in the virtual region in which the multiple accumulation layers 60 are projected on the upper surface 92, is located on a more outer side than the end portion of the contact hole 54 in the Y-axis direction. In the boundary mesa sections 19-3A and 19-3B of the present example, the end portion in the Y-axis direction, in the virtual region in which the multiple accumulation layers 60 are projected on the upper surface 92, is located on a more outer side than the contact region 15 (that is, located on the most outer side) closest to the connecting portion 25 in the Y-axis direction. Accordingly, the injection of excessive holes from the contact region 15 to the drift layer 18 can be suppressed. Since the boundary mesa section 19-3A has a larger area of the contact region 15 as compared to another mesa section 19, in the present example in which the separation portion is not provided in the multiple accumulation layers 60 of the boundary mesa section 19-3A, the suppression effect for the hole injection is particularly larger.

Figure 21:
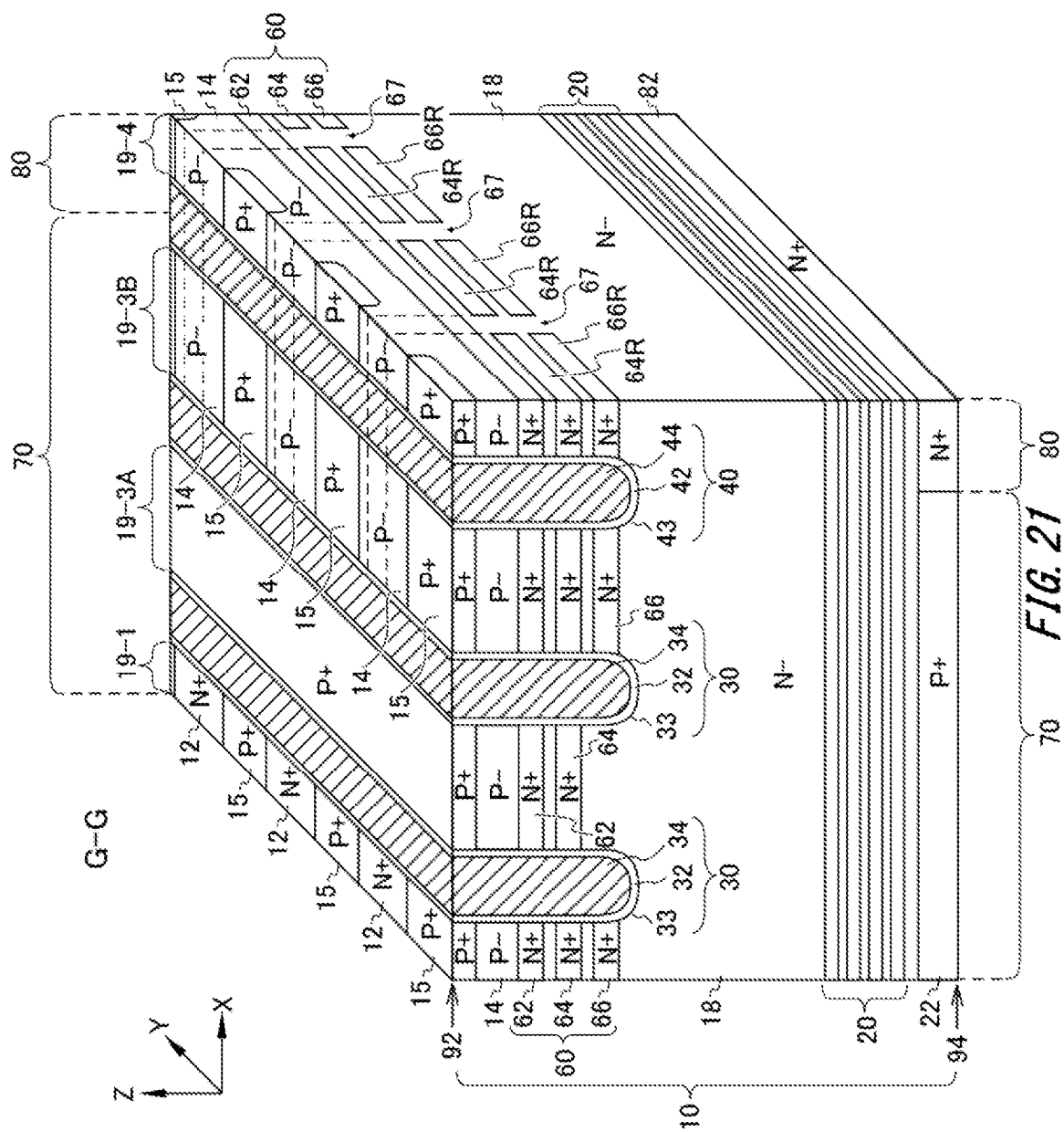
FIG. 21 is a perspective view showing a perspective view in a section G-G of FIG. 20.

FIG. 21 is a perspective view showing a perspective view in a section G-G of FIG. 20. The section G-G penetrates the adjacent mesa sections 19-1 in the X-axis direction, as well as the boundary mesa sections 19-3A and 19-3B, in the transistor section 70, and the mesa section 19-4 of the diode section 80 in direct contact with the transistor section 70 in the X-axis direction. In FIG. 21, the separation portion 67 of the diode section 80 is shown by an arrow. In addition, a dashed line is added to the end portion in the Y-axis direction of the separation portion 67, and that dashed line is also shown on the upper surface 92 in addition to the YZ section.

The number of the accumulation layers in the boundary mesa section 19-3A of the present example is smaller than the number of the accumulation layers in the transistor section 70, and smaller than the number of the accumulation layers in the diode section 80. Accordingly, during a turn-off period of the transistor section 70, as compared to the case where three of the accumulation layers are provided in the boundary mesa section 19-3A, while the holes are pulled out more readily, the injection of the holes from the boundary mesa section 19-3A can also be suppressed to some extent.

Figure 22:
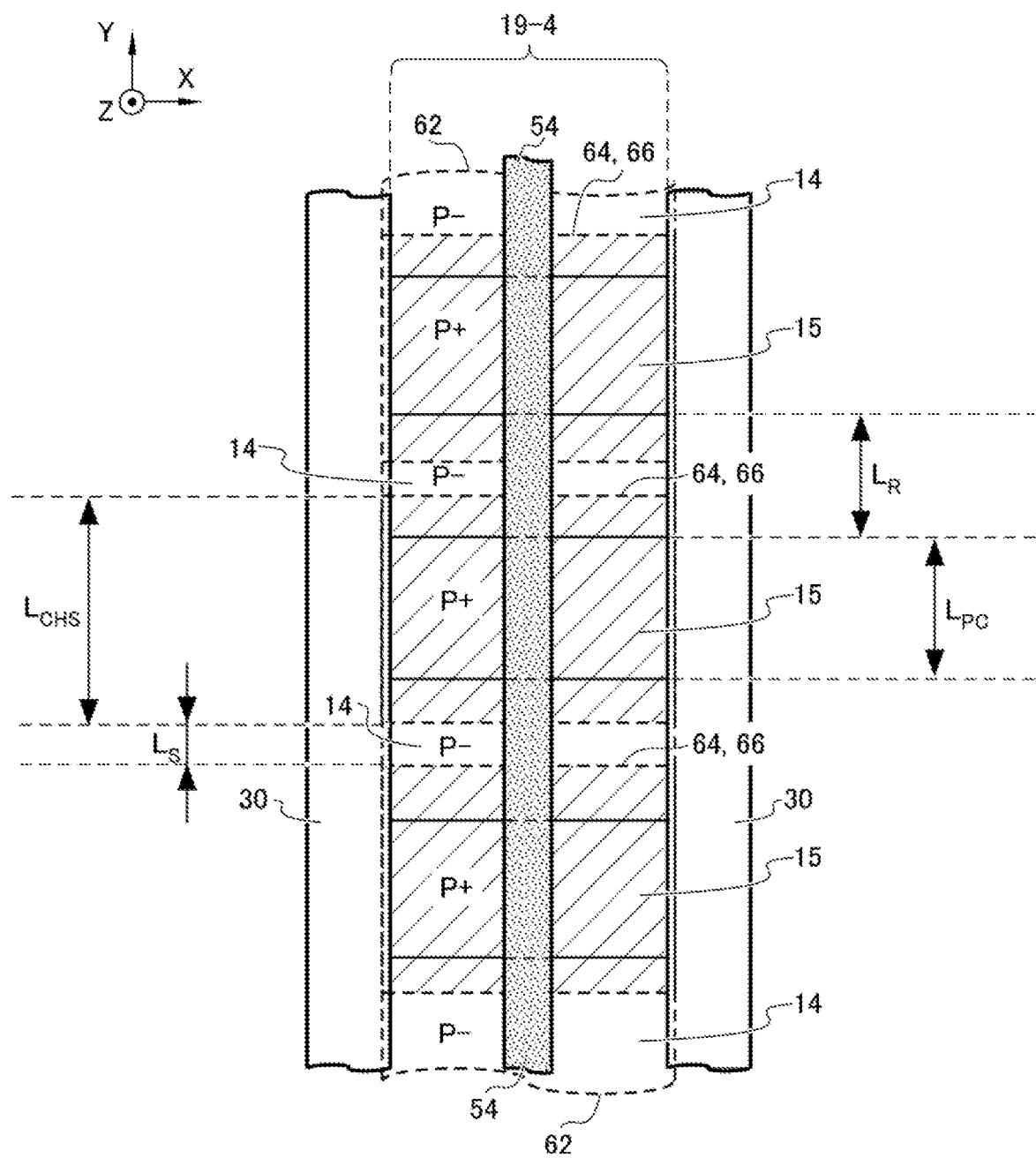
FIG. 22 is a view showing a part of a mesa section 19-4 in a diode section 80 of FIG. 20.

FIG. 22 is a view showing a part of a mesa section 19-4 in a diode section 80 of FIG. 20. In the present example, the length of the contact region 15 in the Y-axis direction is defined as $L_{PC}$, and the length between the adjacent contact regions 15 in the Y-axis direction is defined as $L_R$ (that is, the length in the Y-axis direction of the base region 14). In addition, in the present example, the length of the second accumulation region 64R of the second accumulation layer 64 and of the third accumulation region 66R of the third accumulation layer 66 in the Y-axis direction is defined as $L_{CHS}$. Note that when the lengths of the accumulation regions at different depth positions in the Y-axis direction are different, the length in the Y-axis direction of the accumulation region in which the length in the Y-axis direction is maximum may be defined as $L_{CHS}$.

Also, in the present example, the length between the adjacent accumulation regions in the Y-axis direction (that is, the length of the separation portion 67 in the Y-axis direction) is defined as $L_S$. Note that when the lengths of the accumulation regions at different depth positions in the Y-axis direction are different, the length in the Y-axis direction between the accumulation regions in which the length in the Y-axis direction is minimum may be defined as $L_S$. In the present example, $L_{CHS}$ is larger than $L_{PC}$, and $L_S$ is smaller than $L_R$. Also, $L_R$ may be larger than $L_{PC}$. Accordingly, the injection of excessive holes from the contact region 15 can be prevented.

Figure 23:
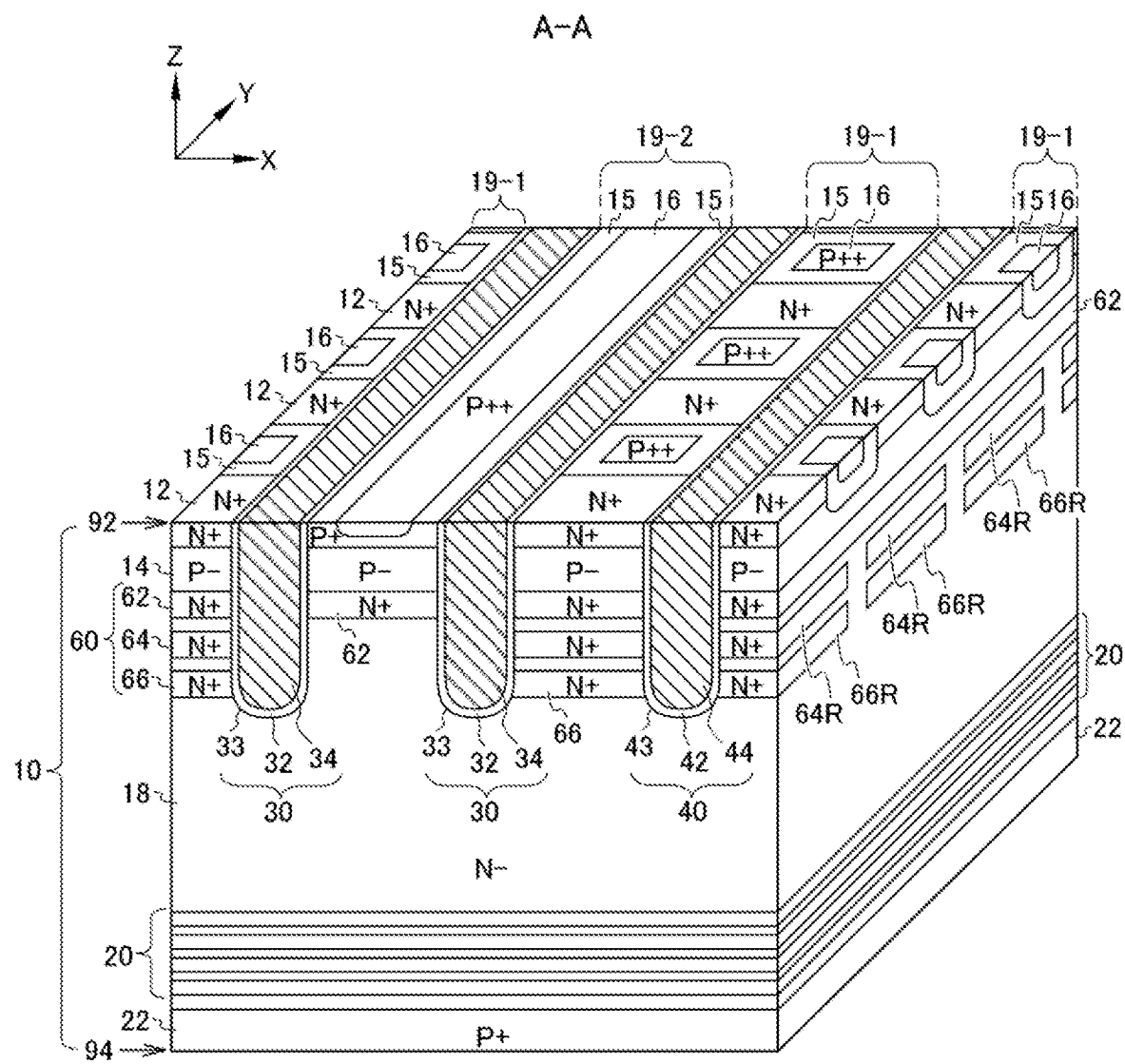
FIG. 23 is a perspective view corresponding to the section A-A of FIG. 1 according to a fifth embodiment.

FIG. 23 is a perspective view corresponding to the section A-A of FIG. 1 according to a fifth embodiment. The mesa section 19 of the present example further has a high concentration contact region 16. The present example is different from the first embodiment mainly in that respect. In the present example, the doping concentration of the second conductivity in the high concentration contact region 16 is higher than that of the contact region 15. For example, the high concentration contact region 16 is of P++ type. However, in the connection interface between the lower portion of the high concentration contact region 16 and the upper portion of the contact region 15, the doping concentrations of the two may be the same as each other. The average doping concentration of the high concentration contact region 16 in the depth direction may be higher than the average doping concentration of the contact region 15 in the depth direction. Also, the doping concentration in the middle of the high concentration contact region 16 in the depth direction may be higher than the doping concentration in the middle of the contact region 15 in the depth direction. Note that the doping concentration of the contact region 15 may mean the doping concentration of a portion in which the high concentration contact region 16 is eliminated from the contact region 15.

In an upper surface view, each mesa section 19 may have the high concentration contact region 16 of P++ type on an inner side with respect to the contact region 15 of P+ type. The mesa section 19-1 of the present example has the high concentration contact regions 16 discretely in the Y-axis direction corresponding to the arrangement of the contact regions 15. In the mesa section 19-1, the contact region 15 may surround the perimeter of the high concentration contact region 16 in the X-axis direction and the Y-axis direction. On the other hand, the mesa section 19-2 of the present example has the high concentration contact regions 16 that extends parallel to the Y-axis direction corresponding to the arrangement of the contact regions 15.

However, also in the mesa section 19-2, the contact region 15 may surround the perimeter of the high concentration contact region 16 in the X-axis direction and the Y-axis direction.

The side portion of the high concentration contact region 16 of the present example is in contact with the contact region 15 without being in contact with the side portion of the trench section. Also, the lower portion of the high concentration contact region 16 of the present example is shallower than the bottom portion of the contact region 15. The lower portion of the high concentration contact region 16 of the present example is in contact with the contact region 15. Similar to the contact region 15, the upper portion of the high concentration contact region 16 of the present example is located on the upper surface 92 of the semiconductor substrate 10.

Figure 24:
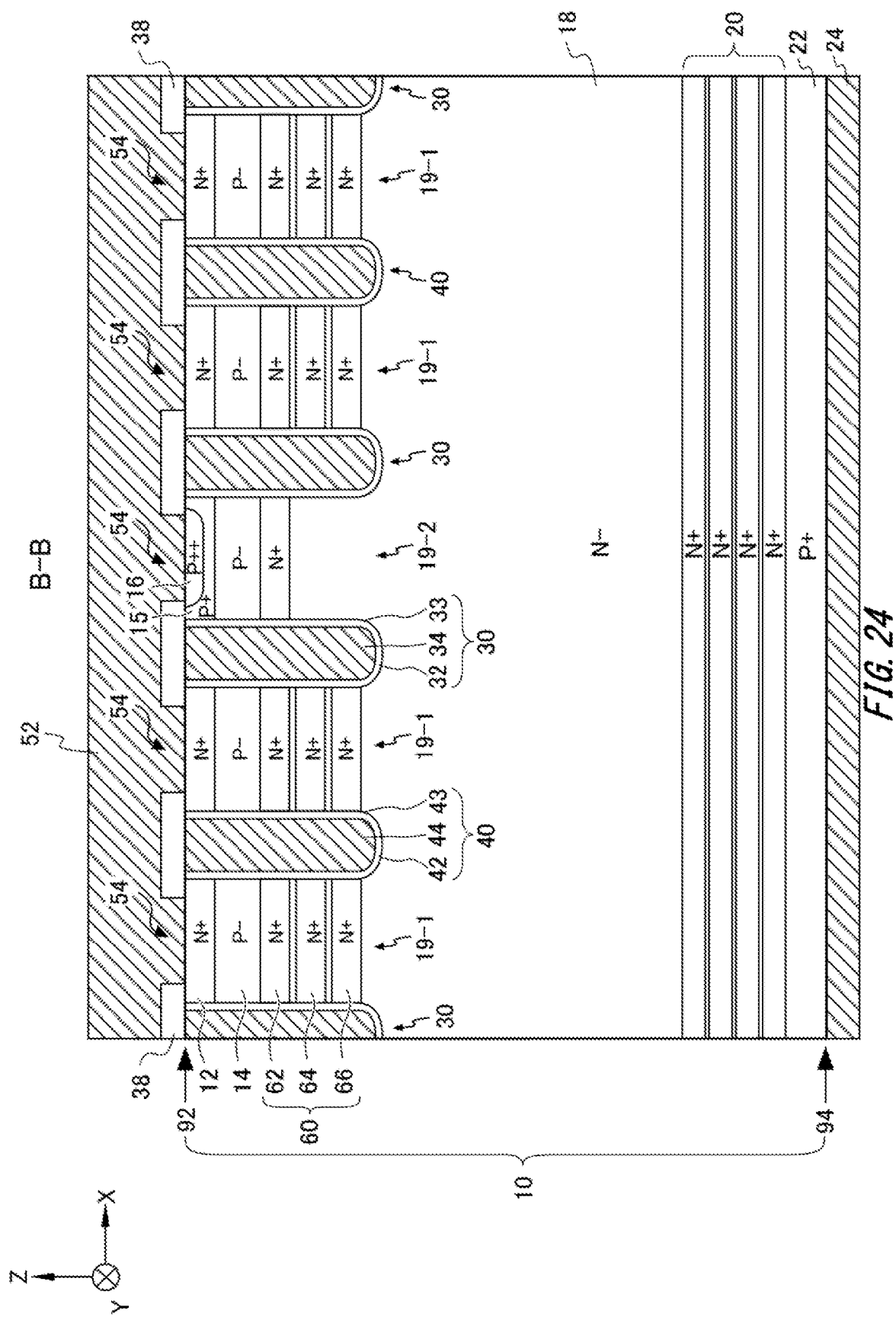
FIG. 24 is a cross-sectional view corresponding to the section B-B of FIG. 1 according to the fifth embodiment.

FIG. 24 is a cross-sectional view corresponding to the section B-B of FIG. 1 according to the fifth embodiment. The section B-B of the present example penetrates the high concentration contact region 16 in the mesa section 19-2. As shown in the section B-B of the present example, the emitter electrode 52 can be in contact with the high concentration contact region 16. Therefore, as compared to the first embodiment, the contact resistance between the emitter electrode 52 and the semiconductor substrate 10 can be reduced.

Figure 25:
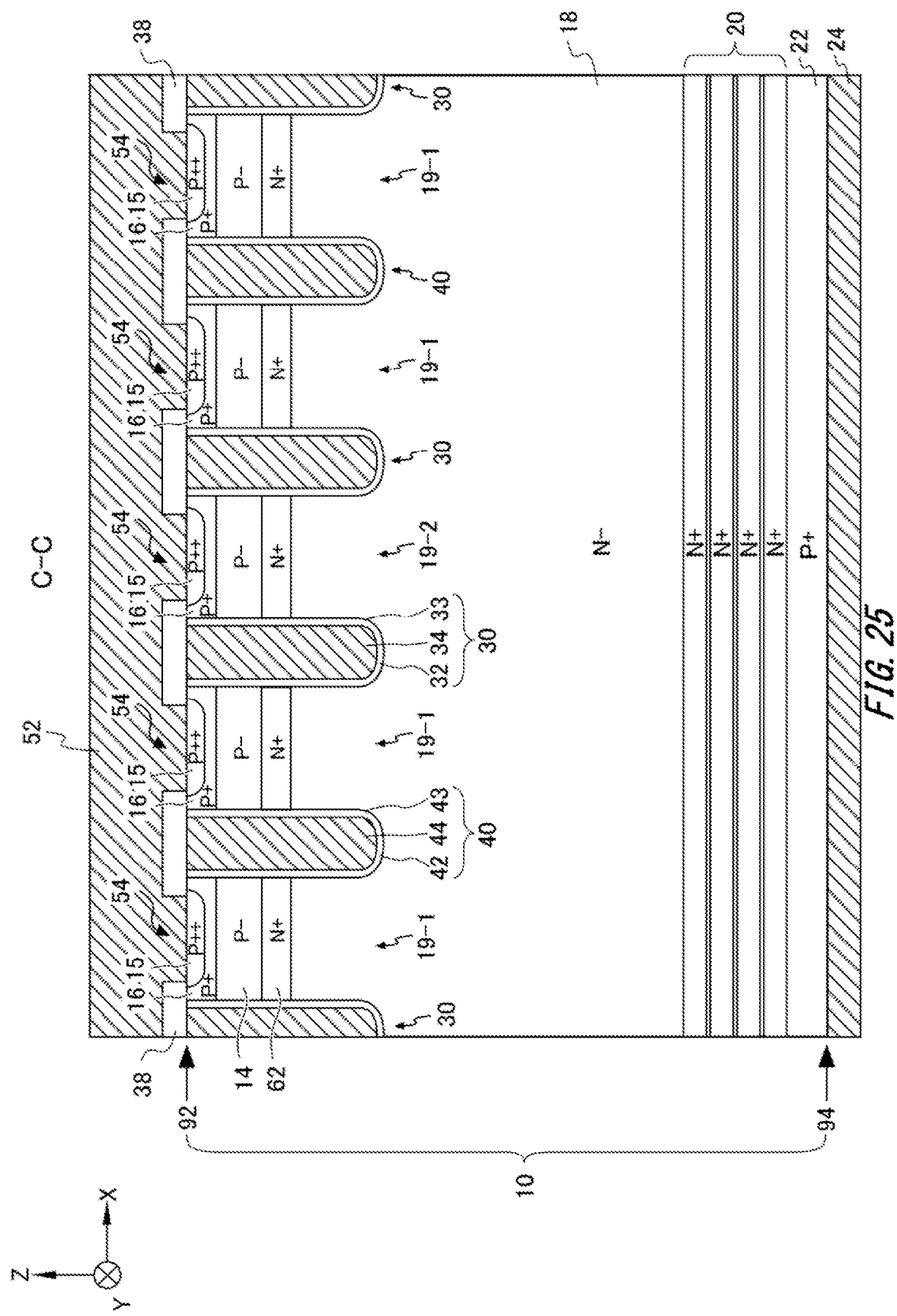
FIG. 25 is a cross-sectional view corresponding to the section C-C of FIG. 1 according to the fifth embodiment.

FIG. 25 is a cross-sectional view corresponding to the section C-C of FIG. 1 according to the fifth embodiment. The section C-C of the present example penetrates the high concentration contact region 16 in the mesa sections 19-1 and 19-2. As shown in the section C-C of the present example, the emitter electrode 52 can be in contact with the high concentration contact region 16 in both of the mesa sections 19-1 and 19-2. Therefore, as compared to the first embodiment, the contact resistance between the emitter electrode 52 and the semiconductor substrate 10 can be reduced.

Figure 26:
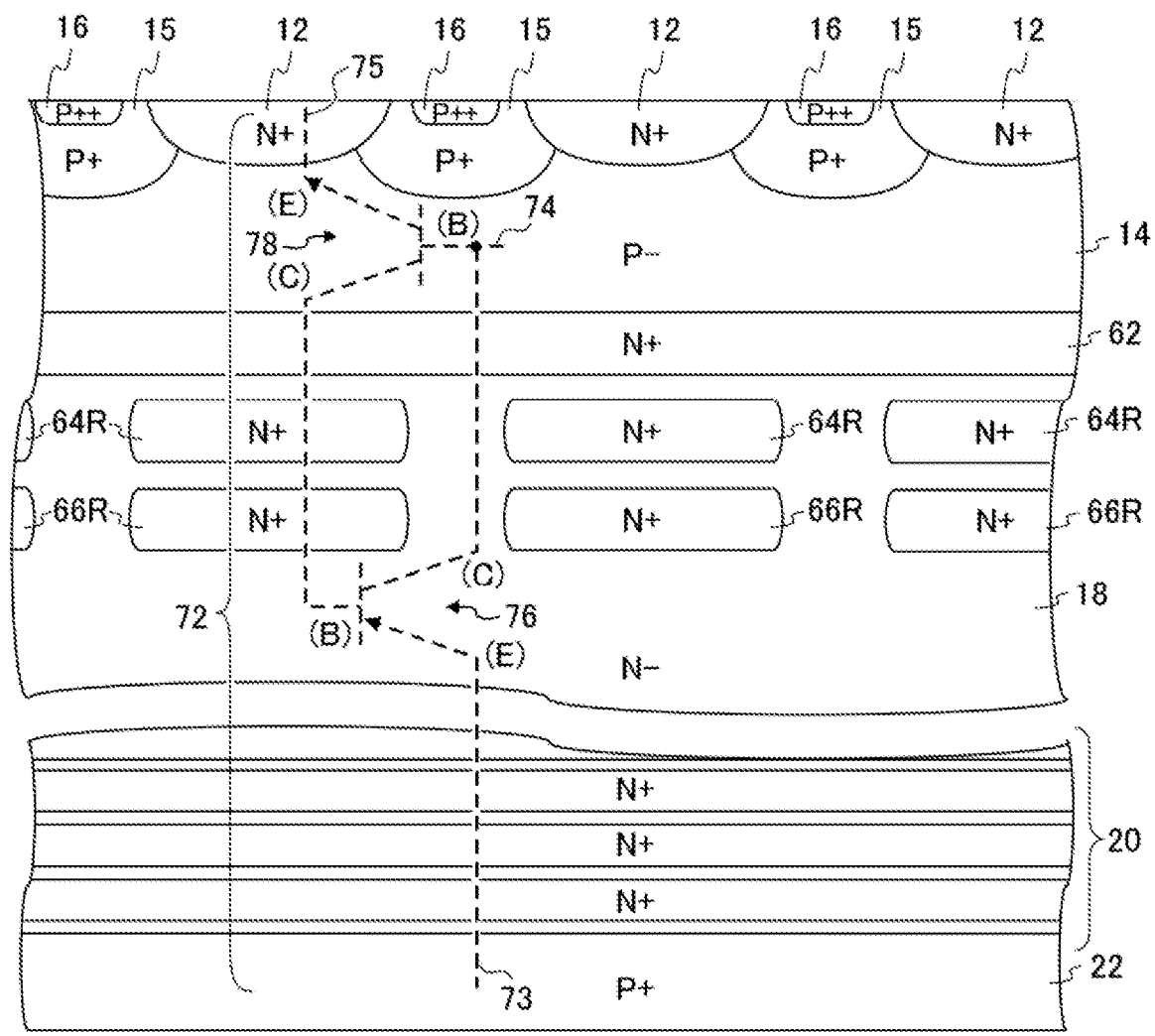
FIG. 26 is a view showing a YZ plane of FIG. 23.

FIG. 26 is a view showing a YZ plane of FIG. 23. Since the semiconductor device 100 has the plurality of P type regions and the plurality of N type regions, it may have a parasitic thyristor 72 to be formed by a PNPN structure. In the PNPN structure, a first P portion may have the collector layer 22, a first N portion may have the buffer layer 20, the drift layer 18 and the multiple accumulation layers 60, a second P portion may have the base region 14 and a second N portion may have the emitter region 12.

A first parasitic transistor 76 may be a PNP transistor that includes a first P portion, a first N portion and a second P portion. The first P portion, the first N portion and the second P portion may correspond to the emitter, the base and the collector of the first parasitic transistor 76, respectively. Similarly, a second parasitic transistor 78 may be a NPN transistor that includes a first N portion, a second N portion and a second N portion. The first N portion, the second P portion and the second N portion may correspond to the emitter, the base and the collector of the second parasitic transistor 78, respectively.

The parasitic thyristor 72 has, for example, the first parasitic transistor 76 and the second parasitic transistor 78 that are connected in series. The first N portion in the first parasitic transistor 76 may match with the first N portion in the second parasitic transistor 78. That is, the base in the first parasitic transistor 76 and the collector in the second parasitic transistor 78 may be connected to each other. Also, the second P portion in the first parasitic transistor 76 may match with the second P portion in the second parasitic transistor 78. That is, the collector in the first parasitic transistor 76 and the base in the second parasitic transistor 78 may be connected to each other.

Note that the emitter of the first parasitic transistor 76 may correspond to an anode 73 of the parasitic thyristor 72. Also, the emitter of the second parasitic transistor 78 may correspond to a cathode 75 of the parasitic thyristor 72, and the base of the second parasitic transistor 78 may correspond to a gate 74 of the parasitic thyristor 72. In the parasitic thyristor 72, when current starts flowing in the parasitic thyristor 72 by turning on the gate 74, the current continues flowing as long as the connection between the anode 73 and a current source is not cut off. Also, the semiconductor device 100 may be broken by a large current that flows from the anode 73 to the cathode 75. In the semiconductor device 100, it is desirable that the parasitic thyristor 72 is prevented from being turned on as much as possible, in order to reduce the occurrence of such a latch-up.

In the present example, since the high concentration contact region 16 is provided in the contact region 15, the holes injected from the collector layer 22 to the base region 14 are easy to be escaped from the high concentration contact region 16 to the emitter electrode 52. Accordingly, the potential of the base to the emitter in the second parasitic transistor 78 is hard to be raised. That is, the gate 74 of the parasitic thyristor 72 is hard to be turned on. In this manner, in the present example, by making the parasitic thyristor 72 hard to be turned on, a possibility that the latch-up in the semiconductor device 100 occurs can be reduced as compared to the first embodiment. That is, by providing the high concentration contact region 16, latch-up resistance can be improved. Additionally, the present example may be combined with the modification examples of the first embodiment, and the present example may be combined with the second to fourth embodiments.

While the embodiments of the present invention have been described, the technical scope of the invention is not limited to the above-described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10 . . . semiconductor substrate, 11 . . . well region, 12 . . . emitter region, 14 . . . base region, 15 . . . contact region, 16 . . . high concentration contact region, 18 . . . drift layer, 19 . . . mesa section, 20 . . . buffer layer, 21 . . . connecting portion, 22 . . . collector layer, 24 . . . collector electrode, 25 . . . connecting portion, 30 . . . dummy trench section, 32 . . . dummy trench insulating film, 33 . . . dummy trench, 34 . . . dummy trench conductive section, 38 interlayer dielectric film, 40 . . . gate trench section, 42 . . . gate insulating film, 43 . . . gate trench, 44 . . . gate conductive section, 48 . . . gate runner, 49 . . . contact hole, 50 . . . gate metal layer, 52 . . . emitter electrode, 54, 56 . . . contact holes, 60 . . . multiple accumulation layers, 62 . . . first accumulation layer, 62R . . . first accumulation region, 64 . . . second accumulation layer, 64R . . . second accumulation region, 66 . . . third accumulation layer, 66R . . . third accumulation region, 67 . . . separation portion, 68 . . . high concentration layer, 70 . . . transistor section, 72 . . . parasitic thyristor, 73 . . . anode, 74 . . . gate, 75 . . . cathode, 76 . . . first parasitic transistor, 78 . . . second parasitic transistor, 80 . . . diode section, 82 . . . cathode layer, 87 . . . hole high concentration region, 92 . . . upper surface, 94 . . . lower surface, 100 . . . semiconductor device, 101, 102, 103, 104 . . . waveform

What is claimed is:

1. A semiconductor device having a semiconductor substrate, the semiconductor substrate comprising:
two trench sections extending in a predetermined direction;
a mesa section provided between the two trench sections; and
a drift layer of a first conductivity type provided below the mesa section, wherein the mesa section has:
an emitter region of a first conductivity type having a higher doping concentration than that of the drift layer, and having at least a part located on an upper surface of the semiconductor substrate;
a contact region of a second conductivity type having at least a part located on the upper surface of the semiconductor substrate; and
multiple accumulation layers provided side by side in a depth direction from the upper surface to a lower surface of the semiconductor substrate below the emitter region and the contact region, and having a doping concentration of the first conductivity type higher than a doping concentration of the first conductivity type of the drift layer, and
at least one accumulation layer among the multiple accumulation layers is provided below at least a part of the emitter region, but not provided below a partial region of the contact region.

2. The semiconductor device according to claim 1, wherein
the emitter region and the contact region are alternately provided in the predetermined direction.

3. The semiconductor device according to claim 2, wherein
the at least one accumulation layer is not provided below a partial region in each of a plurality of the contact regions.

4. The semiconductor device according to claim 3, wherein
the at least one accumulation layer is an island-shaped accumulation layer that includes a plurality of accumulation regions which have a doping concentration of the first conductivity type higher than a doping concentration of the first conductivity type of the drift layer, and each of which is provided discretely in a plane orthogonal to the depth direction,
each of the plurality of accumulation regions is provided below at least a part of the emitter region, but not provided below a partial region of the contact region to be separated, and
all of the accumulation layers except an accumulation layer closest to the upper surface in the depth direction are the island-shaped accumulation layers.

5. The semiconductor device according to claim 4, wherein
the mesa section further includes a base region having a doping concentration of the second conductivity type lower than that of the contact region,
the emitter region has, inside the semiconductor substrate, a bottom region that is not in direct contact with the contact region and that is in direct contact with the base region, and
a length of each of the plurality of accumulation regions in the predetermined direction is longer than a length of the bottom region in the predetermined direction.

6. The semiconductor device according to claim 4, wherein
the mesa section further includes a base region having a doping concentration of the second conductivity type lower than that of the contact region,
an emitter region has, inside the semiconductor substrate, a bottom region that is not in direct contact with the contact region and that is in direct contact with the base region, and
a length of each of the plurality of accumulation regions in the predetermined direction is shorter than a length of the bottom region in the predetermined direction.

7. The semiconductor device according to claim 5, wherein
when a length of each of the plurality of accumulation regions in the predetermined direction is defined as $L_{CHS}$ and a length of the bottom region of the emitter region in the predetermined direction is defined as $L_0$, $L_{CHS}$ and $L_0$ satisfy an expression: $0.5 \leq L_{CHS}/L_0 \leq 2$.

8. The semiconductor device according to claim 1, wherein
the mesa section further has a high concentration contact region that includes an upper portion located on the upper surface of the semiconductor substrate and a lower portion that is in contact with the contact region, the high concentration contact region having a doping concentration of the second conductivity higher than that of the contact region.

9. The semiconductor device according to claim 1, wherein
the semiconductor device comprises a transistor section, a diode section and a boundary section that is provided in a partial region in the transistor section in direct contact with the diode section, and
the diode section includes one or more accumulation layers in a depth direction from the upper surface toward the lower surface.

10. The semiconductor device according to claim 9, wherein
the diode section includes the contact region, and
at least one accumulation layer among the multiple accumulation layers in the diode section is provided below at least a part of the contact region.

11. The semiconductor device according to claim 10, wherein
a length of each of the multiple accumulation layers of the diode section in the predetermined direction is longer than a length of the contact region of the diode section in the predetermined direction.

* * * * *